US010193565B2

(12) United States Patent
Fukui

(10) Patent No.: US 10,193,565 B2
(45) Date of Patent: Jan. 29, 2019

(54) COMPRESSIVE ENCODING APPARATUS, COMPRESSIVE ENCODING METHOD, DECODING APPARATUS, DECODING METHOD, AND PROGRAM

(71) Applicant: Sony Corporation, Tokyo (JP)

(72) Inventor: Takao Fukui, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/553,362

(22) PCT Filed: Feb. 18, 2016

(86) PCT No.: PCT/JP2016/054723
§ 371 (c)(1),
(2) Date: Aug. 24, 2017

(87) PCT Pub. No.: WO2016/140071
PCT Pub. Date: Sep. 9, 2016

(65) Prior Publication Data
US 2018/0115322 A1    Apr. 26, 2018

(30) Foreign Application Priority Data

Mar. 3, 2015 (JP) .................... 2015-040886

(51) Int. Cl.
*H03M 7/30* (2006.01)
*G10L 19/00* (2013.01)
(Continued)

(52) U.S. Cl.
CPC .......... *H03M 7/6011* (2013.01); *G10L 19/00* (2013.01); *G10L 19/0017* (2013.01); *H03M 3/02* (2013.01);
(Continued)

(58) Field of Classification Search
CPC .... H03M 7/6011; H03M 7/6005; H03M 3/30; G10L 19/0017
(Continued)

(56) References Cited

U.S. PATENT DOCUMENTS 5,859,605 A * 1/1999 Raghavan ............. G06F 1/0321
341/131
6,269,338 B1 7/2001 Bruekers et al.
(Continued)

FOREIGN PATENT DOCUMENTS

| JP | 09-074358 A | 3/1997 |
|---|---|---|
| JP | 2000-502539 A | 2/2000 |

(Continued)

OTHER PUBLICATIONS

International Search Report and Written Opinion and English translation thereof dated Apr. 26, 2016 in connection with International Application No. PCT/JP2016/054723.
(Continued)

*Primary Examiner* — Brian Young
(74) *Attorney, Agent, or Firm* — Wolf, Greenfield & Sacks, P.C.

(57) ABSTRACT

The present disclosure relates to a compressive encoding apparatus, a compressive encoding method, a decoding apparatus, a decoding method, and a program which can provide a lossless compression technology having a higher compression rate. An encoding unit of the compressive encoding apparatus converts M bits of a ΔΣ-modulated digital signal into N bits (M>N) with reference to a first conversion table, and when the M bits are not able to be converted into the N bits with the first conversion table, converts the M bits into the N bits with reference to a second conversion table. When the number of bit patterns of the N bits is P, the first conversion table is a table storing (P−1)
(Continued)

number of codes having higher generation frequencies for past bit patterns, and the second conversion table is a table storing (P−1) number of codes having higher generation frequencies for past bit patterns, which follow those of the first conversion table. The present disclosure is applicable to a compressive encoding apparatus that compressively encoding an audio signal, and the like, for example.

19 Claims, 31 Drawing Sheets

(51) Int. Cl.
　　　*H03M 3/02*　　　(2006.01)
　　　*H03M 7/42*　　　(2006.01)
　　　*H03M 7/40*　　　(2006.01)
　　　*H03M 3/00*　　　(2006.01)
(52) U.S. Cl.
　　　CPC .............. *H03M 7/30* (2013.01); *H03M 7/40* (2013.01); *H03M 7/42* (2013.01); *H03M 7/6005* (2013.01); *H03M 3/30* (2013.01)
(58) Field of Classification Search
　　　USPC ............................................ 341/87, 51, 106
　　　See application file for complete search history.

(56) References Cited

U.S. PATENT DOCUMENTS

| | | | |
|---|---|---|---|
| 6,535,845 B2* | 3/2003 | Van Der Vleuten | ........................ G11B 20/00007 341/77 |
| 6,778,965 B1 | 8/2004 | Bruekers et al. | |
| 7,190,288 B2* | 3/2007 | Robinson | ............ H03M 7/3015 341/106 |
| 2001/0041984 A1 | 11/2001 | Van Der Vleuten | |
| 2002/0163455 A1 | 11/2002 | Reefman et al. | |
| 2002/0165631 A1 | 11/2002 | Nuijten et al. | |
| 2004/0225496 A1 | 11/2004 | Bruekers et al. | |
| 2004/0230427 A1 | 11/2004 | Reefman et al. | |
| 2010/0013680 A1 | 1/2010 | Chen et al. | |
| 2011/0158310 A1 | 6/2011 | Sriram | |
| 2011/0161372 A1 | 6/2011 | Jones | |
| 2012/0262314 A1 | 10/2012 | Carlson | |
| 2013/0249716 A1 | 9/2013 | Carlson | |

FOREIGN PATENT DOCUMENTS

| | | |
|---|---|---|
| JP | 2004-508755 A | 3/2004 |
| JP | 2008-227949 A | 9/2008 |

OTHER PUBLICATIONS

International Preliminary Report on Patentability and English translation thereof dated Sep. 14, 2017 in connection with International Application No. PCT/JP2016/054723.

Extended European Search Report dated Sep. 11, 2018 in connection with European Application No. 16758765.8.

No Author Listed, Delta-sigma modulation, Wikipedia, the free encyclopedia, https://en.wikipedia.org/w/index.php?title=Delta-sigma_modulation&oldid=641385500, old revision as edited by Yobot Jan. 7, 2015, retrieved on Aug. 28, 2018, 16 pages.

No Author Listed, Lookup Table, Wikipedia, the free encyclopedia, https://en.wikipedia.org/w/index.php?title=Lookup_table&oldid=645315401, old revision as edited by Vkehayas Feb. 2, 2015, retrieved on Aug. 28, 2018, 7 pages.

* cited by examiner

FIG.2

```
pre_table[4096][16] =
{369a, 0, 0, 0, 0, 0, 0, 0, 0, 0, 0, 0, 0, 0, 0, 0},
{0, 0, 0, 0, 0, 0, 0, 0, 0, 0, 0, 0, 0, 0, 0, 0},
......
{0, 1, 10, 18, 20, 31, 11, 0, 4, 12, 5, 0, 0, 0, 0, 0},   ← 118TH ROW
...
```

FIG.3

```
table1[4096][3] =
{00, ff, ff},
{ff, ff, ff},
......
{05, 04, 03},   ← 118TH ROW
...
```

FIG.13

```
table2[4096][3]=
{ff,ff,ff},
{ff,ff,ff},
......
{09,06,02},  ←——— 118TH ROW
...
```

FIG.28

```
table1[4096]=
00,
ff,
……
05,        ← 118TH ROW
…
```

FIG.29

```
table2[4096]=
ff,
ff,
……
04,        ← 118TH ROW
…
```

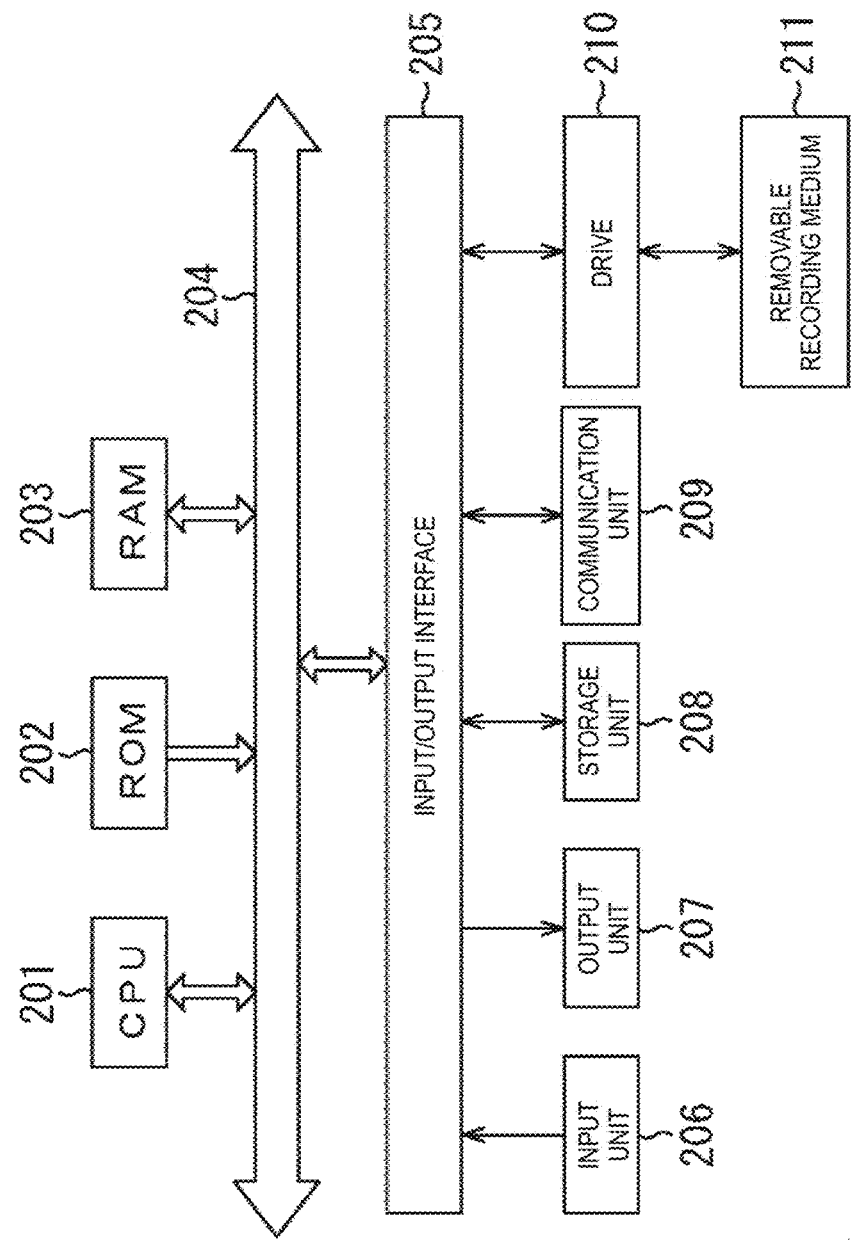

COMPRESSIVE ENCODING APPARATUS, COMPRESSIVE ENCODING METHOD, DECODING APPARATUS, DECODING METHOD, AND PROGRAM

CROSS-REFERENCE TO RELATED APPLICATIONS

This application is a National Stage of International Application No. PCT/JP2016/054723, filed in the Japanese Patent Office as a Receiving office on Feb. 18, 2016, which claims priority to Japanese Patent Application Number 2015-040886, filed in the Japanese Patent Office on Mar. 3, 2015, each of which is hereby incorporated by reference in its entirety.

TECHNICAL FIELD

The present disclosure relates to a compressive encoding apparatus, a compressive encoding method, a decoding apparatus, a decoding method, and a program, and particularly, to a compressive encoding apparatus, a compressive encoding method, a decoding apparatus, a decoding method, and a program which can provide a lossless compression technology having a higher compression rate.

BACKGROUND ART

Recently, music distribution using high-resolution music which is audio data having higher sound quality than a music CD (CD-DA) has been performed. For pulse code modulation (PCM) music such as 96 kHz/24 bits, there is a lossless compression technology (reversible compression technology) such as free lossless audio codec (FLAC) that is used for distribution.

Further, for $\Delta\Sigma$-modulated digital signals (direct stream digital (DSD) data) which are not PCM signals but are 1-bit signals, there is a technology called direct stream transfer (DST) developed by Philips as a lossless compression technology and this technology is used to manufacture a super audio CD (SACD).

However, this technology is based on 1-bit signal processing and is not suitable for software processing in a CPU based on processing in bytes, and thus is mounted as hardware (LSI) in an SACD player and the like. Since high throughput is required for processing through software, processing cannot be performed in a general embedded CPU.

Accordingly, there is a demand for a lossless compression technology which enables processing even in a general embedded CPU while considering execution by mobile terminals when audio signals are distributed using DSD data.

The applicant has proposed a technology for compressing current data into 2 bits with reference to past data in units of 4 bits in Patent Literature 1 as a lossless audio signal compression technology using DSD data.

CITATION LIST

Patent Literature

Patent Literature 1: JP H9-74358A

DISCLOSURE OF INVENTION

Technical Problem

However, a data compression rate is not so high in the technology of Patent Literature 1, and thus a lossless compression technology having a higher compression rate is required.

The present disclosure is devised in view of this situation and enables provision of a lossless compression technology having a higher compression rate.

Solution to Problem

According to a first aspect of the present disclosure, a compressive encoding apparatus includes an encoding unit that converts M bits of a $\Delta\Sigma$-modulated digital signal into N bits (M>N) with reference to a first conversion table, and when the M bits are not able to be converted into the N bits with the first conversion table, converts the M bits into the N bits with reference to a second conversion table. When the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

According to the first aspect of the present disclosure, a compressive encoding method includes converting M bits of a $\Delta\Sigma$-modulated digital signal into N bits (M>N) with reference to a first conversion table, and when the M bits are not able to be converted into the N bits with the first conversion table, converting the M bits into the N bits with reference to a second conversion table. When the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

According to the first aspect of the present disclosure, a program that causes a computer to execute a process of converting M bits of a $\Delta\Sigma$-modulated digital signal into N bits (M>N) with reference to a first conversion table, and when the M bits are not able to be converted into the N bits with the first conversion table, converting the M bits into the N bits with reference to a second conversion table. When the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

According to the first aspect of the present disclosure, M bits of a $\Delta\Sigma$-modulated digital signal are converted into N bits (M>N) with reference to a first conversion table, and when the M bits are not able to be converted into the N bits with the first conversion table, the M bits are converted into the N bits with reference to a second conversion table. Here, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

According to a second aspect of the present disclosure, a decoding apparatus includes a decoding unit that converts N bits of encoded data that is obtained by compressively encoding M bits (M>N) of a ΔΣ-modulated digital signal into the N bits, into the M bits with reference to a first conversion table, and when the N bits are not able to be converted into the M bits with the first conversion table, decodes the N bits into the M bits with reference to a second conversion table. When the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

According to the second aspect of the present disclosure, a decoding method includes converting N bits of encoded data that is obtained by compressively encoding M bits (M>N) of a ΔΣ-modulated digital signal into the N bits, into the M bits with reference to a first conversion table, and when the N bits are not able to be converted into the M bits with the first conversion table, decoding the N bits into the M bits with reference to a second conversion table. When the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

According to the second aspect of the present disclosure, a program that causes a computer to execute a process of converting N bits of encoded data that is obtained by compressively encoding M bits (M>N) of a ΔΣ-modulated digital signal into the N bits, into the M bits with reference to a first conversion table, and when the N bits are not able to be converted into the M bits with the first conversion table, decoding the N bits into the M bits with reference to a second conversion table. When the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

According to the second aspect of the present disclosure, N bits of encoded data that is obtained by compressively encoding M bits (M>N) of a ΔΣ-modulated digital signal into the N bits, are converted into the M bits with reference to a first conversion table, and when the N bits are not able to be converted into the M bits with the first conversion table, the N bits are decoded into the M bits with reference to a second conversion table. Here, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

Further, the program can be provided by being transmitted through a transmission medium or being recorded in a recording medium.

The compressive encoding apparatus and the decoding apparatus may be independent apparatuses or may be internal blocks which constitute a single apparatus.

Advantageous Effects of Invention

According to first and second aspects of the present disclosure, it is possible provide a lossless compression technology having a higher compression rate.

Note that the effects described here are not necessarily limited, and any effect that is desired to be described in the present disclosure may be exhibited.

BRIEF DESCRIPTION OF DRAWINGS

FIG. 2 is an explanatory diagram of a method of creating a data generation count table pretable.

FIG. 3 is an explanatory diagram of a conversion table table1.

FIG. 13 is an explanatory diagram of a second conversion table table2.

FIG. 28 is an explanatory diagram of the first conversion table table1.

FIG. 29 is an explanatory diagram of the second conversion table table2.

FIG. 33 is a block diagram illustrating an example of a configuration of an embodiment of a computer.

MODE(S) FOR CARRYING OUT THE INVENTION

Forms (referred to as embodiments hereinafter) for embodying the present disclosure will be described below. A description will be given in the following order.
1. First embodiment (basic configuration example)
2. Second embodiment (configuration example of compressing and transmitting conversion table data)
3. Third embodiment (configuration example of selecting from multiple conversion tables)
4. Fourth embodiment (configuration example of using two-stage conversion table)
5. Fifth embodiment (configuration example of compressing and transmitting two-stage conversion table)
6. Sixth embodiment (configuration example of selecting from multiple two-stage conversion tables)
7. Seventh embodiment (first configuration example of selecting multiple past data reference bit numbers)
8. Eighth embodiment (second configuration example of selecting multiple past data reference bits numbers)
9. Ninth embodiment (configuration example of compressing and transmitting Q-stage conversion table)
10. Tenth embodiment (first configuration example having 4-to-2 encoding unit and 4-to-1 encoding unit)
11. Eleventh embodiment (second configuration example having 4-to-2 encoding unit and 4-to-1 encoding unit)

<1. First Embodiment>
<Example of Configuration of Compressive Encoding Apparatus>

Figure 1:
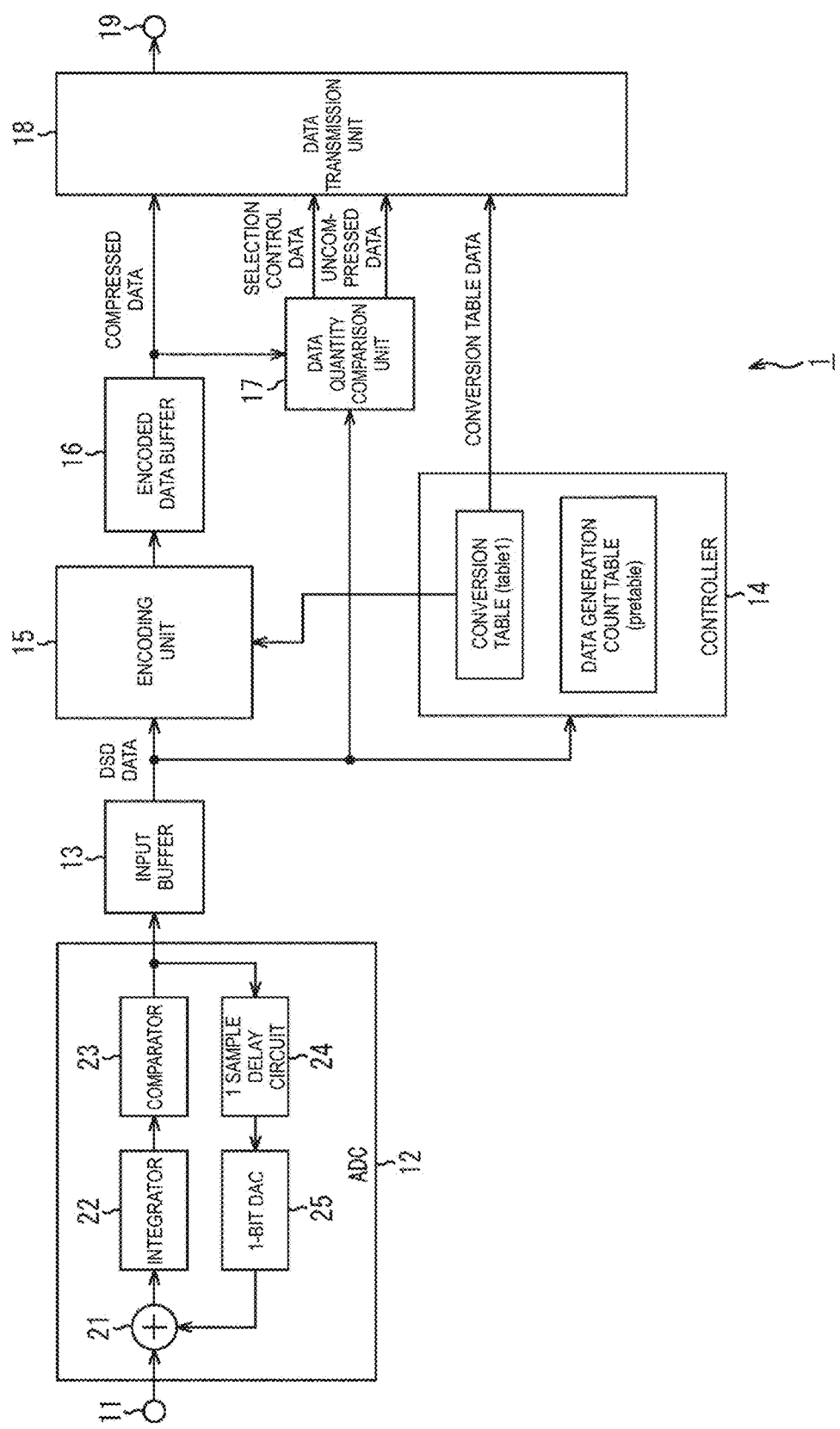
FIG. 1 is a block diagram illustrating an example of a configuration of a first embodiment of a compressive encoding apparatus.

FIG. 1 illustrates an example of a configuration of a first embodiment of a compressive encoding apparatus according to the present disclosure.

A compressive encoding apparatus 1 illustrated in FIG. 1 is an apparatus which converts an analog audio signal into a digital signal through ΔΣ (sigma delta) modulation, compressively encodes the converted audio signal and outputs the compressed signal.

The analog audio signal is input from an input unit 11 and supplied to an ADC 12. The ADC 12 digitalizes the supplied analog audio signal through ΔΣ modulation and outputs the digital signal to an input buffer 13.

The ADC 12 includes an adder 21, an integrator 22, a comparator 23, a 1-sample delay circuit 24 and a 1-bit DAC 25.

The audio signal supplied from the input unit 11 is provided to the adder 21. The adder 21 adds an analog audio signal from one sample period before, supplied from the 1-bit DAC 25, to the audio signal from the input unit 11 and outputs the added signal to the integrator 22.

The integrator 22 integrates the audio signal from the adder 21 and outputs the integrated signal to the comparator 23. The comparator 23 1-bit quantizes the input audio signal for each sample period through comparison with a midpoint potential of the input audio signal. As a frequency of the sample period (sampling frequency), 64 or 128 times conventional 48 kHz and 44.1 kHz are used. The comparator 23 outputs the 1-bit quantized audio signal to the input buffer 13 and simultaneously supplies the same to the 1-sample delay circuit 24.

The 1-sample delay circuit 24 delays the audio signal from the comparator 23 by one sample period and outputs the delayed audio signal to the 1-bit DAC 25. The 1-bit DAC 25 converts the digital signal from the 1-sample delay circuit 24 into an analog signal and outputs the analog signal to the adder 21.

The ADC 12 configured as above converts the audio signal supplied from the input unit 11 into a 1-bit digital signal (AD conversion) and outputs the 1-bit digital signal to the input buffer 13. According to such AD conversion of ΔΣ modulation, it is possible to obtain a digital audio signal which has a wide dynamic range despite having a small number of bits, for example, 1 bit, by sufficiently increasing the frequency of the sample period (sampling frequency).

In the present embodiment, the ADC 12 receives a stereo (2-channel) audio signal from the input unit 11, AD-converts the stereo audio signal into a 1-bit signal at a sampling frequency of 128 times 44.1 kHz and outputs the 1-bit signal to the input buffer 13.

Further, in ΣΔ modulation, the number of quantization bits may be 2 bits or 4 bits.

The input buffer 13 temporarily accumulates the 1-bit digital audio signal supplied from the ADC 12 and supplies the 1-bit digital audio signal in units of one frame to a controller 14, an encoding unit 15 and a data quantity comparison unit 17 at the following stages. Here, one frame is a unit considered as one of divisions of the audio signal by a predetermined time (period), and in the present embodiment, 3 seconds are regarded as one frame. Accordingly, in other words, the input buffer 13 supplies the audio signal in units of 3 seconds to the controller 14, the encoding unit 15 and the data quantity comparison unit 17.

As described above, the audio signal input from the input unit 11 is a stereo (2-channel) signal and is AD-converted into a 1-bit signal at the sampling frequency of 128 times 44.1 kHz, and thus the quantity of data per frame is 44,100 (Hz)*128*2(ch)*3 (sec)=5.6 Mbit.

Hereinafter, a ΔΣ-modulated digital signal supplied from the input buffer 13 will be referred to as DSD data.

The controller 14 controls the overall operation of the compressive encoding apparatus 1. Further, the controller 14 has a function of creating a conversion table table1 necessary for the encoding unit 15 to perform compressive encoding and providing the conversion table to the encoding unit 15.

Specifically, the controller 14 creates a data generation count table pretable using DSD data of one frame supplied from the input buffer 13 and further creates a conversion table table1 from the data generation count table pretable. The controller 14 supplies the created conversion table table1 to the encoding unit 15 and a data transmission unit 18. The conversion table table1 is created (updated) in units of one frame and supplied to the encoding unit 15.

The encoding unit 15 compressively encodes the DSD data supplied from the input buffer 13 in units of 4 bits using the conversion table table1 supplied from the controller 14. Accordingly, although the DSD data is supplied to the encoding unit 15 from the input buffer 13 simultaneously with timing of supplying to the controller 14, processing is held in the encoding unit 15 until the conversion table is supplied from the controller 14.

While details of compressive encoding will be described below with reference to FIG. 2, the encoding unit 15 encodes 4-bit DSD data into 2-bit data or 6-bit data and outputs the same to an encoded data buffer 16.

The encoded data buffer 16 temporarily buffers the compressed data which is the DSD data compressively encoded in the encoding unit 15 and supplies the compressed data to the data quantity comparison unit 17 and the data transmission unit 18.

The data quantity comparison unit 17 compares the quantity of the DSD data (also referred to as uncompressed data) supplied from the input buffer 13 with the quantity of the compressed data supplied from the encoded data buffer 16 on a frame-by-frame basis. As described above, the encoding unit 15 encodes the 4-bit DSD data into 2-bit data or 6-bit data and thus there may be a case in which the quantity of data after compression exceeds the quantity of data before compression in an algorithm. Accordingly, the data quantity comparison unit 17 compares the quantity of the compressed data with the quantity of the uncompressed data, selects the data with the smaller quantity and supplies selection control data indicating which data has been selected to the data transmission unit 18. Further, when the data quantity comparison unit 17 supplies selection control data indicating that the uncompressed data has been selected to the data transmission unit 18, the data quantity comparison unit 17 also supplies the uncompressed data to the data transmission unit 18. The selection control data may be a flag indicating whether audio data transmitted from the data transmission unit 18 is data compressively encoded in the encoding unit 15 from the viewpoint of an apparatus at a receiving side which receives transmission data.

The data transmission unit 18 selects one of the compressed data supplied from the encoded data buffer 16 and the uncompressed data supplied from the data quantity comparison unit 17 on the basis of the selection control data supplied from the data quantity comparison unit 17 and transmits the selected data along with the selection control data to a counterpart apparatus through an output unit 19.

In addition, when the data transmission unit 18 transmits the compressed data, the data transmission unit 18 also adds data of the conversion table table1 supplied from the controller 14 to the compressed data and transmits the same to the counterpart apparatus. The data transmission unit 18 may add a synchronization signal and an error correction code (ECC) to a digital signal corresponding to a predetermined number of samples and transmit the same as transmission data.

<Method of Creating Data Generation Count Table>

Next, a method of creating the data generation count table pretable by the controller 14 will be described.

The controller 14 creates the data generation count table pretable for DSD data of one frame and represents the DSD data supplied from the input buffer 13 in units of 4 bits as follows.

... D4 [n−3], D4 [n−2], D4[n−1], D4[n], D4[n+1], D4[n+2], D4[n+3], ....

Here, D4[n] represents continuous 4-bit data and is also referred to as D4 data hereinafter (n>3).

The controller 14 counts the number of times D4 data is generated after past three pieces of D4 data (past 12-bit data) and creates a data generation count table pretable[4096][16] illustrated in FIG. 2. Here, [4096] and [16] of the data generation count table pretable[4096][16] represent that the data generation count table is a table having 4,096 columns and 16 columns (matrix), and columns [0] to [4095] correspond to values that may be the past three pieces of D4 data (a past bit pattern) and columns [0] to [15] correspond to values that may be the following D4 data.

Specifically, pretable[0][0] to [0][15] corresponding to the first column of the data generation count table pretable indicates the number of times the following data is generated when the past three pieces of D4 data D4[n−3], D4[n−2], D4[n−1] were "0"={0000,0000,0000} and represents that the number of times the following 4 bits having the past three pieces of data of "0" were "0" is 369a (HEX notation) and there was no other data.

pretable[1][0] to [1][15] corresponding to the second column of the data generation count table pretable indicates the number of times the following data is generated when the past three pieces of D4 data D4[n−3], D4[n−2], D4[n−1] were "1"={0000,0000,0001}. When all elements of the second column of the data generation count table pretable are "0," this represents that data having three pieces of D4 data as the past data which was "1" was not present in this one frame.

Further, pretable[117][0] to [117][15] corresponding to the 118$^{th}$ column of the data generation count table pretable indicates the number of times the following data is generated when the past three pieces of D4 data D4[n−3], D4[n−2], D4[n−1] were "117", {0000,0111,0101} in FIG. 2. This data represents that the number of times the following 4 bits having the past three pieces of data of "117" were 0 is 0, the number of times the following 4 bits were "1" is 1, the number of times the following 4 bits were "2" is 10, the number of times the following 4 bits were "3" is 18, the number of times the following 4 bits were "4" is 20, the number of times the following 4 bits were "5" is 31, the number of times the following 4 bits were "6" is 11, the number of times the following 4 bits were "7" is 0, the number of times the following 4 bits were "8" is 4, the number of times the following 4 bits were "9" is 12, the number of times the following 4 bits were "10" is 5, and the number of times the following 4 bits were "11" to "15" is 0.

The controller 14 counts the number of times D4 data is generated after past three pieces of D4 data (past 12-bit data) for DSD data of one frame and creates the data generation count table pretable, as described above.

<Method of Creating Conversion Table>

Next, a method of creating the conversion table table1 by the controller 15 will be described.

The controller 14 creates a conversion table table1[4096][3] having 4,096 columns and 3 columns on the basis of the previously created data generation count table pretable. Here, columns [0] to [4095] of the conversion table table1[4096][3] correspond to values that may be the past three pieces of D4 data, and columns [0] to [2] contain three values having a high generation frequency from among 16 values that may be the following D4 data. The first column [0] of the conversion table table1[4096][3] contains a (first) value having the highest generation frequency, the second column [1] contains a value having the second generation frequency, and the third column [2] contains a value having the third generation frequency.

FIG. 3 illustrates an example of the conversion table table1[4096][3] corresponding to the data generation count table pretable illustrated in FIG. 2.

table1[117][0] to [117][2] corresponding to the $118^{th}$ column of the conversion table table1[4096][3] is {05, 04, 03}. This corresponds to the contents of pretable1[117][0] to [117][15] of the $118^{th}$ column of the data generation count table pretable of FIG. 2.

In pretable[117][0] to [117][15] of the $118^{th}$ column of the data generation count table pretable in FIG. 2, a (first) value having the highest generation frequency is "5" which has been generated 31 times, a value having the second generation frequency is "4" which has been generated 20 times, and a value having the third generation frequency is "3" which has been generated 8 times. Accordingly, {05} is contained in the $118^{th}$ column and first column table1[117][0] of the conversion table table1[4096][3], {04} is contained in the $118^{th}$ column and second column table1[117][1], and {03} is contained in the $118^{th}$ column and third column table1[117][2].

Similarly, table1[0][0] to [0][2] of the first column of the conversion table table1[4096][3] corresponds to the contents of pretable1[0][0] to [0][15] which is the first column of the data generation count table pretable of FIG. 2.

In pretable[0][0] to [0][15] of the first column of the data generation count table pretable of FIG. 2, a (first) value having the highest generation frequency is "0" which has been generated $369a$ (HEX notation) times and no other values are generated. Accordingly, {00} is contained in the first column and first column table1[0][0] of the conversion table table1[4096][3] and {ff} indicating that there is no data is contained in the first column and second column table [0][1] and the first column and third column table1[0][2]. The value indicating that there is no data is not limited to {ff} and may be appropriately decided. Although a value contained in each element of the conversion table table1 is any of "0" to "15" and thus can be represented by 4 bits, the value is represented by 8 bits for facilitation of computer processing handling.

As described above, the conversion table table1[4096][3] having 4,096 columns and 3 columns is created on the basis of the previously created data generation count table pretable and supplied to the encoding unit 15.

<Compressive Encoding Method Performed by Encoding Unit 15>

Next, a compressive encoding method using the conversion table table1 by the encoding unit 15 will be described.

For example, a case in which the encoding unit 15 encodes D4[n] from among DSD data . . . D4 [n-3], D4 [n-2], D4[n-1], D4[n], D4[n+1], D4[n+2], D4[n+3], . . . supplied from the input buffer 13 will be described.

When D4[n] is encoded, the encoding unit 15 regards D4[n-3], D4[n-2], D4[n-1] which are the past 12-bit data immediately before D4[n] as a mass of 12-bit data and searches for three values, table1[D4[n-3], D4[n-2], D4[n-1]][0], table1[D4 [n-3], D4 [n-2], D4[n-1]][1], and table1 [D4 [n-3], D4 [n-2], D4[n-1]][2], of an address (column) indicated by D4[n-3], D4[n-2], D4[n-1] of the conversion table table1[4096][3].

When any of the three values, table1[D4[n-3], D4[n-2], D4[n-1]][0], table1[D4[n-3], D4[n-2], D4[n-1]][1], and table1[D4[n-3], D4[n-2], D4[n-1]][2], of the address (column) indicated by D4[n-3], D4[n-2], D4[n-1] of the conversion table table1[4096][3] is identical to D4[n], the encoding unit 15 converts D4[n] into 2 bits of "01b" if D4[n] is identical to table1[D4[n-3], D4[n-2], D4[n-1]][0], converts D4[n] into 2 bits of "10b" if D4[n] is identical to table1[D4[n-3], D4[n-2], D4[n-1]][1] and converts D4[n] into 2 bits of "11b" if D4[n] is identical to table1[D4[n-3], D4[n-2], D4[n-1]][2].

On the other hand, when none of the three values of the address (column) indicated by D4[n-3], D4[n-2], D4[n-1] of the conversion table table1[4096][3] is identical to D4[n], the encoding unit 15 adds "00b" before D4[n] such as "00b+D4[n]" to convert D4[n] into 6 bits. Here, b in "01b," "10b," "11b" and "00b+D4[n]" represents binary notation.

As described above, the encoding unit 15 converts the 4-bit DSD data D4[n] into 2-bit data "01b," "10b" or "11b" or 6-bit data "00b+D4[n]" using the conversion table table1 and outputs the converted data to the encoded data buffer 16.

<Detailed Configuration of Encoding Unit 15>

Figure 4:
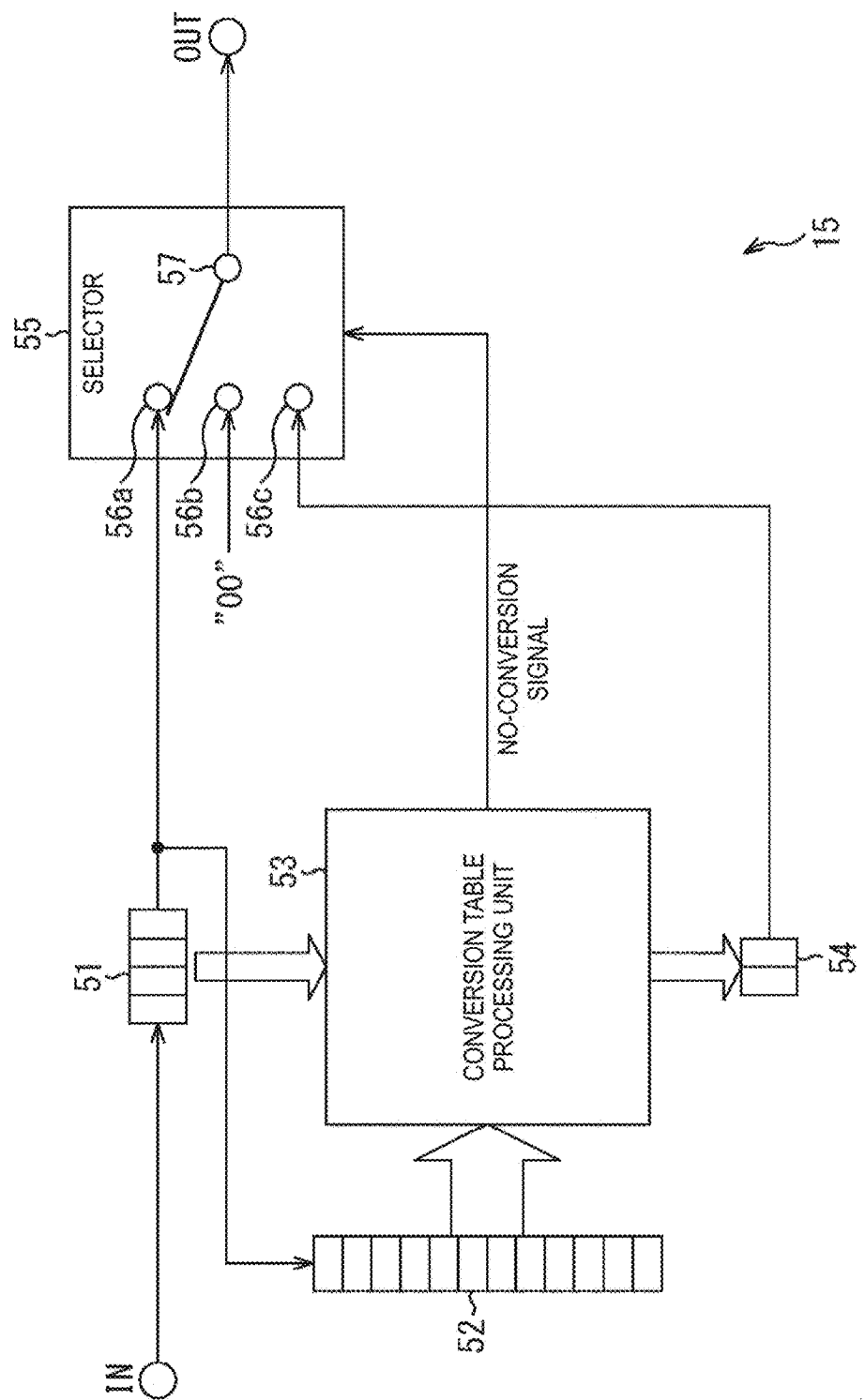
FIG. 4 is a block diagram illustrating an example of a configuration of an encoding unit.

FIG. 4 illustrates an example of a configuration of the encoding unit 15 which performs the aforementioned compressive encoding.

The 4-bit DSD data (e.g., D4[n]) supplied from the input buffer 13 is stored in a register 51 which contains 4 bits. Further, the output of the register 51 is connected to an input port 56a of a selector 55 and a register 52 which contains 12 bits, and the register 52 contains the past 12-bit data (e.g., D4[n-3], D4[n-2], D4[n-1]) immediately before the 4-bit DSD data stored in the register 51.

A conversion table processing unit 53 has the conversion table table1 supplied from the controller 14.

The conversion table processing unit 53 checks whether three values, table1[D4 [n-3], D4 [n-2], D4[n-1]][0], table1 [D4 [n-3], D4 [n-2], D4[n-1]][1] and table1[D4[n-3], D4[n-2], D4[n-1]][2], of the address indicated by the 12-bit data (e.g., D4[n-3], D4[n-2], D4[n-1]) contained in the register 52 include the 4-bit data (e.g., D4[n]) contained in the register 51, and when the three values include the 4-bit data, stores a value corresponding to the column in which the value identical to the 4-bit data is contained, that is, any of "01b," "10b" and "11b," in a 2-bit register 54. The data stored in the 2-bit register 54 is supplied to an input port 56c of the selector 55.

On the other hand, when the three values of the address indicated by the 12-bit data (e.g., D4[n-3], D4[n-2], D4[n-1]) contained in the register 52 do not include the 4-bit data (e.g., D4[n]) contained in the register 51, the conversion table processing unit 53 outputs a signal indicating that conversion is not performed (referred to as a no-conversion signal hereinafter) to the selector 55.

The selector 55 selects one of three input ports 56a to 56c and outputs data acquired through the selected input port 56 through an output port 57.

The 4-bit DSD data (e.g., D4[n]) stored in the register 51 is supplied to the input port 56a, "00b" is supplied to the input port 56b, and the converted 2-bit data stored in the register 54 is supplied to the input port 56c.

When the no-conversion signal indicating that conversion is not performed is supplied from the conversion table processing unit 53, the selector 55 selects the input port 56b to output "00b" through the output port 57 and then selects the input port 56a to output the 4-bit DSD data (e.g., D4[n]) stored in the register 51 through the output port 57. Accordingly, the 6 bits "00b+D4[n]," which are output when the conversion table table1 does not include data identical to D4[n], are output through the output port 57.

On the other hand, when the no-conversion signal indicating that conversion is not performed is not supplied (when a conversion signal indicating that conversion has been performed is supplied), the selector 55 selects the input port 56c to output the converted 2-bit data supplied from the register 54 through the output port 57. Accordingly, the 2 bits output when the conversion table table1 includes data identical to D4[n], that is, any of "01b," "10b" and "11b" is output through the output port 57.

<Compressive Encoding Process Flow>

Figure 5:
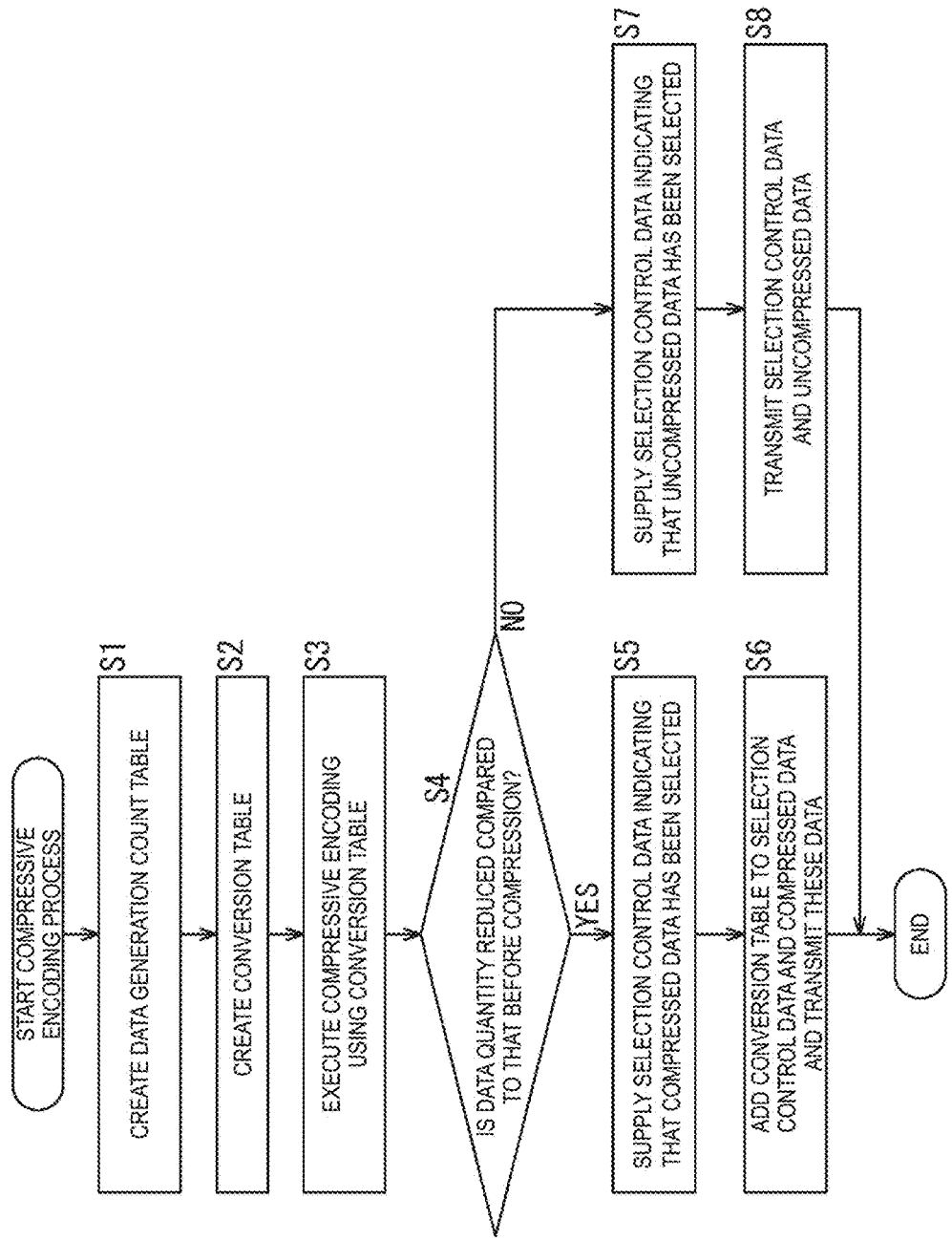
FIG. 5 is a flowchart illustrating a compressive encoding process.

A compressive encoding process performed by the compressive encoding apparatus 1 will be described with reference to the flowchart of FIG. 5.

The process of the ADC 12 is omitted in the process flow of FIG. 5, and a process after DSD data of one frame, which has been ΔΣ-modulated in the ADC 12, is output from the input buffer 13 will be described.

First, the controller 14 counts the number of times D4 data is generated after the past three pieces of D4 data (past 12-bit data) for DSD data of one frame and creates the data generation count table pretable in step S1.

The controller 14 creates the conversion table table 1 having 4,096 columns and 3 columns on the basis of the created data generation count table pretable in step S2. The controller 14 supplies the created conversion table table1 to the encoding unit 15 and the data transmission unit 18.

The encoding unit 15 executes compressive encoding on the DSD data of one frame period using the conversion table table1 in step S3. Specifically, the encoding unit 15 performs a process of converting 4-bit DSD data D4[n] into 2-bit data "01b," "10b" or "11b" or 6-bit data "00b+D4[b]" for the DSD data of one frame period. The compressed data obtained through compressive encoding is supplied to the encoded data buffer 16 and the data quantity comparison unit 17.

The data quantity comparison unit 17 compares the quantity of the uncompressed data of one frame, supplied from the input buffer 13, with the quantity of the compressed data of one frame, supplied from the encoded data buffer 16, and determines whether the quantity of data has been reduced compared to that before compression in step S4.

When it is determined that the data quantity has been reduced compared to that before compression in step S4, the process proceeds to step S5 and the data quantity comparison unit 17 supplies selection control data indicating that the compressed data has been selected to the data transmission unit 18.

In step S6, the data transmission unit 18 adds data of the conversion table table1 (conversion table data) supplied from the controller 15 to the selection control data indicating that the compressed data has been selected (a flag indicating compressively encoded data) and the compressed data supplied from the encoding unit 15 and transmits the data to a counterpart apparatus.

On the other hand, when it is determined that the data quantity has not been reduced compared to that before compression in step S4, the process proceeds to step S7 and the data quantity comparison unit 17 supplies the selection control data indicating that the uncompressed data has been selected along with the uncompressed data to the data transmission unit 18.

In step S8, the data transmission unit 18 transmits selection control data indicating that the uncompressed data has been selected (a flag indicating data which has not been compressively encoded) and the uncompressed data to the counterpart apparatus.

In this way, the compressive encoding process of the DSD data of one frame is completed. The aforementioned process of steps S1 to S8 is repeated for DSD data in units of one frame sequentially supplied from the input buffer 13.

<Example of Configuration of Decoding Apparatus>

Figure 6:
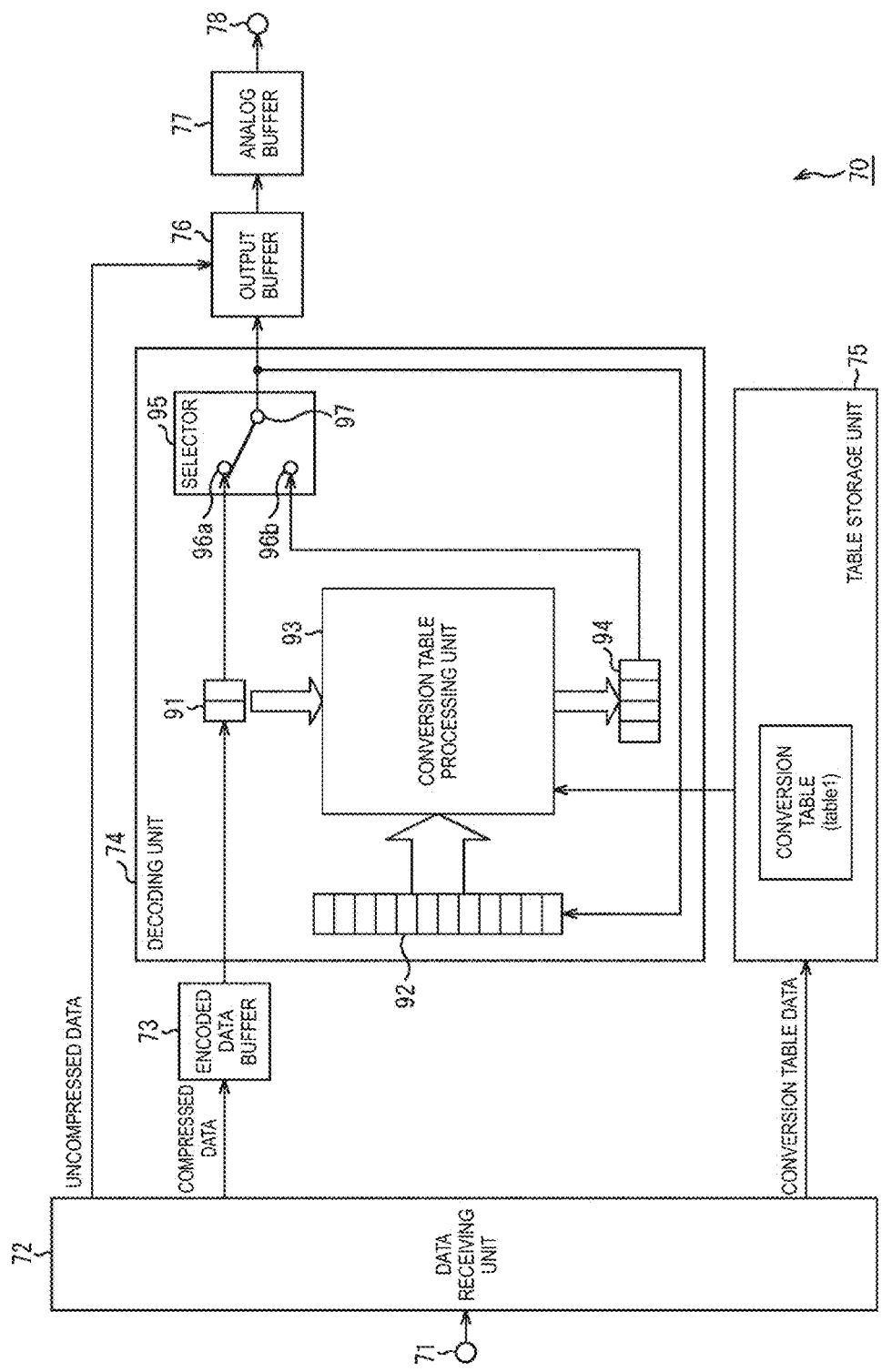
FIG. 6 is a block diagram illustrating an example of a configuration of a first embodiment of a decoding apparatus.

FIG. 6 illustrates an example of a configuration of a first embodiment of a decoding apparatus according to the present disclosure.

The decoding apparatus 70 of FIG. 6 is an apparatus for receiving an audio signal compressively encoded and transmitted by the compressive encoding apparatus 1 of FIG. 1 and decompressing (reversible decoding) the audio signal.

The audio signal compressively encoded and transmitted by the compressive encoding apparatus 1 of FIG. 1 is received by an input unit 71 of the decoding apparatus 70 through a network which is not shown (e.g., a public line network such as a local area network (LAN), a wide area network (WAN), the Internet, a telephone line network or a satellite communication network) and supplied to a data receiving unit 72.

The data receiving unit 72 separates a synchronization signal included in received data, and detects and corrects a transmission error generated during network transmission.

In addition, the data receiving unit 72 determines whether the audio signal included in the received data has been compressively encoded on the basis of selection control data indicating whether the audio signal has been compressively encoded. When the audio signal has been compressively encoded, the data receiving unit 72 supplies the received compressed data to an encoded data buffer 73. On the other hand, when the audio signal has not been compressively encoded, the data receiving unit 72 supplies the received uncompressed data to an output buffer 76.

Further, the data receiving unit 72 supplies data of the conversion table table1 (conversion table data) included in the received data to a table storage unit 75. The table storage unit 75 stores the conversion table table1 supplied from the data receiving unit 72 and supplies the conversion table table1 to a decoding unit 74 as necessary.

The encoded data buffer 73 temporarily accumulates the compressed data supplied from the data receiving unit 72 and supplies the compressed data to the following decoding unit 74 at predetermined timing.

The decoding unit 74 decodes (reversibly decodes) the compressed data into a state before compression and supplies the decoded data to the output buffer 76.

The decoding method performed by the decoding unit 74 will be described.

A case in which compressed data which has been compressively encoded and transmitted by the compressive encoding apparatus 1 is represented in units of 2 bits as follows and E2[n] is decoded will be described.

. . . E2[n−3], E2[n−2], E2[n−1], E2[n], E2[n+1], E2[n+2], E2[n+3], . . . .

Here, E2[n] represents continuous 2-bit data and is also called E2 data.

First of all, the decoding unit 74 determines the value of E2[n].

When E2[n] is "00b," this is not data loaded in the received conversion table table1[4096][3] and thus 4-bit data "E2[n+1]+E2[n+2]" following E2[n] is data to be decoded.

On the other hand, when E2[n] is "01b," "10b" or "11b," this is data loaded in the received conversion table table1 [4096][3] and thus data to be decoded is searched for with reference to the conversion table table1[4096][3] using 12-bit D4 data D4[n−3], D4[n−2], D4[n−1] which has been decoded immediately before E2[n]. The data to be decoded is data contained in "table1[D4[n−3], D4[n−2], D4[n−1]] [E2[n]−1]."

In the above-described manner, the decoding unit 74 can decode (reversibly decode) the compressed data into a state before compression.

The decoding unit 74 includes a 2-bit register 91, a 12-bit register 92, a conversion table processing unit 93, a 4-bit register 94 and a selector 95, as illustrated in FIG. 6.

2-bit E2 data (e.g., E2[n]) supplied from the encoded data buffer 73 is stored in the register 91.

The output of the selector 95 is supplied to the 12-bit register 92 and 12-bit data (e.g., D4[n−3], D4[n−2], D4[n−1]), which has been decoded immediately before the 2-bit E2 data (e.g., E2[n]) stored in the register 91, is contained in the register 92.

When the 2-bit E2 data (e.g., E2[n]) stored in the register 91 is "00b," the selector 95 selects an input port 96a and outputs 4-bit data "E2[n+1]+E2[n+2]" following E2[n] through an output port 97 as a decoding result.

When the 2-bit E2 data (e.g., E2[n]) stored in the register 91 is "01b," "10b" or "11b," the conversion table processing unit 93 stores, in the register 94, 4-bit data contained in "table1[D4[n−3], D4[n−2], D4[n−1]][E2[n]-1]" of the conversion table table1 supplied from the table storage unit 75. The selector 95 selects an input port 96b and outputs the data stored in the register 94 through the output port 97 as a decoding result.

The output buffer 76 appropriately selects one of the uncompressed data supplied from the data receiving unit 72 and the decoded data supplied from the decoding unit 74 and supplies the selected one to an analog filter 77.

The analog filter 77 executes predetermined filter processing such as low pass filter or bandpass filter processing on the decoded data supplied from the output buffer 76 and outputs the filtered data through an output unit 78.

<Decoding Process Flow>

Figure 7:
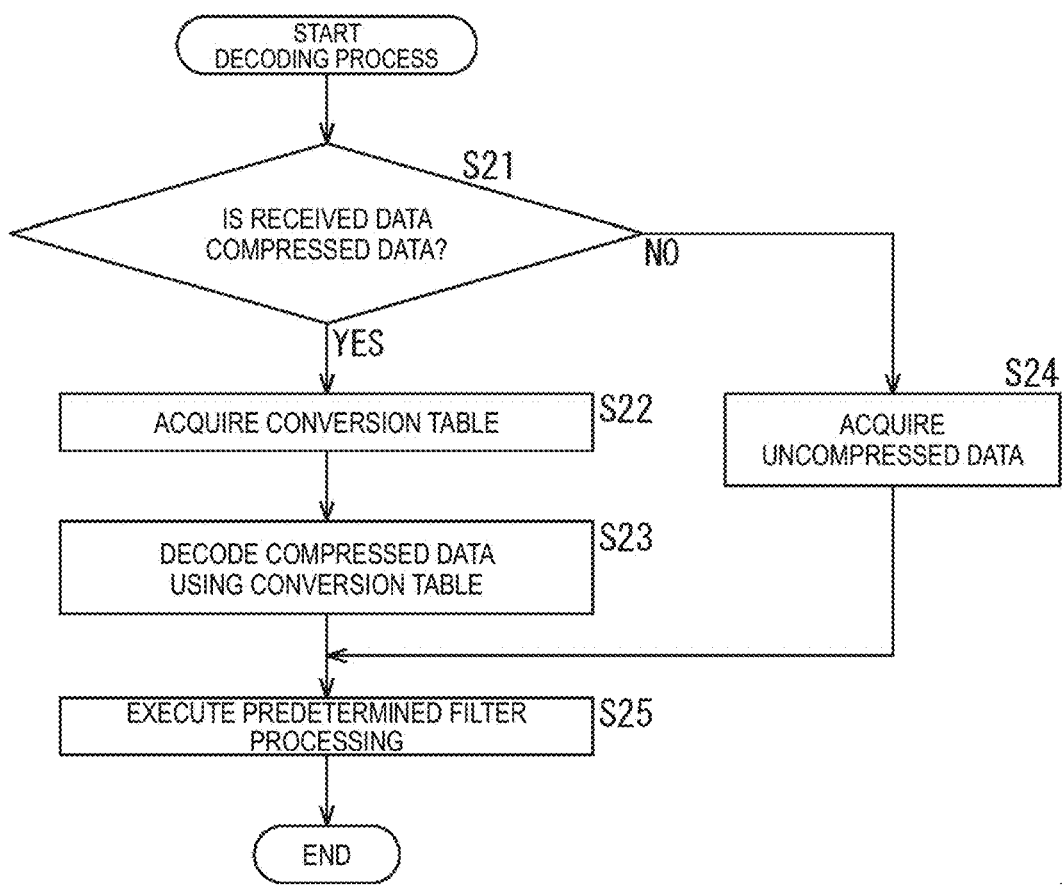
FIG. 7 is a flowchart illustrating a decoding process.

The decoding process of the decoding apparatus 700 will be further described with reference to the flowchart of FIG. 7.

First, the data receiving unit 72 determines whether received data is compressively encoded compressed data on the basis of selection control data included in the received data in step S21.

When it is determined that the received data is compressed data in step S21, the process proceeds to step S22 and the data receiving unit 72 supplies conversion table data included in the received data to the table storage unit 75. The conversion table processing unit 93 acquires the received conversion table table1 through the table storage unit 75.

In addition, the compressed data included in the received data is supplied to the encoded data buffer 73 in step S22.

In step S23, the decoding unit 74 decodes the compressed data supplied from the encoded data buffer 73 using the conversion table table1 and supplies the decoded data to the output buffer 76. That is, the decoding unit 74 supplies 4-bit data "E2[n+1]+E2[n+2]" following E2[n] to the output buffer 76 as a decoding result when 2-bit E2 data (e.g., E2[n]) is "00b" and supplies 4-bit data contained in "table1 [D4[n−3], D4[n−2], D4[n−1]][E2[n]-1]" of the conversion table table1 to the output buffer 76 as a decoding result when the 2-bit E2 data (e.g., E2[n]) is "01b," "10b" or "11b."

On the other hand, when it is determined that the received data is not compressed data, that is, the received data is uncompressed data, in step S21, the process proceeds to step S24 and the data receiving unit 72 acquires the uncompressed data included in the received data and supplies the acquired data to the output buffer 76.

According to the aforementioned process, the uncompressed data or the data decoded by the decoding unit 74 is supplied to the output buffer 76 and the data supplied to the output buffer 76 is output to the analog filter 77.

In step S25, the analog filter 77 executes predetermined filter processing on the data supplied through the output buffer 76. The filtering processed audio signal is output through the output unit 78.

The aforementioned process is repeated for audio signals in units of one frame.

According to the aforementioned first embodiment, the compressive encoding apparatus 1 compressively encodes and transmits DSD data and the decoding apparatus 70 receives the compressively encoded and transmitted data, reversibly decodes the received data and outputs the decoded data. In the first embodiment, data of the conversion table table1 used for compressive encoding is also transmitted as transmission data.

<2. Second Embodiment>

<Example of Configuration of Compressive Encoding Apparatus>

Figure 8:
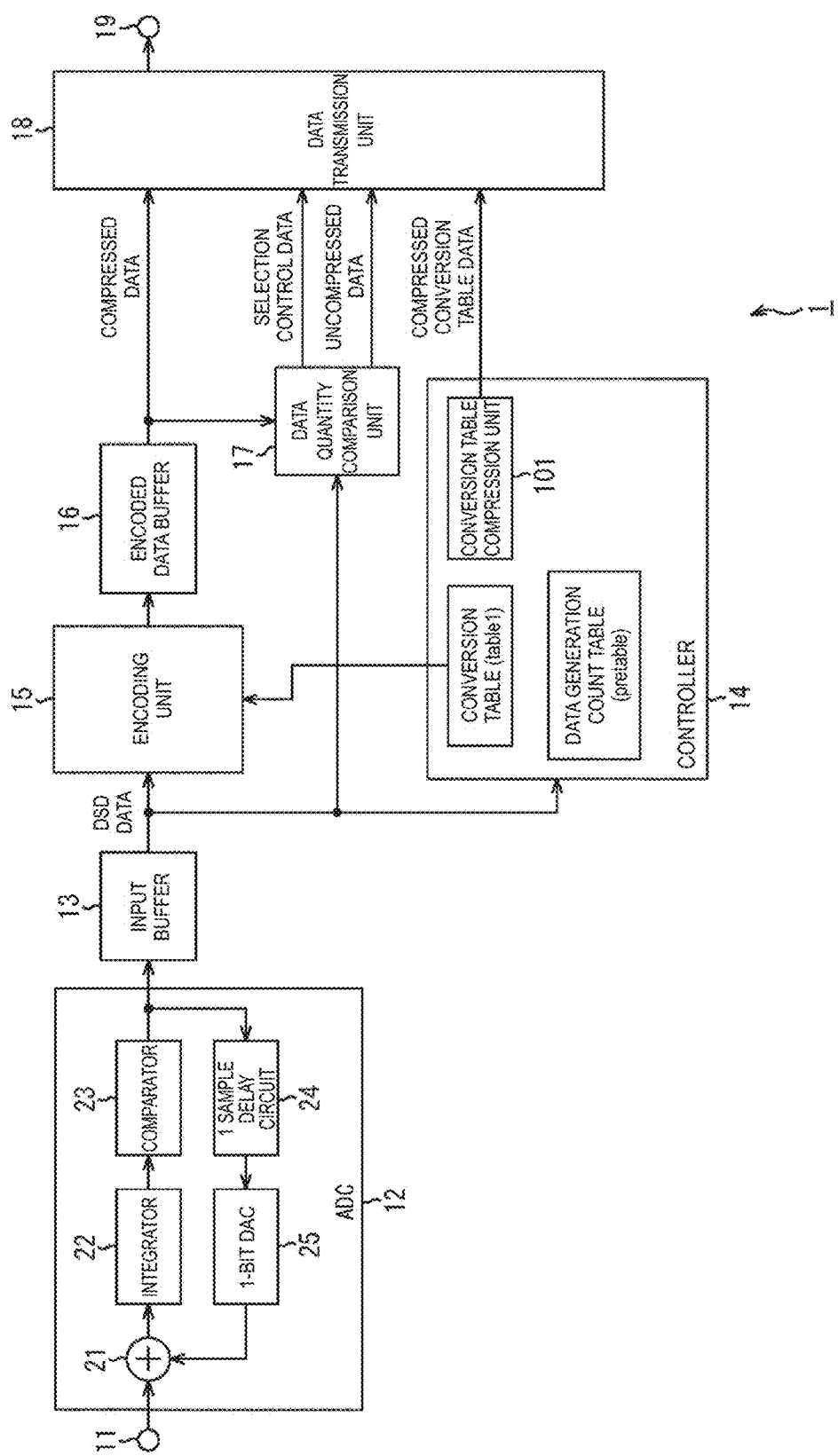
FIG. 8 is a block diagram illustrating an example of a configuration of a second embodiment of a compressive encoding apparatus.

FIG. 8 illustrates an example of a configuration of a second embodiment of the compressive encoding apparatus according to the present disclosure.

In FIG. 8, same symbols are affixed to parts corresponding to the aforementioned first embodiment and description thereof is appropriately omitted. The same applies to other embodiments which will be described below.

In comparison of the compressive encoding apparatus 1 of FIG. 8 with the compressive encoding apparatus 1 of the first embodiment illustrated in FIG. 1, a conversion table compression unit 101 is newly included in part of the controller 14 in the compressive encoding apparatus 1 of the second embodiment.

The first embodiment employs a configuration in which the conversion table table1[4096][3] having 4,096 columns and 3 columns created by the controller 14 is not compressed as conversion table data but is transmitted along with compressed data. This is because the quantity of data of the conversion table table1 having 4,096 columns and 3 columns is remarkably smaller than 5.6 Mbit data per frame.

However, a case in which the quantity of data of the conversion table table1 is greater than the quantity of compressed data may be conceived. In such a case, the conversion table compression unit 101 may be provided as in the second embodiment. The conversion table compression unit 101 compresses data of the conversion table table1 by compressing the data of the conversion table table1 through a predetermined compression method, creating differential data of the conversion table table1, or the like to create compressed conversion table data and supplies the compressed conversion table data to the data transmission unit 18.

The data transmission unit 18 transmits the compressed conversion table data instead of the conversion table data in the first embodiment to a counterpart apparatus along with the compressed data.

<Example of Configuration of Decoding Apparatus>

Figure 9:
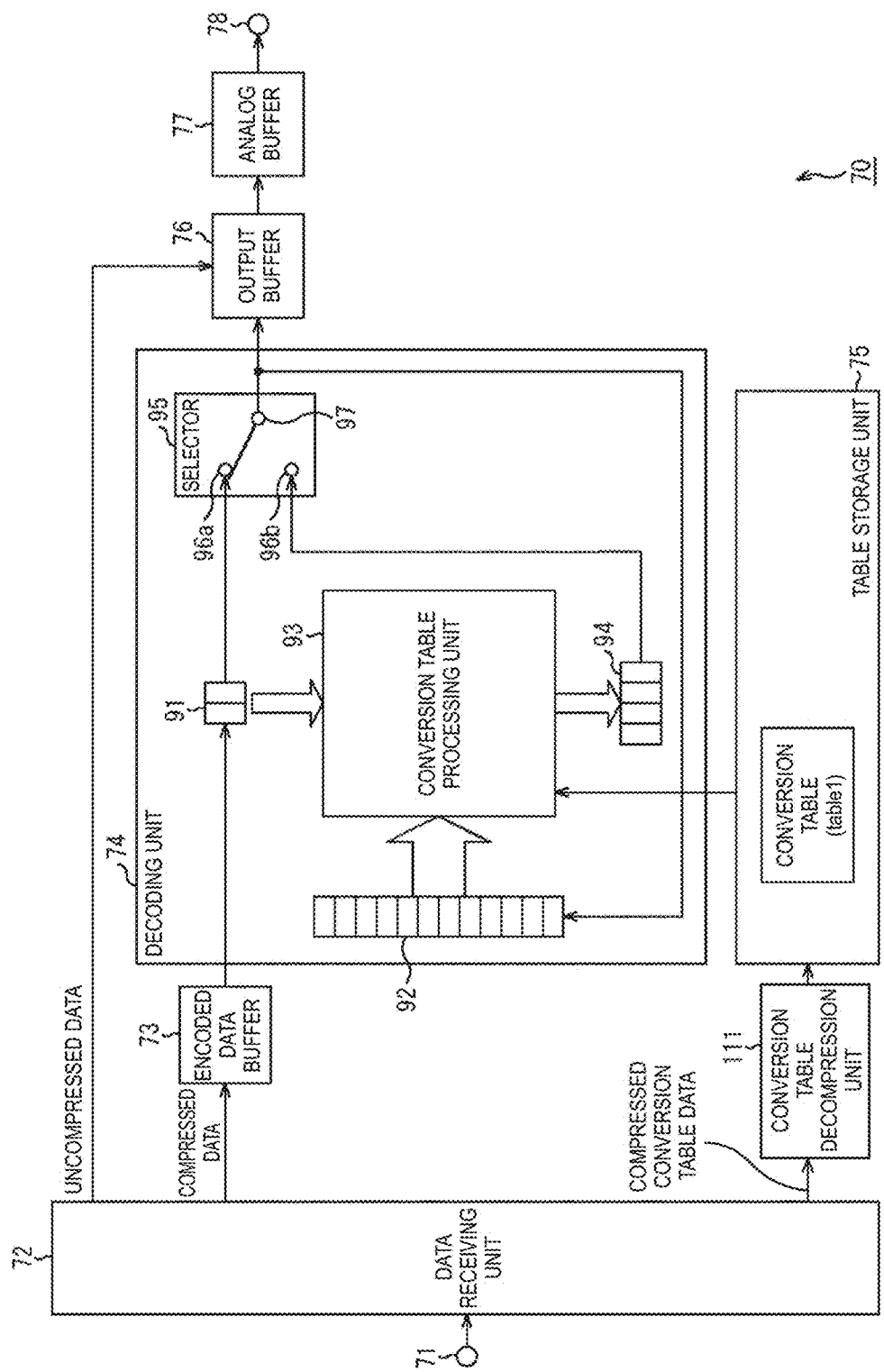
FIG. 9 is a block diagram illustrating an example of a configuration of a second embodiment of a decoding apparatus.

FIG. 9 illustrates an example of a configuration of a second embodiment of a decoding apparatus according to the present disclosure.

The decoding apparatus 70 of FIG. 9 is an apparatus for receiving an audio signal compressively encoded and transmitted by the compressive encoding apparatus 1 of FIG. 8 and decompressing (reversible decoding) the audio signal.

In comparison of the decoding apparatus 70 of FIG. 9 with the decoding apparatus 70 of the first embodiment illustrated in FIG. 6, a conversion table decompression unit 111 is newly provided between the data receiving unit 72 and the table storage unit 75 in the decoding apparatus 70 of the second embodiment.

The conversion table decompression unit 111 executes a decompression process corresponding to the compression process performed by the conversion table compression unit 101 of FIG. 8 on compressed conversion table data supplied from the data receiving unit 72. The conversion table table1 acquired as a result of the decompression process is supplied to the table storage unit 75 as in the first embodiment.

According to the aforementioned second embodiment, the compressive encoding apparatus 1 compressively encodes and transmits DSD data and the decoding apparatus 70 receives the compressively encoded and transmitted data, reversibly decodes the received data and outputs the decoded data. In the second embodiment, the data of the conversion table table1 used for compressive encoding is compressed and transmitted as transmission data.

<3. Third Embodiment>
<Example of Configuration of Compressive Encoding Apparatus>

Figure 10:
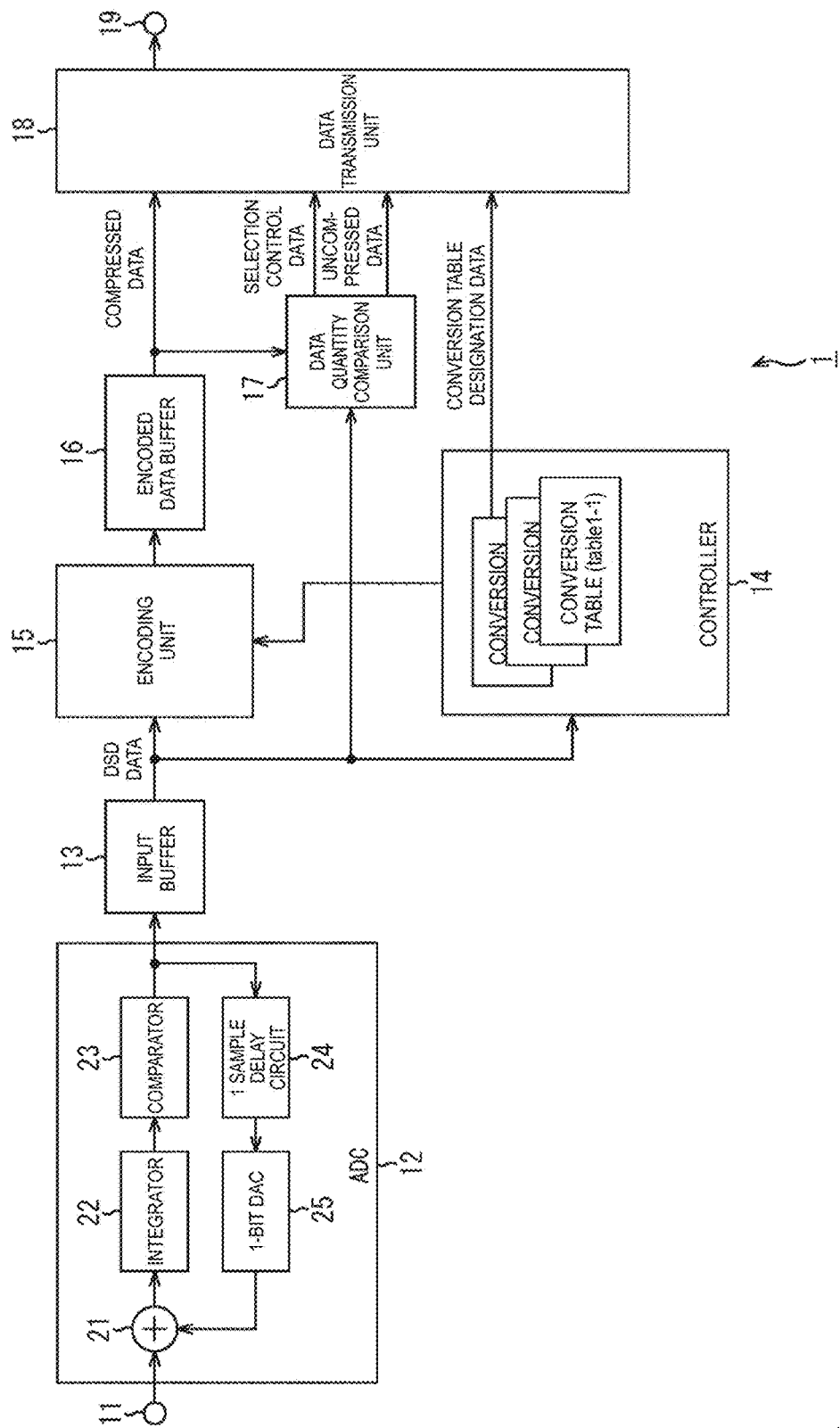
FIG. 10 is a block diagram illustrating an example of a configuration of a third embodiment of a compressive encoding apparatus.

FIG. 10 illustrates an example of a configuration of a third embodiment of the compressive encoding apparatus according to the present disclosure.

In comparison of the compressive encoding apparatus 1 of FIG. 10 with the compressive encoding apparatus 1 of the first embodiment illustrated in FIG. 1, a plurality of conversion tables table1 are provided in the controller 14 in the compressive encoding apparatus 1 of the third embodiment. Although the controller 14 stores three types of conversion tables table1, conversion table table1-1, conversion table table1-2 and conversion table table1-3, in the present embodiment, the number of conversion tables table1 included in the controller 14 is not limited.

The conversion table table1 created on the basis of the data generation count table pretable has little difference among content. This is because there is no large difference in patterns having high generation frequencies even though the order of generation frequency slightly changes.

Accordingly, it is possible to previously create a plurality of types of conversion tables table1 using a plurality of pieces of content, store the conversion tables table1 in the controller 14, appropriately select conversion tables and perform compressive encoding, as illustrated in FIG. 10. The controller 14 serves as a storage unit which stores the previously created plurality of types of conversion tables table1.

When the quantity of data of the conversion table table1 cannot be ignorable even though the data of the conversion table table1 has been compressed, as in the aforementioned second embodiment, or the conversion table table1 cannot be transmitted for some reasons such as balancing of communication lines, it is possible to employ a configuration in which compressive encoding is performed using the plurality of types of conversion tables table1 previously stored in the controller 14, as in the present embodiment.

Further, there is a case in which the ADC 12 that performs ΔΣ modulation has different characteristics depending on makers which provide the ADC 12, and the like. Accordingly, the plurality of conversion tables table1 stored in the controller 14 may correspond to a maker which provides the ADC 12.

The plurality of conversion tables table1 previously stored in the controller 14 are commonly included in an apparatus of a decoding side.

Therefore, the conversion table table1 of transmission content is created in units of one frame and transmitted in real time in the aforementioned first and second embodiments, whereas the conversion table table1 of transmission content need not be created in the third embodiment.

The controller 14 selects a conversion table table1 most suitable for DSD data supplied from the input buffer 13 from the previously stored plurality of conversion tables table1 and supplies conversion table designation data which designates the selected conversion table table1 to the data transmission unit 18.

The data transmission unit 18 transmits the conversion table designation data instead of the conversion table data in the first embodiment to a counterpart apparatus along with compressed data and the like.

The controller 14 checks compression rates of the plurality of conversion tables table1 by sequentially supplying the plurality of conversion tables table1 included therein to the encoding unit 15 to compressively encode the conversion tables table1. Then, the controller 14 supplies a conversion table table1 having a highest compression rate to the encoding unit 15 as a conversion table table1 to be used and supplies conversion table designation data which designates the selected conversion table table1 to the data transmission unit 18.

Further, the controller 14 may have the same encoding function as the encoding unit 15, compressively encode DSD data supplied from the input buffer 13 with the plurality of conversion tables table1 included therein and decide the conversion table table1 having the highest compression rate, for example.

In addition, with respect to timing of selecting one of the plurality of conversion tables table1, one of the plurality of conversion tables table1 may be selected frame by frame or content by content. That is, compressive encoding may be performed using all conversion tables table1 only in the first frame of transmitted content and, when a conversion table table1 having a highest compression rate is decided, compressive encoding may be performed using the same conversion table table1 for the content, or compressive encoding may be performed using all conversion tables table1 in units of one frame or several frames every time and a conversion table table1 having a highest compression rate may be decided.

<Example of Configuration of Decoding Apparatus>

Figure 11:
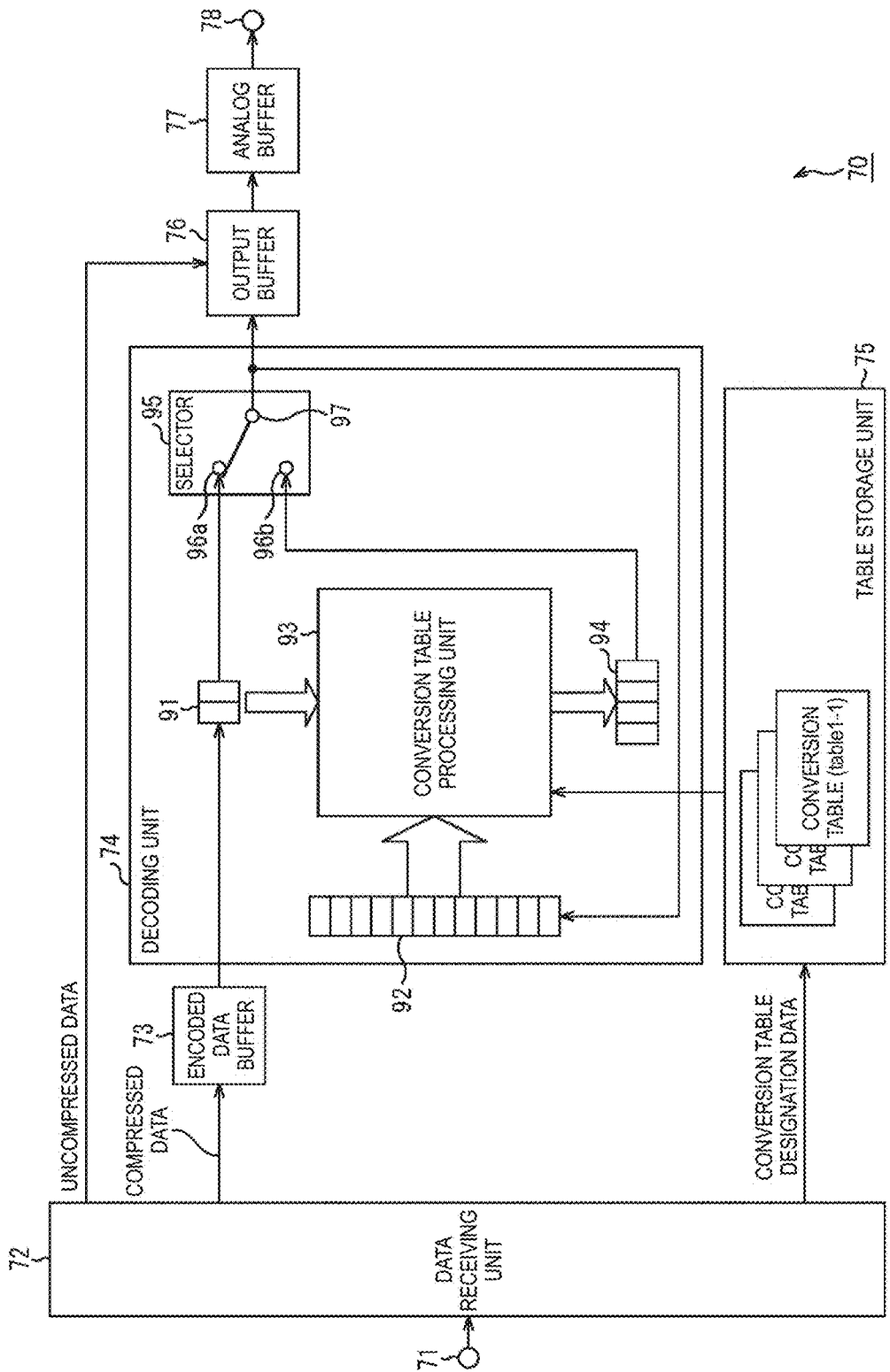
FIG. 11 is a block diagram illustrating an example of a configuration of a third embodiment of a decoding apparatus.

FIG. 11 illustrates an example of a configuration of a third embodiment of a decoding apparatus according to the present disclosure.

The decoding apparatus 70 of FIG. 11 is an apparatus for receiving an audio signal compressively encoded and transmitted by the compressive encoding apparatus 1 of FIG. 10 and decompressing (reversible decoding) the audio signal.

In comparison of the decoding apparatus 70 of FIG. 11 with the decoding apparatus 70 of the first embodiment illustrated in FIG. 6, a plurality of conversion tables (conversion table table1-1, conversion table table1-2 and conversion table table1-3) identical to those stored in the controller 14 of the compressive encoding apparatus 1 of FIG. 10 are stored in the table storage unit 75 in the decoding apparatus 70 of the third embodiment.

The data receiving unit 72 supplies conversion table designation data included in received data to the table storage unit 75. The table storage unit 75 supplies the conversion table table1 (one of the conversion table table1-

1, conversion table table1-2 and conversion table table1-3) designated by the conversion table designation data supplied from the data receiving unit 72 to the decoding unit 74.

According to the aforementioned third embodiment, the compressive encoding apparatus 1 compressively encodes and transmits DSD data and the decoding apparatus 70 receives the compressively encoded and transmitted data, reversibly decodes the received data and outputs the decoded data. In the third embodiment, conversion tables table1 used for compressive encoding are previously stored.

<4. Fourth Embodiment>
<Example of Configuration of Compressive Encoding Apparatus>

Figure 12:
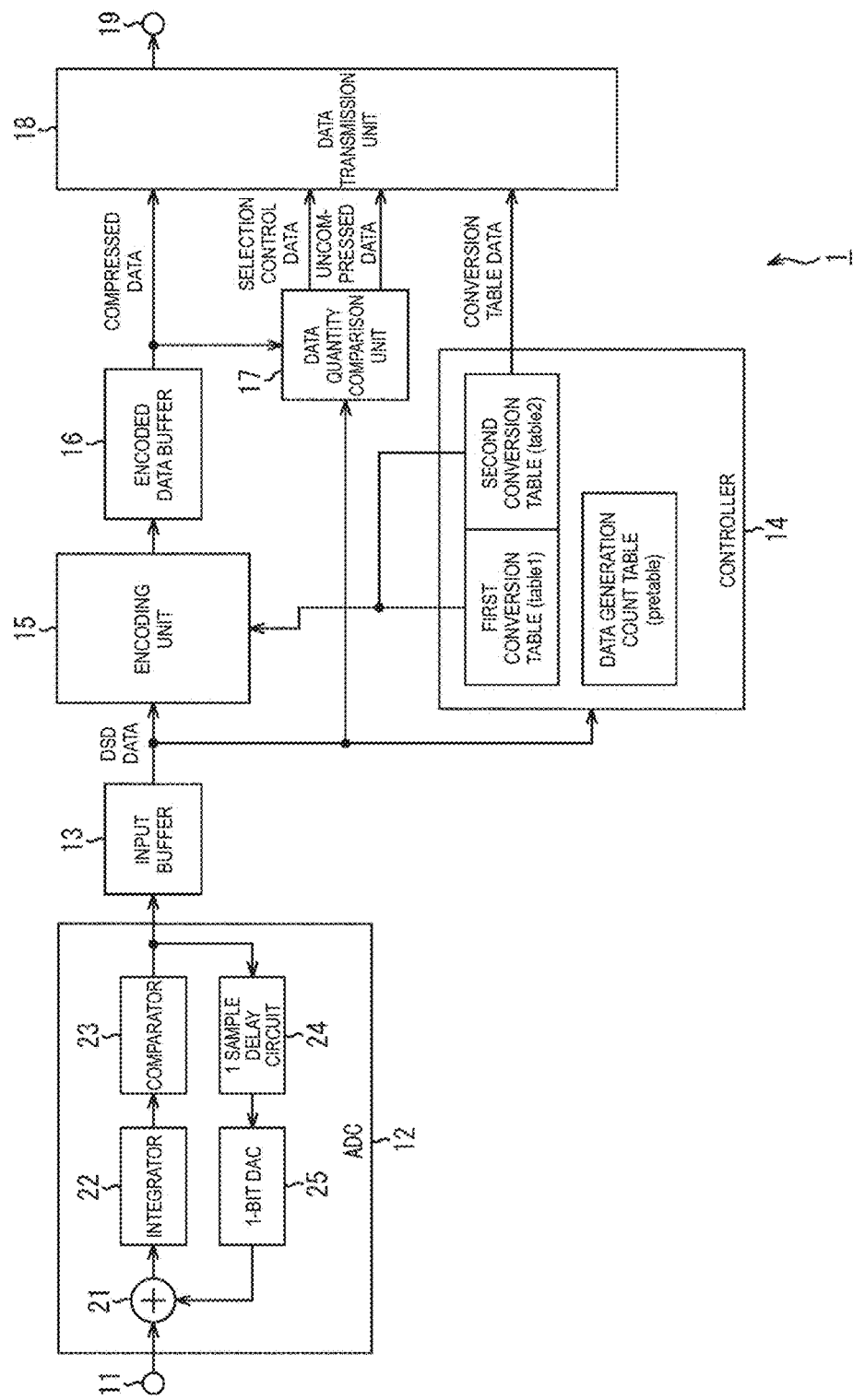
FIG. 12 is a block diagram illustrating an example of a configuration of a fourth embodiment of a compressive encoding apparatus.

FIG. 12 illustrates an example of a configuration of a fourth embodiment of the compressive encoding apparatus according to the present disclosure.

In comparison of the compressive encoding apparatus 1 of FIG. 12 with the compressive encoding apparatus 1 of the first embodiment illustrated in FIG. 1, the compressive encoding apparatus 1 of the fourth embodiment differs from the compressive encoding apparatus 1 of the first embodiment in that the controller 14 also creates a second conversion table table2 in addition to a first conversion table table1 identical to the conversion table table1. The controller 14 supplies the created first conversion table table1 and second conversion table table2 to the encoding unit 15 and the data transmission unit 18. In the following, the first conversion table table1 and the second conversion table table2 are integrated and called a 2-stage conversion table table.

That is, in the aforementioned first embodiment, the compressive encoding apparatus 1 stores ranked three values having higher generation frequencies from the data generation count table pretable in the conversion table table1 and adds D4 data behind "00b" as it is and transmits 6 bits for other values.

In the fourth embodiment, the second conversion table table2 which contains values having fourth to sixth highest generation frequencies is further created from the data generation count table pretable in addition to the first conversion table table1.

FIG. 13 illustrates an example of a second conversion table table2[4096][3] created from the data generation count table pretable illustrated in FIG. 2.

In pretable[117][0] to [117][15] of the 118$^{th}$ column of the data generation count table pretable in FIG. 2, a value having the fourth generation frequency is "9" which has been generated 12 times, a value having the fifth generation frequency is "6" which has been generated 11 times, and a value having the sixth generation frequency is "2" which has been generated 10 times.

Accordingly, {09} is contained in the 118$^{th}$ column and first column table1[117][0] of the second conversion table table2[4096][3] illustrated in FIG. 13, {06} is contained in the 118$^{th}$ column and second column table1[117][1], and {02} is contained in the 118$^{th}$ column and third column table1[117][2].

<Compressive Encoding Method Using First Conversion Table Table1 and Second Conversion Table Table2>

A compressive encoding method using the first conversion table table1 and the second conversion table table2 by the encoding unit 15 of the fourth embodiment will be described.

In a way similar to the first embodiment, a case in which the encoding unit 15 encodes D4[n] from among DSD data . . . D4 [n−3], D4 [n−2], D4[n−1], D4[n], D4[n+1], D4[n+2], D4[n+3], . . . supplied from the input buffer 13 will be described.

When D4[n] is encoded, the encoding unit 15 regards D4[n−3], D4[n−2], D4[n−1] which are the past 12-bit data immediately before D4[n] as a mass of 12-bit data and searches for three values, table1[D4[n−3], D4[n−2], D4[n−1]][0], table1[D4 [n−3], D4 [n−2], D4[n−1]][1], and table1 [D4 [n−3], D4 [n−2], D4[n−1]][2], of an address (column) indicated by D4[n−3], D4[n−2], D4[n−1] of the first conversion table table1[4096][3].

When any of the three values, table1[D4[n−3], D4[n−2], D4[n−1]][0], table1[D4[n−3], D4[n−2], D4[n−1]][1], and table1[D4[n−3], D4[n−2], D4[n−1]][2], of the address (column) indicated by D4[n−3], D4[n−2], D4[n−1] is identical to D4[n], the encoding unit 15 converts D4[n] into 2 bits of "01b" if D4[n] is identical to table1[D4[n−3], D4[n−2], D4[n−1]][0], converts D4[n] into 2 bits of "10b" if D4[n] is identical to table1[D4[n−3], D4[n−2], D4[n−1]][1] and converts D4[n] into 2 bits of "11b" if D4[n] is identical to table1[D4[n−3], D4[n−2], D4[n−1]][2].

On the other hand, when the three values of the address (column) indicated by D4[n−3], D4[n−2]D4[n−1] of the first conversion table table1[4096][3] do not include data identical to D4[n], the encoding unit 15 searches for three values, table2[D4[n−3], D4[n−2], D4[n−1]][0], table2[D4[n−3], D4[n−2], D4[n−1]][1] and table2[D4[n−3], D4[n−2], D4[n−1]][2], of the address (column) indicated by D4[n−3], D4[n−2]D4[n−1] of the second conversion table table2[4096][3].

When any of the three values, table2[D4[n−3], D4[n−2], D4[n−1]][0], table2[D4[n−3], D4[n−2], D4[n−1]][1], and table2[D4[n−3], D4[n−2], D4[n−1]][2], of the address (column) indicated by D4[n−3], D4[n−2], D4[n−1] of the second conversion table table2[4096][3] is identical to D4[n], the encoding unit 15 converts D4[n] into 4 bits of "0001b" if D4[n] is identical to table2[D4[n−3], D4[n−2], D4[n−1]] [0], converts D4[n] into 4 bits of "0010b" if D4[n] is identical to table2[D4[n−3], D4[n−2], D4[n−1]][1] and converts D4[n] into 4 bits of "0011b" if D4[n] is identical to table2[D4[n−3], D4[n−2], D4[n−1]][2].

On the other hand, when the three values of the address (column) indicated by D4[n−3], D4[n−2]D4[n−1] of the second conversion table table2[4096][3] do not include data identical to D4[n], the encoding unit 15 adds "0000b" before D4[n], such as "000b+D4[n]," to convert D4[n] into 8 bits. Here, b in "0001b," "0010b," "0011b" and "0000b+D4[n]" represents binary notation.

As described above, the encoding unit 15 can compressively encode DSD data supplied from the input buffer 13 using both the first conversion table table1 and the second conversion table table2.

The data quantity comparison unit 17 compares the quantity of the DSD data supplied from the input buffer 13 with the quantity of compressed data which has been compressively encoded using both the first conversion table table1 and the second conversion table table2 and is supplied from the encoded data buffer 16, selects data in the smaller quantity and supplies selection control data indicating the selected data to the data transmission unit 18.

Further, the encoding unit 15 may, of course, compressively encode DSD data using only the first conversion table table1 among the first conversion table table1 and the second conversion table table2.

Accordingly, the controller 14 checks compression rates of compressive encoding using only the first conversion table table1 and compressive encoding using both the first conversion table table1 and the second conversion table table2. Then, the controller 14 may supply compressive encoding having a higher compression rate to the encoding unit 15 as a conversion table table to be used and supply the same to the data transmission unit 18.

<Example of Configuration of Decoding Apparatus>

Figure 14:
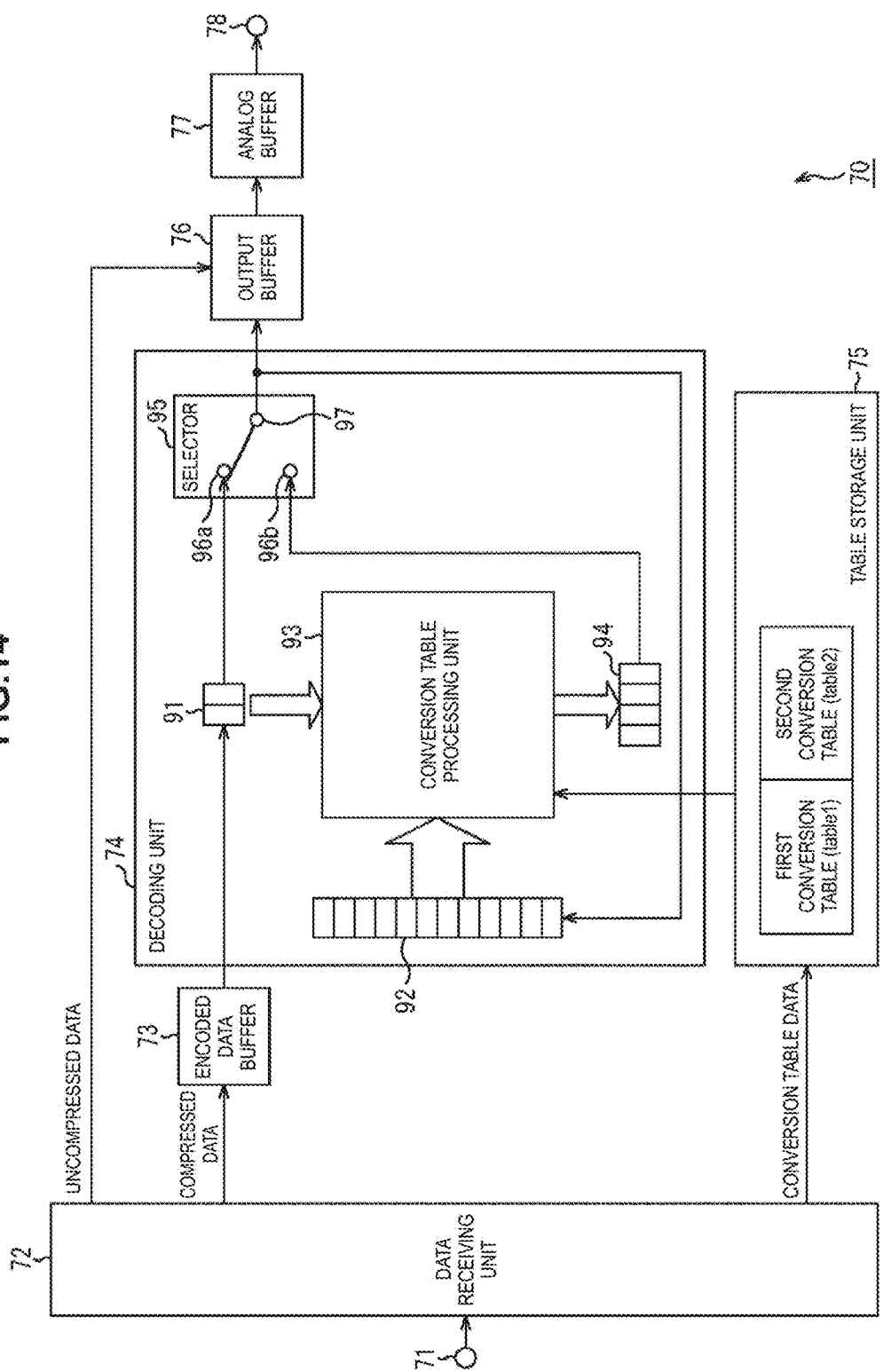
FIG. 14 is a block diagram illustrating an example of a configuration of a fourth embodiment of a decoding apparatus.

FIG. 14 illustrates an example of a configuration of a fourth embodiment of a decoding apparatus according to the present disclosure.

The decoding apparatus 70 of FIG. 14 is an apparatus which receives an audio signal compressively encoded and transmitted by the compressive encoding apparatus 1 of FIG. 12 and decompresses (reversibly decodes) the received audio signal.

In comparison of the decoding apparatus 70 of FIG. 14 with the decoding apparatus 70 of the first embodiment illustrated in FIG. 6, the decoding apparatus 70 of the fourth embodiment differs from the decoding apparatus 70 of the first embodiment in that both the first conversion table table1 and the second conversion table table2 transmitted from the compressive encoding apparatus 1 of FIG. 12 are stored in the table storage unit 75.

A description will be given of a decoding method using the first conversion table table1 and the second conversion table table2, which is performed by the decoding unit 74 of the fourth embodiment.

A description will be given of case in which compressed data which has been compressively encoded and transmitted by the compressive encoding apparatus 1 is . . . E2[n−3], E2[n−2], E2[n−1], E2[n], E2[n+1], E2[n+2], E2[n+3], . . . and E2[n] is decoded.

First of all, the decoding unit 74 determines the value of E2[n].

When E2[n] is "00b," this is not data loaded in the received first conversion table table1[4096][3], and thus the decoding unit 74 determines the value of E2[n+1].

When E2[n+1] is also "00b," this is not data loaded in the received second conversion table table2[4096][3], and thus 4-bit data "E2[n+2]+E2[n+3]" following E2[n+1] is data to be decoded.

On the other hand, when E2[n+1] is "01b," "10b" or "11b," this is data loaded in the received second conversion table table2[4096][3] and thus data to be decoded is searched for with reference to the second conversion table table2[4096][3] using 12-bit D4 data D4[n−3], D4[n−2], D4[n−1] which has been decoded immediately before E2[n]. The data to be decoded is data contained in "table2[D4[n−3], D4[n−2], D4[n−1]][E2[n+1]−1]."

On the other hand, when E2[n] is "01b," "10b" or "11b," this is data loaded in the received first conversion table table1[4096][3] and thus data to be decoded is searched for with reference to the first conversion table table1[4096][3] using 12-bit D4 data D4[n−3], D4[n−2], D4[n−1] which has been decoded immediately before E2[n]. The data to be decoded is data contained in "table1[D4[n−3], D4[n−2], D4[n−1]][E2[n]−1]."

As described above, the decoding unit 74 can decode (reversibly decode) compressed data into a state before compression using the first conversion table table1 and the second conversion table table2.

According to the aforementioned forth embodiment, the compressive encoding apparatus 1 compressively encodes and transmits DSD data and the decoding apparatus 70 receives the compressively encoded and transmitted data, reversibly decodes the received data and outputs the decoded data. In the fourth embodiment, the first conversion table table1 and the second conversion table table2 used for compressive encoding are transmitted as transmission data.

<5. Fifth Embodiment>
<Example of Configuration of Compressive Encoding Apparatus>

Figure 15:
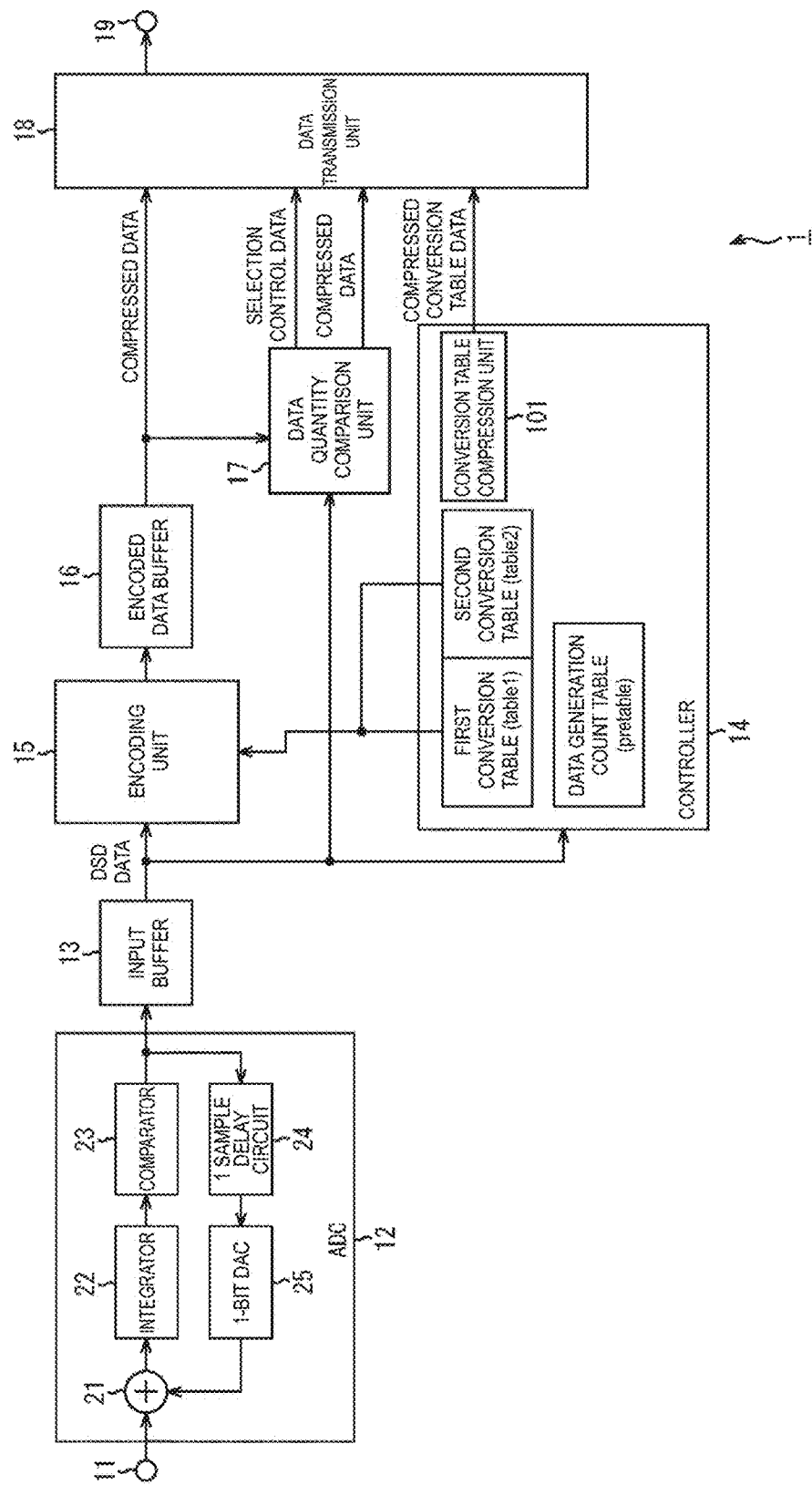
FIG. 15 is a block diagram illustrating an example of a configuration of a fifth embodiment of a compressive encoding apparatus.

FIG. 15 illustrates an example of a configuration of a fifth embodiment of the compressive encoding apparatus according to the present disclosure.

The compressive encoding apparatus 1 of the fifth embodiment illustrated in FIG. 15 has a configuration obtained by adding the configuration of the conversion table compression unit 101 of the second embodiment illustrated in FIG. 8 to the compressive encoding apparatus 1 of the fourth embodiment illustrated in FIG. 12.

That is, in the compressive encoding apparatus of the fifth embodiment, the controller 14 creates the first conversion table table1 and the second conversion table table2 from DSD data of one frame as in the aforementioned fourth embodiment. The conversion table compression unit 101 compresses data of the first conversion table table1 and the second conversion table table2 to create compressed conversion table data and supplies the compressed conversion table data to the data transmission unit 18.

<Example of Configuration of Decoding Apparatus>

Figure 16:
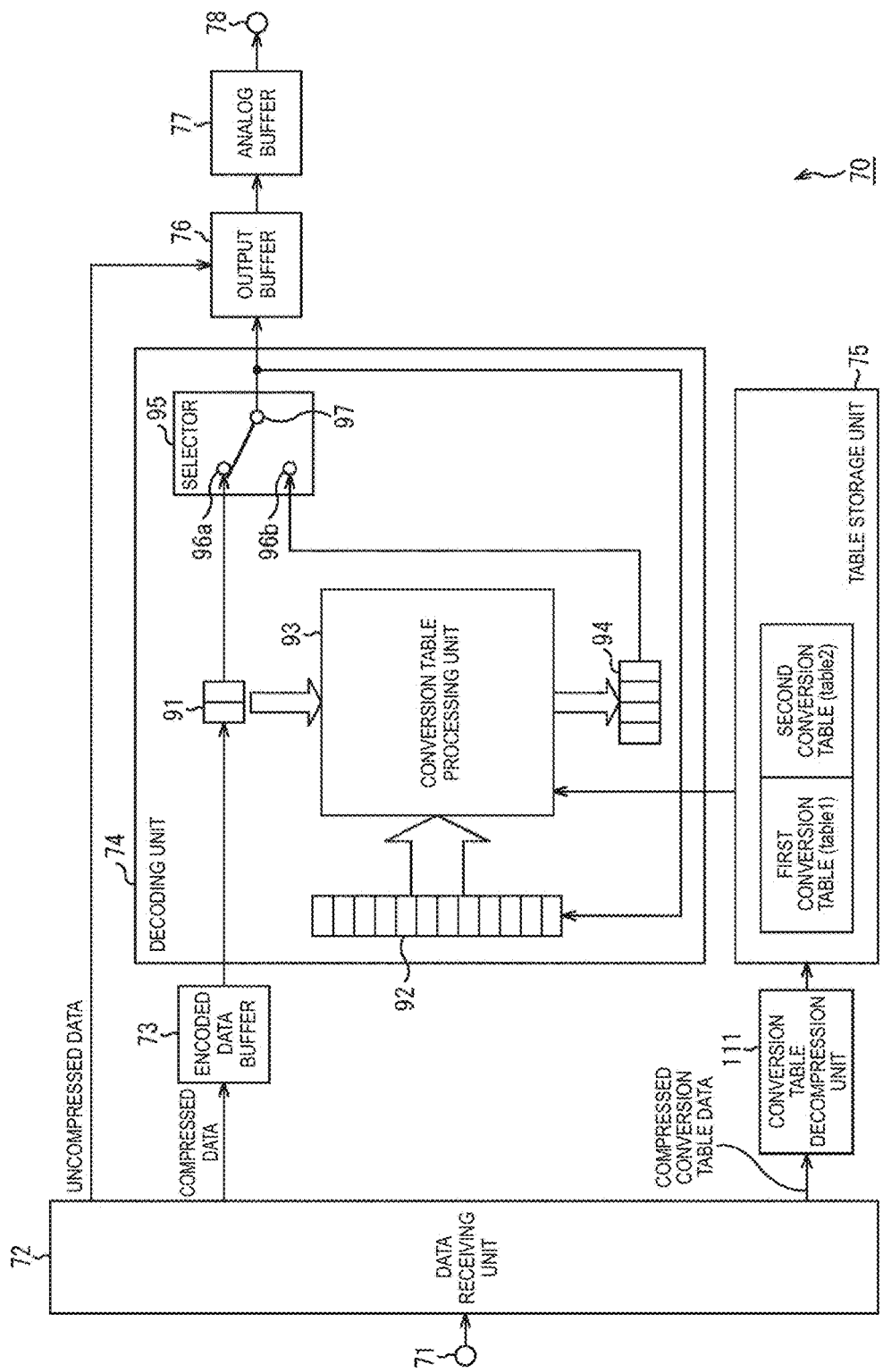
FIG. 16 is a block diagram illustrating an example of a configuration of a fifth embodiment of a decoding apparatus.

FIG. 16 illustrates an example of a configuration of a fifth embodiment of a decoding apparatus according to the present disclosure.

The decoding apparatus 70 of FIG. 16 is an apparatus for receiving an audio signal compressively encoded and transmitted by the compressive encoding apparatus 1 of FIG. 15 and decompressing (reversible decoding) the audio signal.

The conversion table decompression unit 111 executes a decompression process corresponding to the compression process performed by the conversion table compression unit 101 of FIG. 15 on the compressed conversion table data supplied from the data receiving unit 72. The first conversion table table1 and the second conversion table table2 are acquired through the decompression process. The acquired first conversion table table1 and second conversion table table2 are supplied to the table storage unit 75 and used for the decoding process performed by the decoding unit 74 as described in the fourth embodiment.

According to the aforementioned fifth embodiment, the compressive encoding apparatus 1 compressively encodes and transmits DSD data and the decoding apparatus 70 receives the compressively encoded and transmitted data, reversibly decodes the received data and outputs the decoded data. In the fifth embodiment, the first conversion table table1 and the second conversion table table2 used for compressive encoding are compressed and transmitted as transmission data.

<6. Sixth Embodiment>
<Example of Configuration of Compressive Encoding Apparatus>

Figure 17:
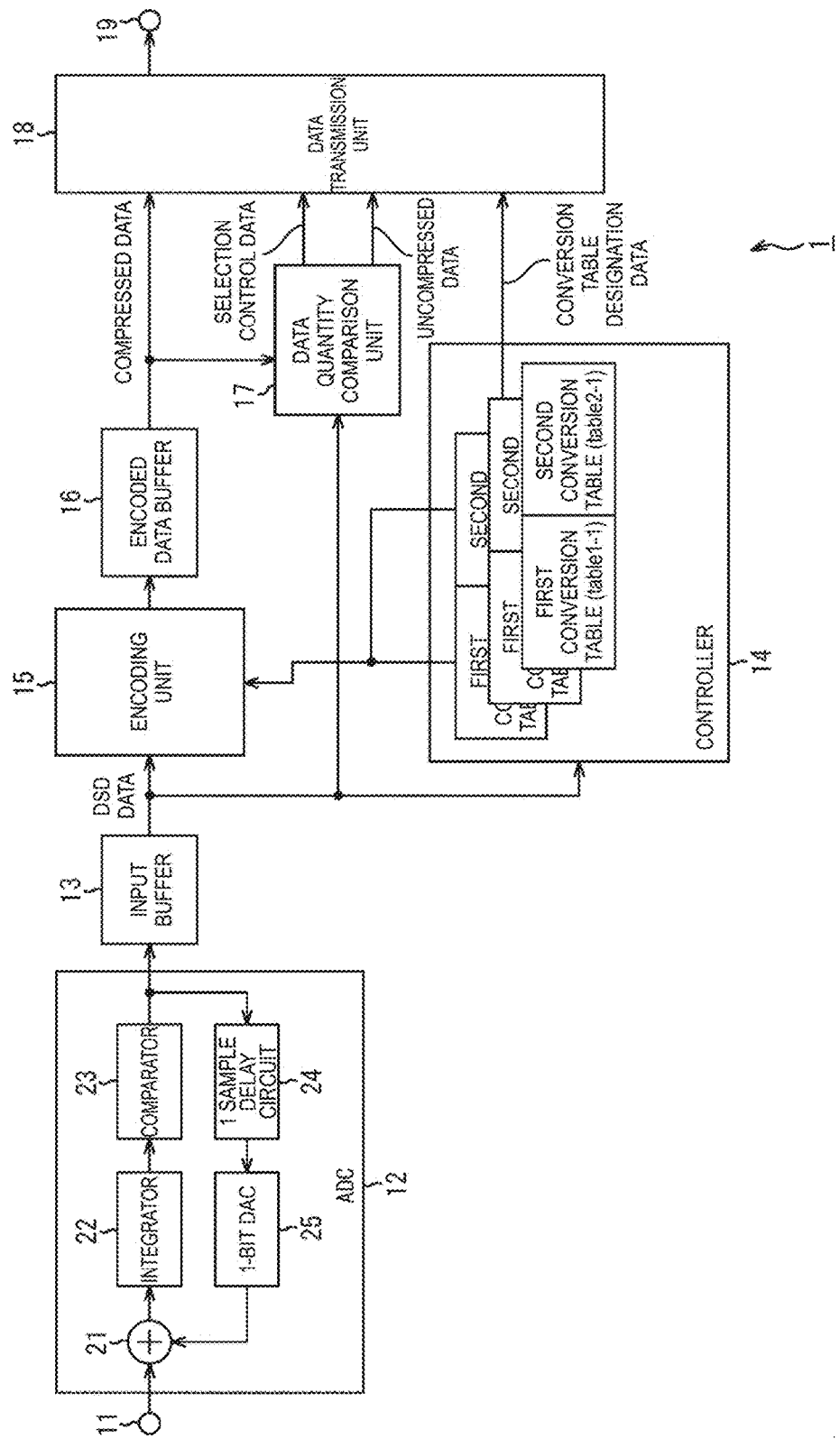
FIG. 17 is a block diagram illustrating an example of a configuration of a sixth embodiment of a compressive encoding apparatus.

FIG. 17 illustrates an example of a configuration of a sixth embodiment of the compressive encoding apparatus according to the present disclosure.

The compressive encoding apparatus 1 of the sixth embodiment illustrated in FIG. 17 has a configuration in which a plurality of types of the configuration of a 2-stage conversion table of the first conversion table table1 and the second conversion table table2 employed by the compressive encoding apparatus 1 of the fourth embodiment illustrated in FIG. 12 are previously created and stored.

That is, in the compressive encoding apparatus 1 of the sixth embodiment, the controller 14 previously stores three types of 2-stage conversion tables table, specifically, a first conversion table table1-1 and a second conversion table table2-1, a first conversion table table1-2 and a second conversion table table2-2, and a first conversion table 1-3 and a second conversion table table2-3.

The controller 14 selects a 2-stage conversion table table most suitable for DSD data supplied from the input buffer 13, that is, a 2-stage conversion table table having a highest compression rate, from the previously stored three types of 2-stage conversion tables table. Then, the controller 14 supplies conversion table designation data which designates the selected 2-stage conversion table table to the data transmission unit 18.

In addition, even when only the three types of first conversion tables table1 are used, it is possible to decide a first-stage conversion table table1 to be used by comparing compression rates, as described in the fourth embodiment.

<Example of Configuration of Decoding Apparatus>

Figure 18:
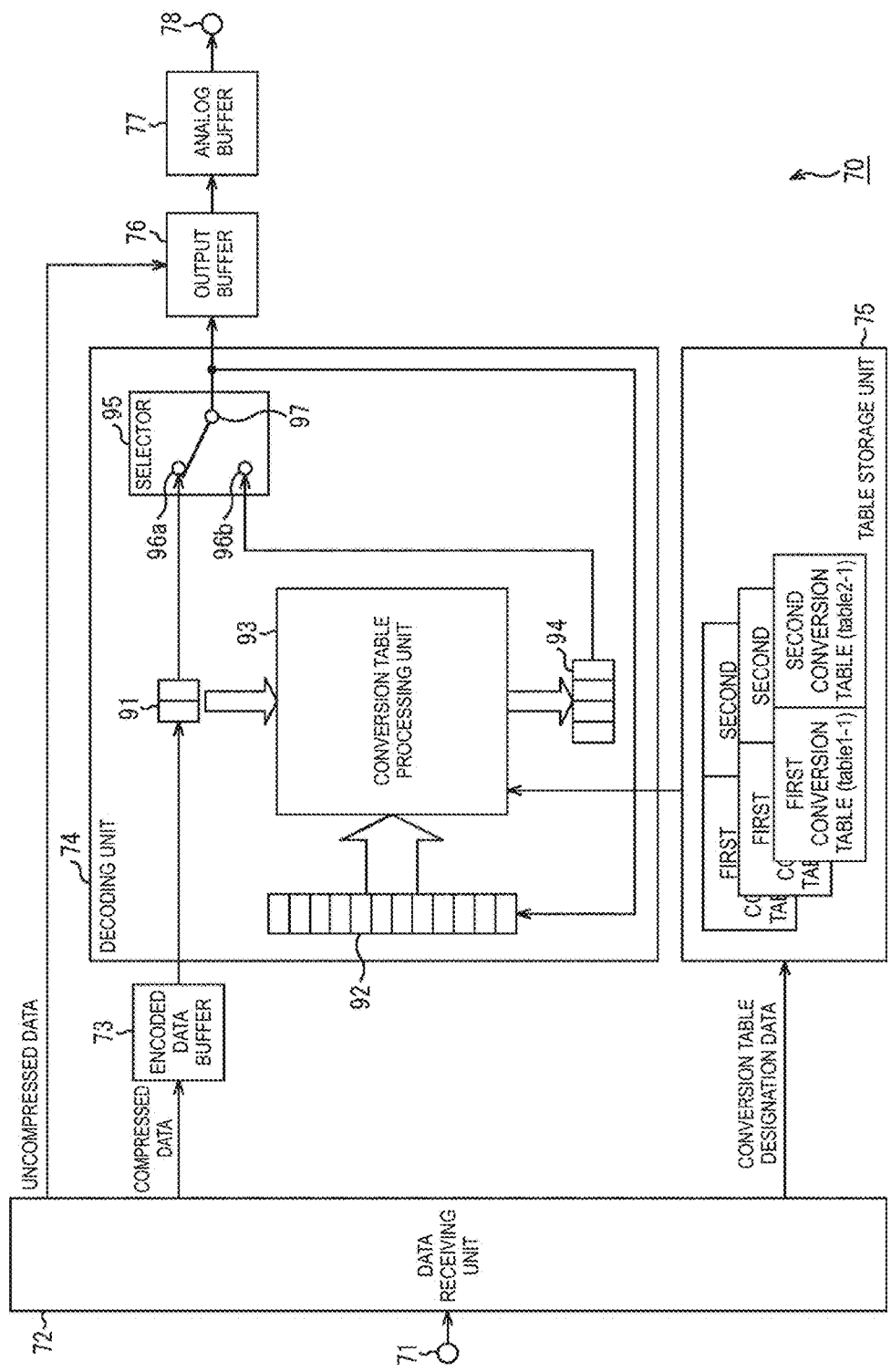
FIG. 18 is a block diagram illustrating an example of a configuration of a sixth embodiment of a decoding apparatus.

FIG. 18 illustrates an example of a configuration of a sixth embodiment of a decoding apparatus according to the present disclosure.

The decoding apparatus 70 of FIG. 18 is an apparatus for receiving an audio signal compressively encoded and transmitted by the compressive encoding apparatus 1 of FIG. 17 and decompressing (reversible decoding) the audio signal.

In the decoding apparatus 70 of the sixth embodiment, three types of 2-stage conversion tables table identical to those included in the controller 14 of the compressive encoding apparatus 1 of FIG. 17 are previously stored in the table storage unit 75. That is, the table storage unit 75 previously stores the first conversion table table1-1 and the second conversion table table2-1, the first conversion table table1-2 and the second conversion table table2-2, and the first conversion table 1-3 and the second conversion table table2-3.

The data receiving unit 72 supplies conversion table designation data included in received data to the table storage unit 75. The table storage unit 75 supplies, to the decoding unit 74, a first-stage conversion table table or a second-stage conversion table table indicated by the conversion table designation data supplied from the data receiving unit 72.

According to the aforementioned sixth embodiment, the compressive encoding apparatus 1 compressively encodes and transmits DSD data and the decoding apparatus 70 receives the compressively encoded and transmitted data, reversibly decodes the received data and outputs the decoded data. In the sixth embodiment, the first conversion table table1 and the second conversion table table2 used for compressive encoding are previously stored.

<7. Seventh Embodiment>
<Example of Configuration of Compressive Encoding Apparatus>

Figure 19:
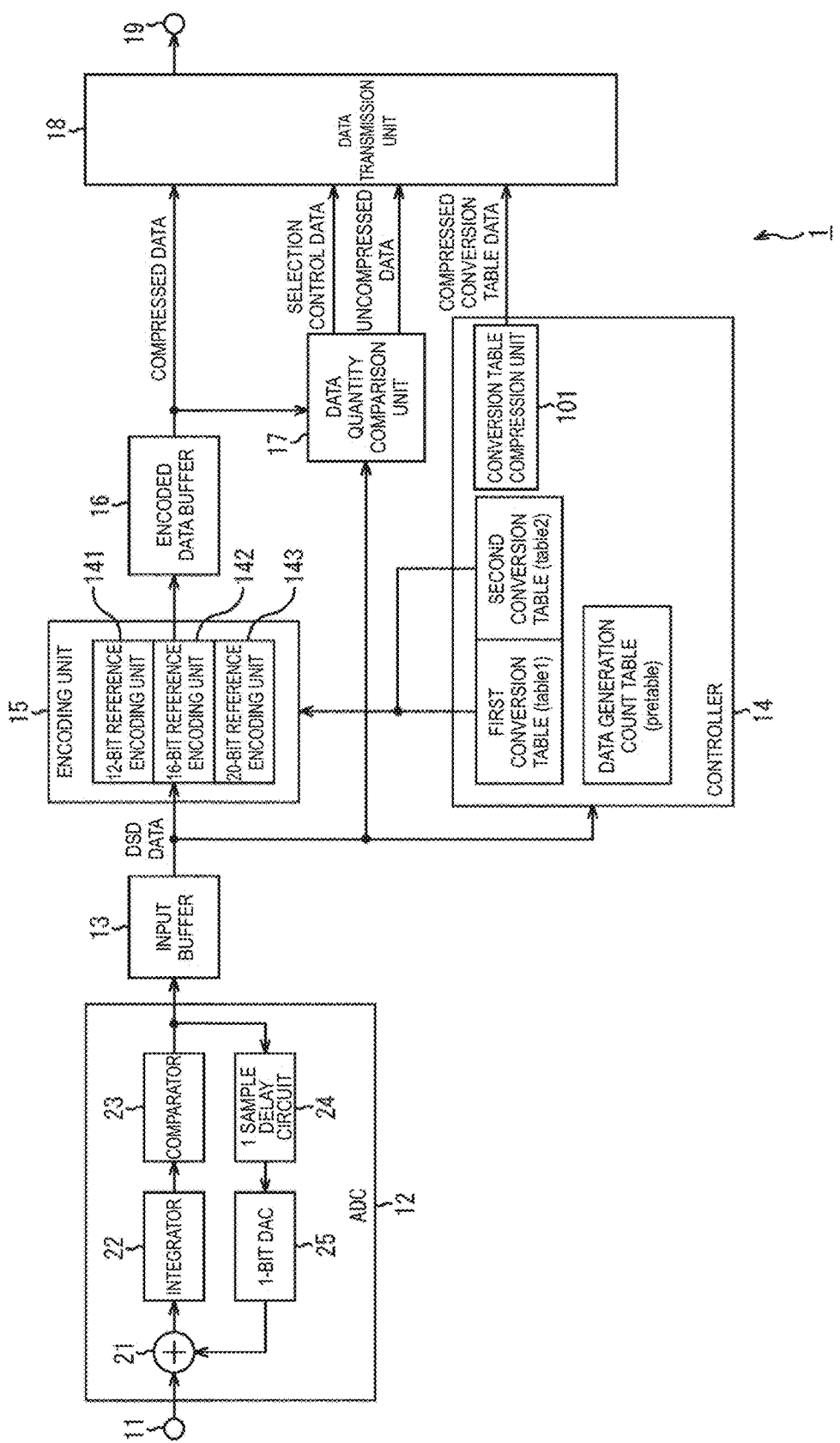
FIG. 19 is a block diagram illustrating an example of a configuration of a seventh embodiment of a compressive encoding apparatus.

FIG. 19 illustrates an example of a configuration of a seventh embodiment of the compressive encoding apparatus according to the present disclosure.

In the seventh embodiment illustrated in FIG. 19, the configuration of the controller 14 is the same as the fifth embodiment illustrated in FIG. 15. That is, the controller 14 creates the 2-stage conversion table table of the first conversion table table1 and the second conversion table table2 from DSD data of one frame. The conversion table compression unit 101 compresses data of the created first conversion table table1 and second conversion table table2 to create compressed conversion table data and supplies the compressed conversion table data to the data transmission unit 18.

Further, the compressive encoding apparatus 1 of the seventh embodiment differs from the fifth embodiment illustrated in FIG. 15 in that the encoding unit 15 includes a 12-bit reference encoding unit 141, a 16-bit reference encoding unit 142 and a 20-bit reference encoding unit 143.

The 12-bit reference encoding unit 141 regards past 12-bit data, D4[n−3], D4[n−2], D4[n−1], immediately before D4[n] as a mass of 12-bit data and encodes D4[n] as in compressive encoding performed by the encoding unit 15 of the aforementioned first to sixth embodiments.

The 16-bit reference encoding unit 142 regards past 16-bit data immediately before D4[n] as a mass of 16-bit data and encodes D4[n].

The 20-bit reference encoding unit 143 regards past 20-bit data immediately before D4[n] as a mass of 20-bit data and encodes D4[n].

Compressive encoding methods of the 16-bit reference encoding unit 142 and the 20-bit reference encoding unit 143 are the same as that of the 12-bit reference encoding unit 141 except that the number of bits of past data referred to when D4[n] is encoded is different.

There is a case in which a data compression rate can be further improved by increasing the number of reference bits of past data to 16 bits or 20 bits instead of 12 bits. However, when the number of reference bits of the past data increases, the quantity of data of a created conversion table table exponentially increases with respect to the number of reference bits of the past data. Specifically, although the number of patterns of past data is $2^{12}$=4,096 patterns when the number of reference bits of the pas data is 12, the number of patterns of the past data is $2^{16}$=65,536 patterns when the number of reference bits of the pas data is 16 and the number of patterns of the past data is $2^{20}$=1,048,576 patterns when the number of reference bits of the pas data is 20.

Accordingly, the controller 14 may decide which one of the 12-bit reference encoding unit 141, the 16-bit reference encoding unit 142 and the 20-bit reference encoding unit 143 will be used depending on a state of a communication line, such as traffic of a network interposed between the apparatus and a counterpart apparatus in addition to deciding by checking compression rates. Further, the decision may be performed depending on a request from the counterpart apparatus.

<Example of Configuration of Decoding Apparatus>

Figure 20:
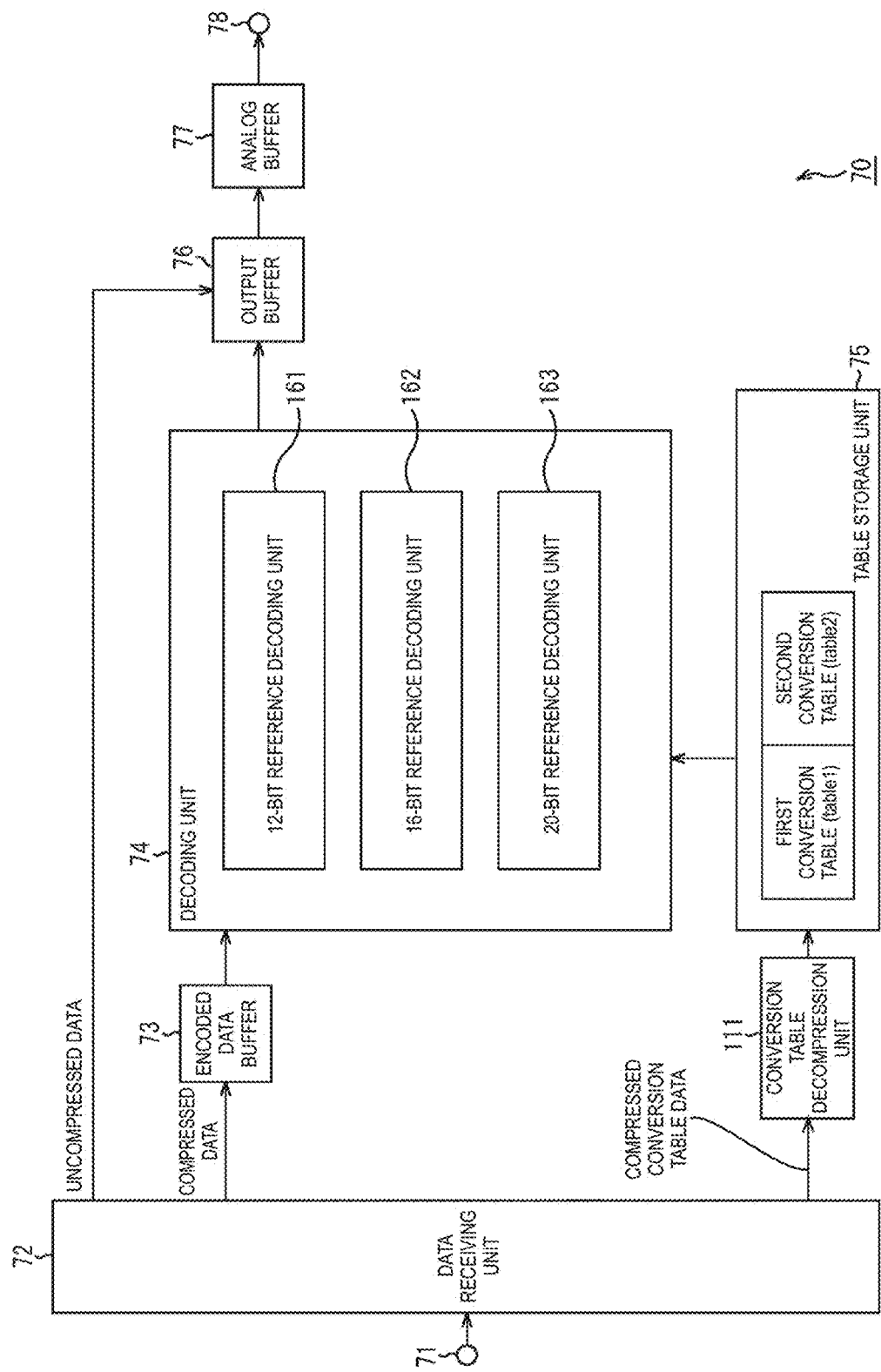
FIG. 20 is a block diagram illustrating an example of a configuration of a seventh embodiment of a decoding apparatus.

FIG. 20 illustrates an example of a configuration of a seventh embodiment of a decoding apparatus according to the present disclosure.

The decoding apparatus 70 of FIG. 20 is an apparatus for receiving an audio signal compressively encoded and transmitted by the compressive encoding apparatus 1 of FIG. 19 and decompressing (reversible decoding) the audio signal.

The decoding apparatus 70 of the seventh embodiment has the decoding unit 74 corresponding to the 12-bit reference encoding unit 141, the 16-bit reference encoding unit 142 and the 20-bit reference encoding unit 143 of the compressive encoding apparatus 1 of FIG. 19. That is, the decoding unit 74 includes a 12-bit reference decoding unit 161, a 16-bit reference decoding unit 162 and a 20-bit reference decoding unit 163.

In the compressive encoding apparatus 1 of FIG. 19, data of a 2-stage conversion table table (conversion table data) used for compressive encoding of DSD data is received through the data receiving unit 72, decompressed by the conversion table decompression unit 111 and stored in the table storage unit 75.

The table storage unit 75 supplies the 2-stage conversion table table supplied from the conversion table decompression unit 111 to the decoding unit 74.

In the decoding unit 74, one of the 12-bit reference decoding unit 161, the 16-bit reference decoding unit 162 and the 20-bit reference decoding unit 163 executes a decoding process on the basis of the 2-stage conversion table table supplied from the table storage unit 75. Since the number of reference bits of past data can be known according to a data quantity difference in the 2-stage conversion table, a decoding unit which is most suitable for the decoding process is uniquely decided.

According to the aforementioned seventh embodiment, the compressive encoding apparatus 1 compressively encodes and transmits DSD data and the decoding apparatus 70 receives the compressively encoded and transmitted data, reversibly decodes the received data and outputs the decoded data. In the seventh embodiment, one of 12 bits, 16 bits and 20 bits is selected as the number of reference bits of past data to perform compressive encoding, and the data of the 2-stage conversion table table used for compressive encoding is compressed and transmitted.

<8. Eighth Embodiment>
<Example of Configuration of Compressive Encoding Apparatus>

Figure 21:
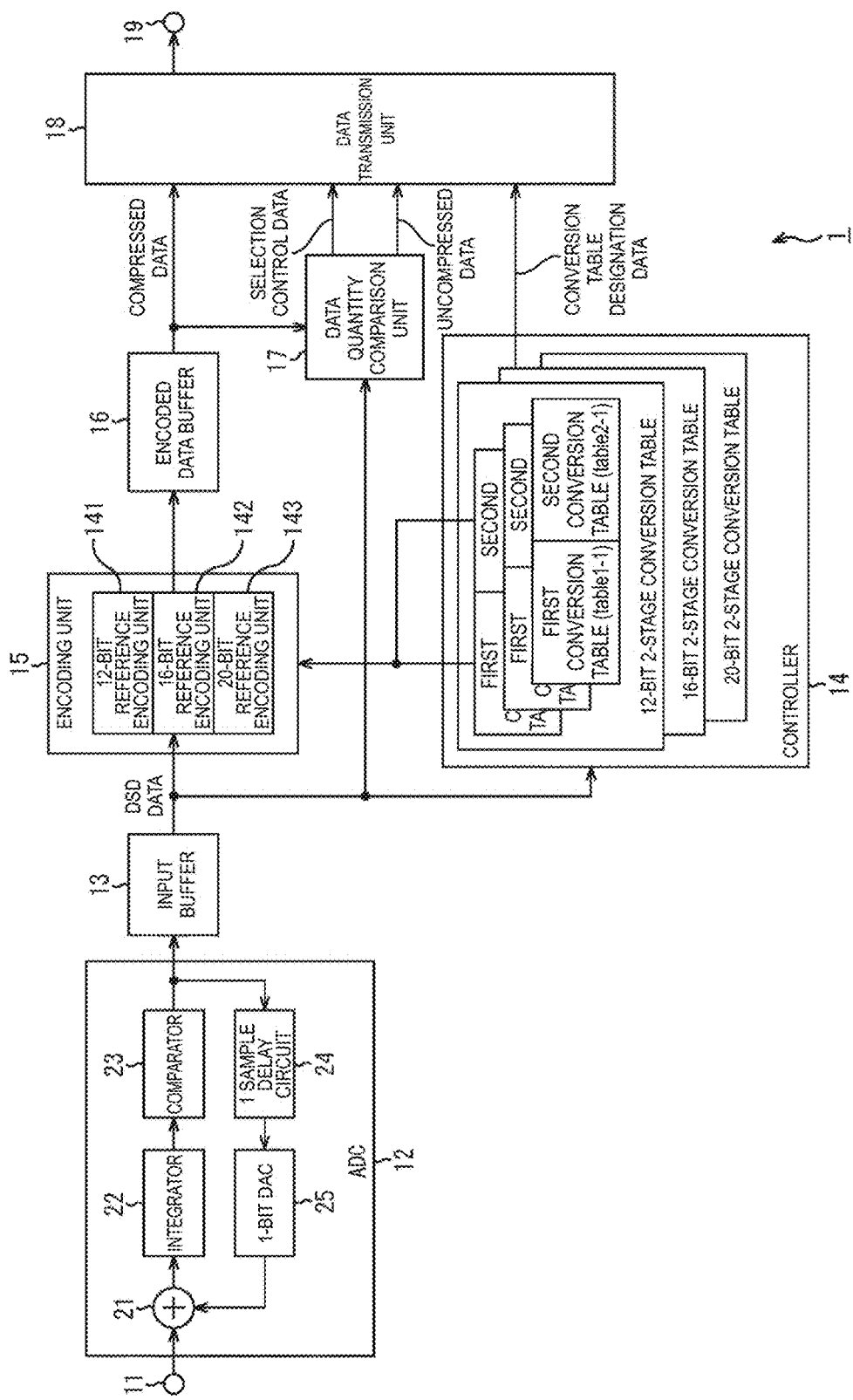
FIG. 21 is a block diagram illustrating an example of a configuration of an eighth embodiment of a compressive encoding apparatus.

FIG. 21 illustrates an example of a configuration of an eighth embodiment of the compressive encoding apparatus according to the present disclosure.

In the eighth embodiment illustrated in FIG. 21, the encoding unit 15 includes the 12-bit reference encoding unit 141, the 16-bit reference encoding unit 142 and the 20-bit reference encoding unit 143 as in the seventh embodiment illustrated in FIG. 19.

The controller 14 previously stores a 12-bit 2-stage conversion table table used for encoding performed by the 12-bit reference encoding unit 141, a 16-bit 2-stage conversion table table used for encoding performed by the 16-bit reference encoding unit 142, and a 20-bit 2-stage conversion table table used for encoding performed by the 20-bit reference encoding unit 143.

That is, while the compressive encoding apparatus 1 in the eighth embodiment has a configuration in which one of 12 bits, 16 bits and 20 bits may be selected as the number of reference bits of past data as in the seventh embodiment, 2-stage conversion tables table are not created using transmitted DSD data but are previously stored as in the sixth embodiment illustrated in FIG. 17.

The controller 14 selects a 2-stage conversion table table most suitable for DSD data supplied from the input buffer 13, that is, a 2-stage conversion table table having a highest compression rate, from a total of nine types (the number of reference bits of 3 types×3 types per reference bit number) of 2-stage conversion tables table previously stored therein. Meanwhile, in selection of a most suitable 2-stage conversion table table, compressive encoding may be performed using all the nine types of 2-stage conversion tables and compression rates may be compared, or a predetermined 2-stage conversion table table may be extracted from reference bits as a representative 2-stage conversion table and compression rates of reference bit numbers may be compared.

The controller 14 supplies conversion table designation data which designates the selected 2-stage conversion table table to the data transmission unit 18.

<Example of Configuration of Decoding Apparatus>

Figure 22:
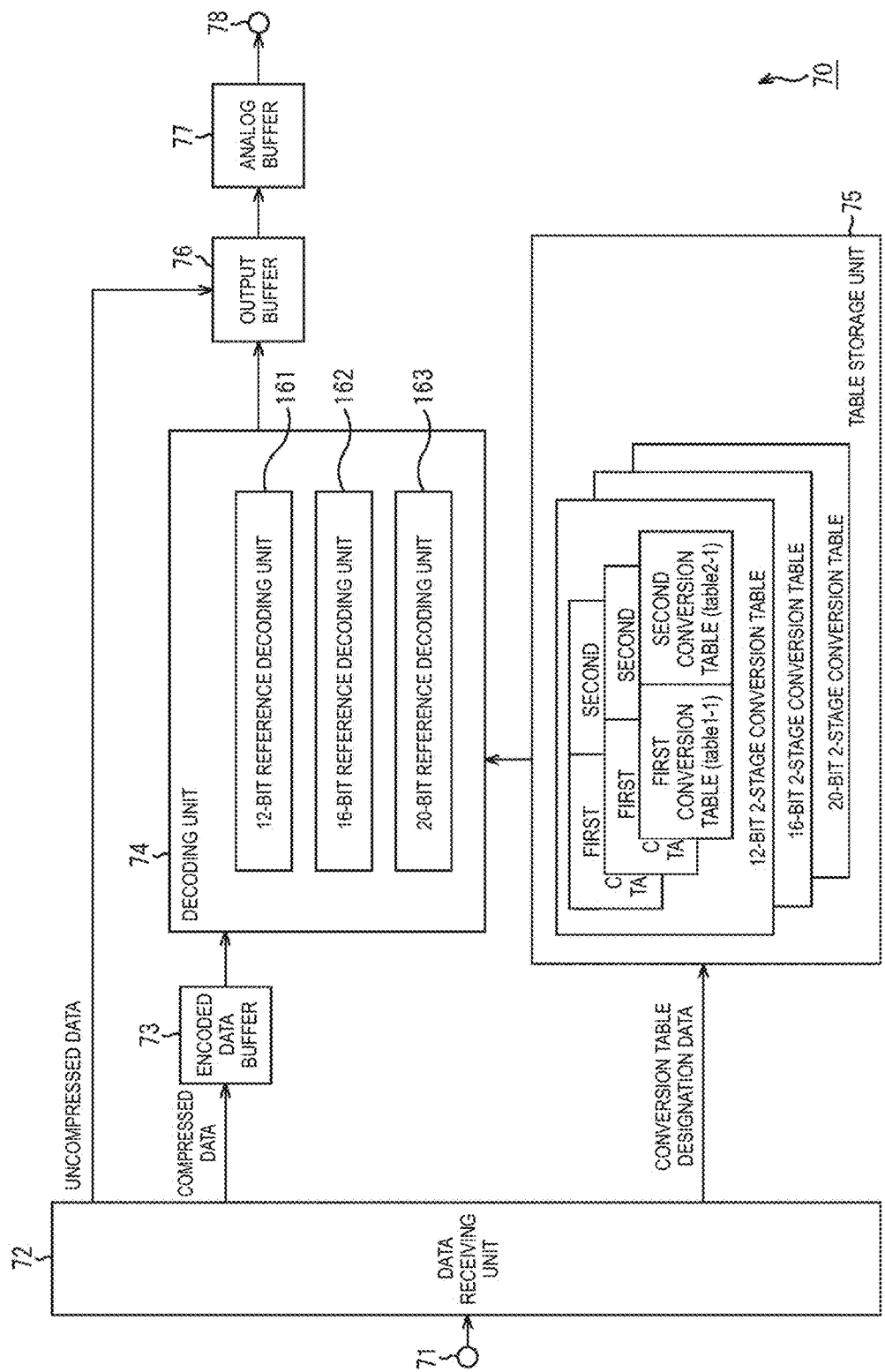
FIG. 22 is a block diagram illustrating an example of a configuration of an eighth embodiment of a decoding apparatus.

FIG. 22 illustrates an example of a configuration of an eighth embodiment of a decoding apparatus according to the present disclosure.

The decoding apparatus 70 of FIG. 22 is an apparatus for receiving an audio signal compressively encoded and transmitted by the compressive encoding apparatus 1 of FIG. 21 and decompressing (reversible decoding) the audio signal.

The decoding unit 74 includes the 12-bit reference decoding unit 161, the 16-bit reference decoding unit 162 and the 20-bit reference decoding unit 163 corresponding to the 12-bit reference encoding unit 141, the 16-bit reference encoding unit 142 and the 20-bit reference encoding unit 143 of the compressive encoding apparatus 1 of FIG. 21.

The table storage unit 75 previously stores three types of 2-stage conversion tables table identical to those included in the controller 14 of the compressive encoding apparatus 1 of FIG. 21, that is, the 12-bit 2-stage conversion table table, the 16-bit 2-stage conversion table table and the 20-bit 2-stage conversion table table.

The data receiving unit 72 supplies conversion table designation data included in received data to the table storage unit 75. The table storage unit 75 supplies, to the decoding unit 74, a second-stage conversion table table indicated by the conversion table designation data supplied from the data receiving unit 72.

The decoding unit 74 executes a decoding process using one of the 12-bit reference decoding unit 161, the 16-bit reference decoding unit 162 and the 20-bit reference decoding unit 163 on the basis of the 2-stage conversion tables table supplied from the table storage unit 75.

According to the aforementioned eighth embodiment, the compressive encoding apparatus 1 compressively encodes and transmits DSD data and the decoding apparatus 70 receives the compressively encoded and transmitted data, reversibly decodes the received data and outputs the decoded data. In the eighth embodiment, one of 12 bits, 16 bits and 20 bits is selected as the number of reference bits of past data to perform compressive encoding, and the data of the 2-stage conversion table table used for compressive encoding is stored in advance.

<9. Ninth Embodiment>
<Example of Configuration of Compressive Encoding Apparatus>

Figure 23:
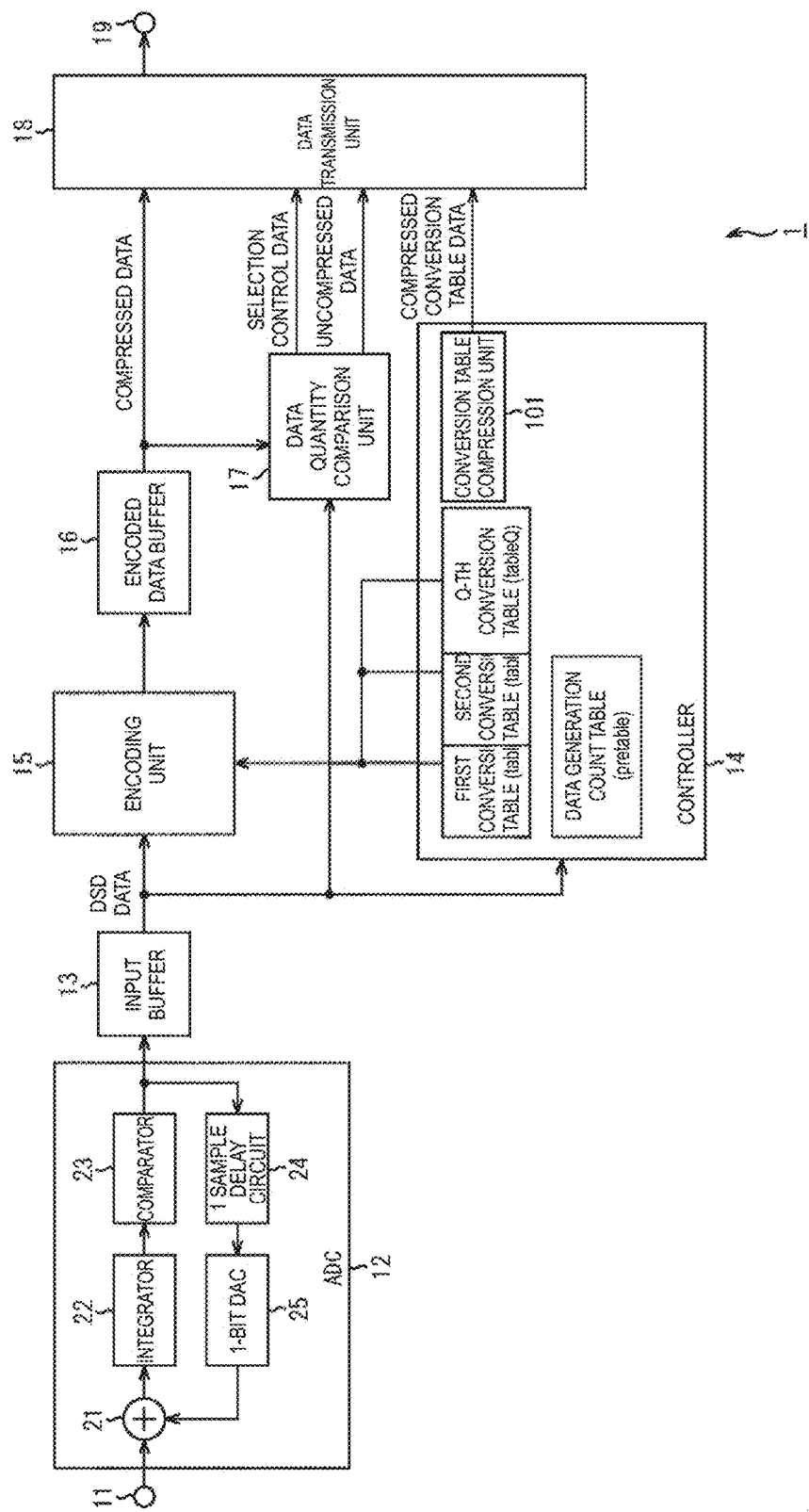
FIG. 23 is a block diagram illustrating an example of a configuration of a ninth embodiment of a compressive encoding apparatus.

FIG. 23 illustrates an example of a configuration of a ninth embodiment of the compressive encoding apparatus according to the present disclosure.

The compressive encoding apparatus 1 of the aforementioned first to third embodiments has the configuration in which compressing encoding is performed using a first-stage conversion table table1.

The compressive encoding apparatus 1 of the aforementioned fourth to eighth embodiments has the configuration in which compressive encoding is performed using a 2-stage conversion table table of the first conversion table table1 and the second conversion table table2.

The compressive encoding apparatus 1 of the ninth embodiment illustrated in FIG. 23 has an exemplary configuration in which compressive encoding is performed using a Q-stage conversion table table (Q being an integer greater than 2) which is a conversion table having 3 or more stages.

As illustrated in FIG. 23, the controller 14 creates the Q-stage conversion table table of a first to Q-th conversion tables table1 to tableQ and supplies the Q-stage conversion table table to the encoding unit 15. The encoding unit 15 compressively encodes DSD data supplied from the input buffer 13 in units of 4 bits using the Q-stage conversion table table supplied from the controller 14.

Here, the conversion unit is 4 bits and three conversion tables table are created (registered) in descending order of generation frequency from the first conversion table table1, and thus a maximum value of Q is 5 in the present embodiment.

Accordingly, a configuration of compressive encoding of creating first to third conversion tables table1 to table3, a configuration of compressive encoding of creating first to fourth conversion tables table1 to table4, and a configuration of compressive encoding of creating first to fifth conversion tables table1 to table5 are conceived as the ninth embodiment.

When the first to fifth conversion tables table1 to table5 are created, values corresponding to first to third generation frequencies are contained in the first conversion table table1, values corresponding to fourth to sixth generation frequencies are contained in the second conversion table table2, values corresponding to seventh to ninth generation frequencies are contained in the third conversion table table3, values corresponding to tenth to twelfth generation frequencies are contained in the fourth conversion table table4, and values corresponding to thirteenth to fifteenth generation frequencies are contained in the fifth conversion table table5.

<Example of Configuration of Decoding Apparatus>

Figure 24:
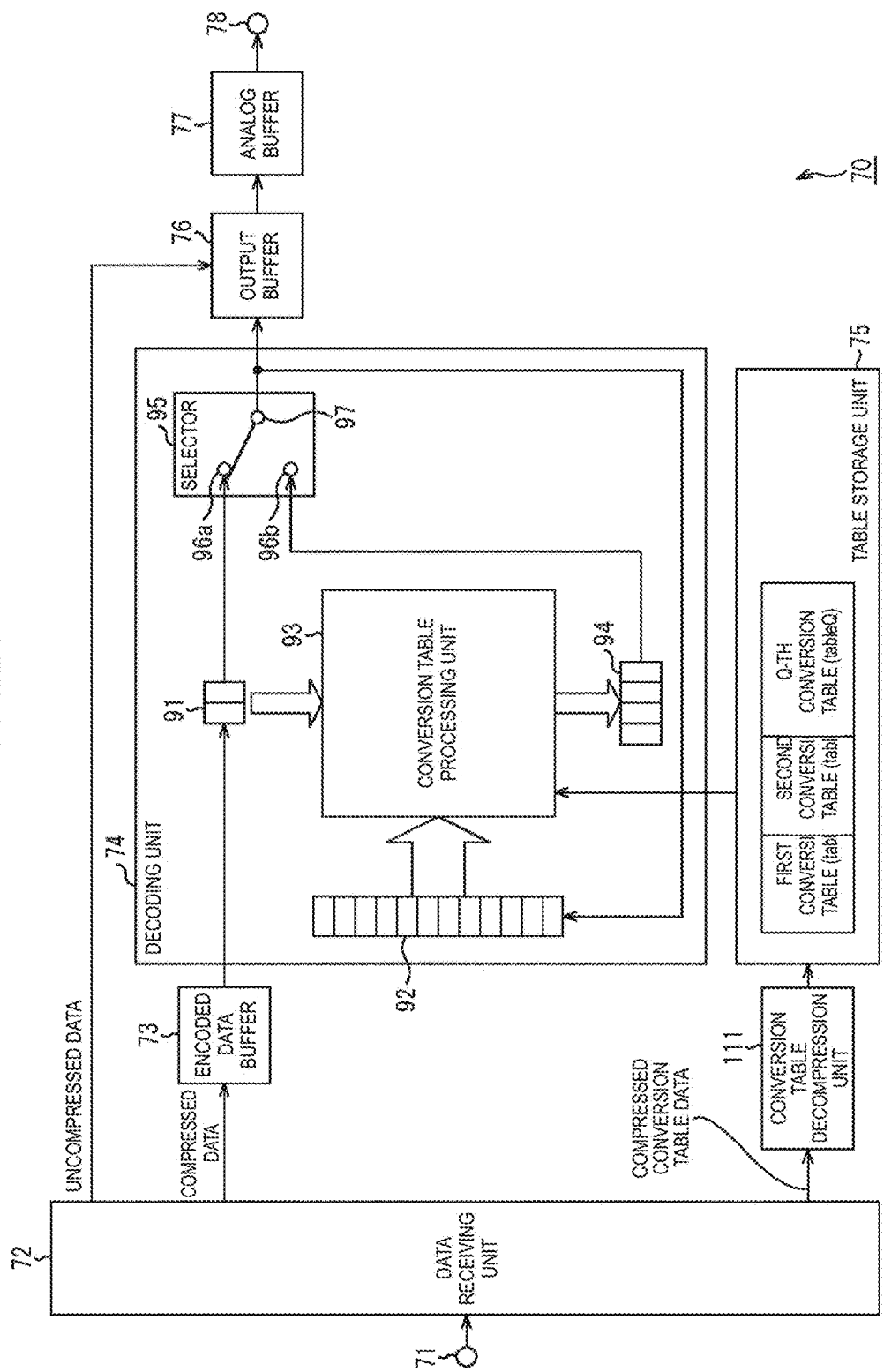
FIG. 24 is a block diagram illustrating an example of a configuration of a ninth embodiment of a decoding apparatus.

FIG. 24 illustrates an example of a configuration of a ninth embodiment of a decoding apparatus according to the present disclosure.

The decoding apparatus 70 of FIG. 24 is an apparatus for receiving an audio signal compressively encoded and transmitted by the compressive encoding apparatus 1 of FIG. 23 and decompressing (reversible decoding) the audio signal.

The table storage unit 75 supplies, to the decoding unit 74, the first conversion table table1 to the Q-th conversion table tableQ that have been received by the data receiving unit 72 and decompressed by the conversion table decompression unit 111. The decoding unit 74 performs decoding using the first conversion table table1 to the Q-th conversion table tableQ.

<Compressive Encoding Method Using 3-stage Conversion Table Table>

A compressive encoding method using first to third conversion tables table1 to table3 will be described.

In a way similar to the first embodiment, a case in which the encoding unit 15 encodes D4[n] from among DSD data . . . D4 [n−3], D4 [n−2], D4[n−1], D4[n], D4[n+1], D4[n+2], D4[n+3], . . . supplied from the input buffer 13 will be described.

The part of finding a value identical to D4[n] through the first conversion table table1 to the second conversion table table2 is the same as that in the compressive encoding method using a 2-stage conversion table table described in the fourth embodiment.

That is, the encoding unit 15 searches the first conversion table table1[4096][3] and the second conversion table table2[4096][3] for a value identical to D4[n], converts D4[n] into 2 bits of "01b," "10b" or "11b" when the first conversion table table1[4096][3] includes a value identical to D4[n] and converts D4[n] into 4 bits of "0001b," "0010b" or "0011b" when the second conversion table table2[4096][3] includes a value identical to D4[n].

Subsequently, when the three values of the address (column) indicated by D4[n−3], D4[n−2]D4[n−1] of the second conversion table table2[4096][3] do not include data identical to D4[n], the encoding unit 15 searches for three values, table3[D4 [n−3], D4 [n−2], D4[n−1]][0], table3[D4 [n−3], D4 [n−2], D4[n−1]][1] and table3[D4[n−3], D4[n−2], D4[n−1]][2], of the address (column) indicated by D4[n−3], D4[n−2]D4[n−1] of the third conversion table table3[4096][3].

When any of the three values, table3[D4[n−3], D4[n−2], D4[n−1]][0], table3[D4[n−3], D4[n−2], D4[n−1]][1], and table3[D4[n−3], D4[n−2], D4[n−1]][2], of the address (column) indicated by D4[n−3], D4[n−2], D4[n−1] of the third conversion table table3[4096][3] is identical to D4[n], the encoding unit 15 converts D4[n] into 6 bits of "000001b" if D4[n] is identical to table3[D4[n−3], D4[n−2], D4[n−1]][0], converts D4[n] into 6 bits of "000010b" if D4[n] is identical to table3[D4[n−3], D4[n−2], D4[n−1]][1] and converts D4[n] into 6 bits of "000011b" if D4[n] is identical to table3[D4 [n−3], D4 [n−2], D4 [n−1]][2].

On the other hand, when three values of an address (column) indicated by D4[n−3], D4[n−2], D4[n−1] of the third conversion table table3[4096][3] do not include a value identical to D4[n], the encoding unit 15 converts D4[n] to 10 bits by adding "000000b" before D4[n], such as "000000b+D4[n]."

<Decoding Method Using 3-stage Conversion Table Table>

Next, a decoding method using the first to third conversion tables table1 to table3 will be described.

A description will be given of case in which compressed data which has been compressively encoded and transmitted by the compressive encoding apparatus 1 is . . . E2[n−3], E2[n−2], E2[n−1], E2[n], E2[n+1], E2[n+2], E2[n+3], . . . and E2[n] is decoded.

When E2[n] is "01b," "10b" or "11b," the decoding unit 74 refers to the first conversion table table1[4096][3] and decodes E2[n] into data contained in "table1[D4 [n−3], D4 [n−2], D4 [n−1]][E2[n]−1]."

When E2[n] is "00b," this is not data loaded in the received first conversion table table1[4096][3], and thus the decoding unit 74 determines the value of E2[n+1].

When E2[n+1] is "01b," "10b" or "11b," the decoding unit 74 refers to the received second conversion table table2[4096][3] and decodes E2[n+1] into data contained in "table2[D4 [n−3], D4 [n−2], D4[n−1]][E2[n+1]−1]."

When E2[n+1] is also "00b," this is not data loaded in the received second conversion table table2[4096][3], and thus the decoding unit 74 determines the value of E2[n+2].

When E2[n+2] is "01b," "10b" or "11b," the decoding unit 74 refers to the received third conversion table table3[4096][3] and decodes E2[n+1] into data contained in "table3[D4 [n−3], D4 [n−2], D4[n−1]][E2[n+2]−1]."

When E2[n+2] is also "00b," this is data that is not loaded even in the received third conversion table table3[4096][3] and thus 4-bit data "E2[n+3]+E2[n+4]" following E2[n+2] is data to be decoded by the decoding unit 74.

<Compressive Encoding Method Using 4-stage Conversion Table Table>

Next, a compressive encoding method using first to fourth conversion tables table1 to table4 will be described.

The part of finding a value identical to D4[n] through the first conversion table table1 to the third conversion table table3 is the same as that in the aforementioned compressive encoding method using a 3-stage conversion table table, and thus description thereof is omitted.

Subsequently, when the three values of the address (column) indicated by D4[n−3], D4[n−2]D4[n−1] of the third conversion table table3[4096][3] do not include data identical to D4[n], the encoding unit 15 searches for three values, table4[D4 [n−3], D4 [n−2], D4[n−1]][0], table4[D4 [n−3], D4 [n−2], D4[n−1]][1] and table4[D4[n−3], D4[n−2], D4[n−1]][2], of the address (column) indicated by D4[n−3], D4[n−2]D4[n−1] of the fourth conversion table table4[4096][3].

When any of the three values, table4[D4[n−3], D4[n−2], D4[n−1]][0], table4[D4[n−3], D4[n−2], D4[n−1]][1], and table4[D4[n−3], D4[n−2], D4[n−1]][2], of the address (column) indicated by D4[n−3], D4[n−2], D4[n−1] of the fourth conversion table table4[4096][3] is identical to D4[n], the encoding unit 15 converts D4[n] into 8 bits of "00000001b" if D4[n] is identical to table4[D4[n−3], D4[n−2], D4[n−1]][0], converts D4[n] into 8 bits of "00000010b" if D4[n] is identical to table4[D4[n−3], D4[n−2], D4[n−1]][1] and converts D4[n] into 8 bits of "00000011b" if D4[n] is identical to table4[D4[n−3], D4[n−2], D4[n−1]][2].

On the other hand, when three values of an address (column) indicated by D4[n−3], D4[n−2], D4[n−1] of the fourth conversion table table4[4096][3] do not include a value identical to D4[n], the encoding unit 15 converts D4[n] to 12 bits by adding "00000000b" before D4[n], such as "00000000b+D4[n]."

<Decoding Method Using 4-stage Conversion Table Table>

Next, a decoding method using the first to fourth conversion tables table1 to table4 will be described.

In a case in which E2[n] is "00b," "01b," "10b" or "11b," a case in which E2[n+1] is "00b," "01b," "10b" or "11b" and a case in which E2[n+2] is "01b," "10b" or "11b," the decoding method is the same as the aforementioned decoding method using a 3-stage conversion table table and thus description thereof is omitted.

When E2[n+2] is also "00b," this is data that is not loaded even in the received third conversion table table3[4096][3], and thus the decoding unit 74 determines the value of E2[n+3].

When E2[n+3] is "01b," "10b" or "11b," the decoding unit 74 refers to the received fourth conversion table table4[4096][3] and decodes E2[n+1] into data contained in "table4[D4[n−3], D4[n−2], D4[n−1]][E2[n+3]−1]."

When E2[n+3] is also "00b," this is data that is not loaded even in the received fourth conversion table table4[4096][3] and thus 4-bit data "E2[n+4]+E2[n+5]" following E2[n+3] is data to be decoded by the decoding unit 74.

<Compressive Encoding Method Using 5-stage Conversion Table Table>

Next, a compressive encoding method using first to fifth conversion tables table1 to table5 will be described.

The part of finding a value identical to D4[n] through the first conversion table table1 to the fourth conversion table table4 is the same as that in the aforementioned compressive encoding method using a 4-stage conversion table table, and thus description thereof is omitted.

When the three values of the address (column) indicated by D4[n−3], D4[n−2]D4[n−1] of the fourth conversion table table4[4096][3] do not include data identical to D4[n], the encoding unit 15 searches for three values, table5[D4[n−3], D4[n−2], D4[n−1]][0], table5[D4[n−3], D4[n−2], D4[n−1]][1] and table5[D4[n−3], D4[n−2], D4[n−1]][2], of the address (column) indicated by D4[n−3], D4[n−2]D4[n−1] of the fifth conversion table table5[4096][3].

When any of the three values, table5[D4[n−3], D4[n−2], D4[n−1]][0], table5[D4[n−3], D4[n−2], D4[n−1]][1], and table5[D4[n−3], D4[n−2], D4[n−1]][2], of the address (column) indicated by D4[n−3], D4[n−2], D4[n−1] of the fifth conversion table table5[4096][3] is identical to D4[n], the encoding unit 15 converts D4[n] into 10 bits of "0000000001b" if D4[n] is identical to table5[D4[n−3], D4[n−2], D4[n−1]][0], converts D4[n] into 10 bits of "0000000010b" if D4[n] is identical to table5[D4[n−3], D4[n−2], D4[n−1]][1] and converts D4[n] into 10 bits of "0000000011b" if D4[n] is identical to table5[D4[n−3], D4[n−2], D4[n−1]][2].

On the other hand, when three values of an address (column) indicated by D4[n−3], D4[n−2], D4[n−1] of the fifth conversion table table5[4096][3] do not include a value identical to D4[n], the encoding unit 15 converts D4[n] to 14 bits by adding "0000000000b" before D4[n], such as "0000000000b+D4[n]."

<Decoding Method Using 5-stage Conversion Table Table>

Next, a decoding method using the first to fifth conversion tables table1 to table5 will be described.

In a case in which E2[n] is "00b," "01b," "10b" or "11b," a case in which E2[n+1] is "00b," "01b," "10b" or "11b," a case in which E2[n+2] is "00b," "01b," "10b" or "11b," and a case in which E2[n+3] is "01b," "10b" or "11b," the decoding method is the same as the aforementioned decoding method using a 4-stage conversion table table and thus description thereof is omitted.

When E2[n+3] is also "00b," this is data that is not loaded even in the received fourth conversion table table4[4096][3], and thus the decoding unit 74 determines the value of E2[n+3].

When E2[n+4] is "01b," "10b" or "11b," the decoding unit 74 refers to the received fifth conversion table table5[4096][3] and decodes E2[n+1] into data contained in "table5[D4[n−3], D4[n−2], D4[n−1]][E2[n+4]−1]."

When E2[n+4] is also "00b," this is data that is not loaded even in the received fifth conversion table table5[4096][3] and thus 4-bit data "E2[n+5]+E2[n+6]" following E2[n+4] is data to be decoded by the decoding unit 74.

As described above, when DSD data is compressively encoded in units of 4 bits on the basis of a conversion table table, compressive encoding is not limited to a 2-stage conversion table table and may use conversion tables table of 3 or more stages.

Furthermore, although the number of reference bits of past data is 12 bits in the aforementioned example, compressive encoding may be equally performed even when the number of past reference bits is 16 bits, 20 bits or the like as described in the eighth embodiment.

According to the aforementioned ninth embodiment, the compressive encoding apparatus 1 compressively encodes and transmits DSD data and the decoding apparatus 70 receives the compressively encoded and transmitted data, reversibly decodes the received data and outputs the decoded data. In the ninth embodiment, data of the Q-th conversion table table used for compressive encoding are compressed and transmitted as transmission data.

<Example of Processing Result>

Figure 25:
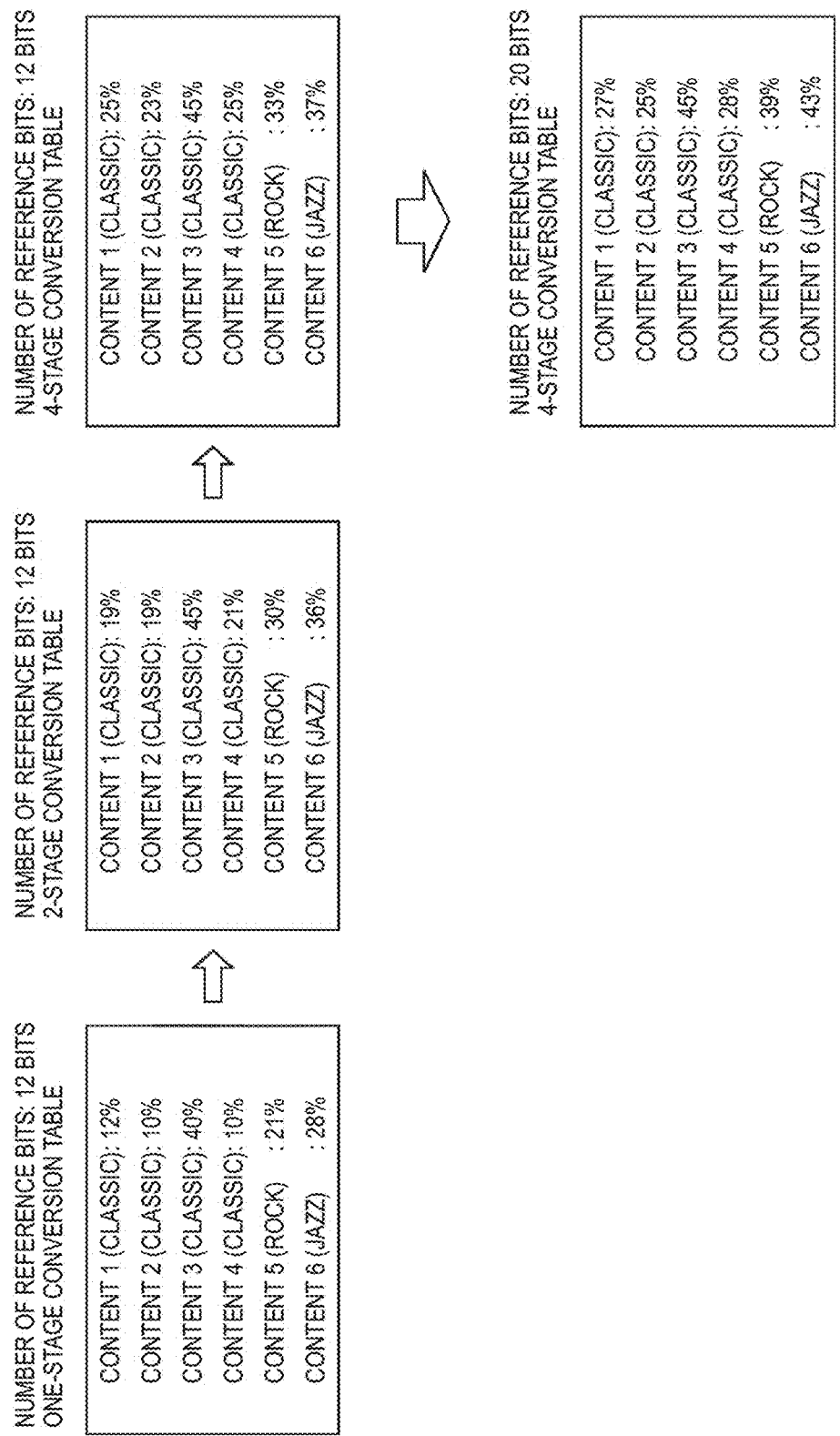
FIG. 25 is an explanatory diagram of an example of processing results.

FIG. 25 illustrates compression rates when the number of stages of conversion tables table and the number of reference bits of past data are changed and a plurality of pieces of content are compressively encoded.

Here, a compression rate refers to a value obtained by dividing a data quantity reduced according to compression by a data quantity before encoding (compression rate=data quantity reduced according to compression/data quantity before encoding).

In the compressive encoding method of the present disclosure, a compression rate becomes a maximum value when DSD data in units of 4 bits is necessarily present in a conversion table table and converted into 2 bits, and the value (maximum value) is 50% at this time.

Referring to results of compression rates of a plurality of pieces of content illustrated in FIG. 25, compression rates are improved twice approximately, for example, 12%→19% (content 1) and 10%→19% (content 2), by increasing the number of stages of conversion tables table from 1 to 2, except content 3 having a compression rate of 40% approximate to a theoretical maximum value, when a first-stage conversion table table is used.

Further, according to the results of FIG. 25, compression rates increase as the number of stages of conversion tables table increases from 1 to 2, (3) and 4. When the number of reference bits of past data increases from 12 bits to 20 bits, compression rates also increase slightly.

When compressive encoding is performed using the method of Patent Literature 1 disclosed as a prior art document and compression rates are calculated, 0.5% (sample 1), 2.4% (sample 2), 0.4% (sample 3) and the like are obtained. When the compression and decompression methods of the present disclosure are compared with the method of Patent Literature 1 disclosed as a prior art document, it is possible to further enhance a correlation with past data and to further increase compression rates by extending the number of reference bits of past data to 12 bits, 16 bits or 20 bits. That is, it is possible to provide a lossless compression technology having a higher compression rate.

<10. Tenth Embodiment>
<Example of Configuration of Compressive Encoding Apparatus>

Figure 26:
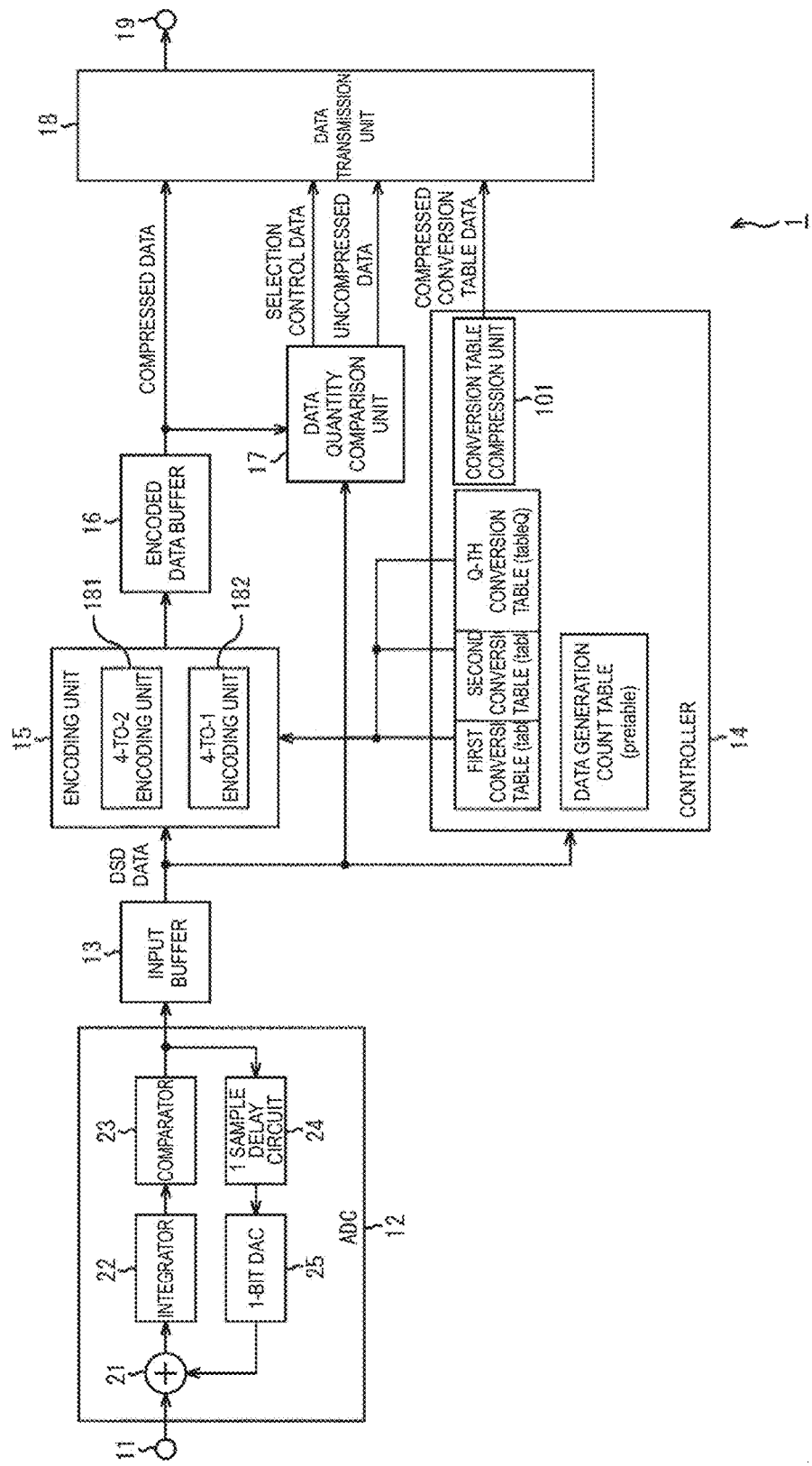
FIG. 26 is a block diagram illustrating an example of a configuration of a tenth embodiment of a compressive encoding apparatus.

FIG. 26 illustrates an example of a configuration of a tenth embodiment of the compressive encoding apparatus according to the present disclosure.

In the tenth embodiment, the controller 14 creates the first to Q-th conversion tables table1 to tableQ on the basis of the previously created data generation count table pretable and supplies the first to Q-th conversion tables table to the encoding unit 15, as in the ninth embodiment illustrated in FIG. 23.

The encoding unit 15 includes a 4-to-2 encoding unit 181 and a 4-to-1 encoding unit 182.

The 4-to-2 encoding unit performs compressive encoding of converting DSD data in units of 4 bits into 2 bits with reference to the Q-stage conversion table as in the ninth embodiment. In this case, while a maximum value of Q is 5, any of 1 to 5 may be employed as the number of stages.

Whereas, the 4-to-1 encoding unit 182 performs compressive encoding of converting DSD data in units of 4 bits into 1 bit with reference to the Q-stage conversion table. In this case, while a maximum value of Q is 16, any of 1 to 16 may be employed as the number of stages.

The controller 14 may decide which one of the 4-to-2 encoding unit 181 and the 4-to-1 encoding unit 182 will be used for compressive encoding and create the first to Q-th conversion tables table1 to tableQ on the basis of the previously created data generation count table pretable.

For example, the controller 14 may decide which one of the 4-to-2 encoding unit 181 and the 4-to-1 encoding unit 182 will be used for compressive encoding on the basis of compression rates when initial DSD data of one frame is compressively encoded using both the 4-to-2 encoding unit 181 and the 4-to-1 encoding unit 182 or on the basis of user setting through a setting screen and the like or designation from a counterpart apparatus.

Further, the number of stages of conversion tables table may also be appropriately decided in the same manner.

<Example of Configuration of Decoding Apparatus>

Figure 27:
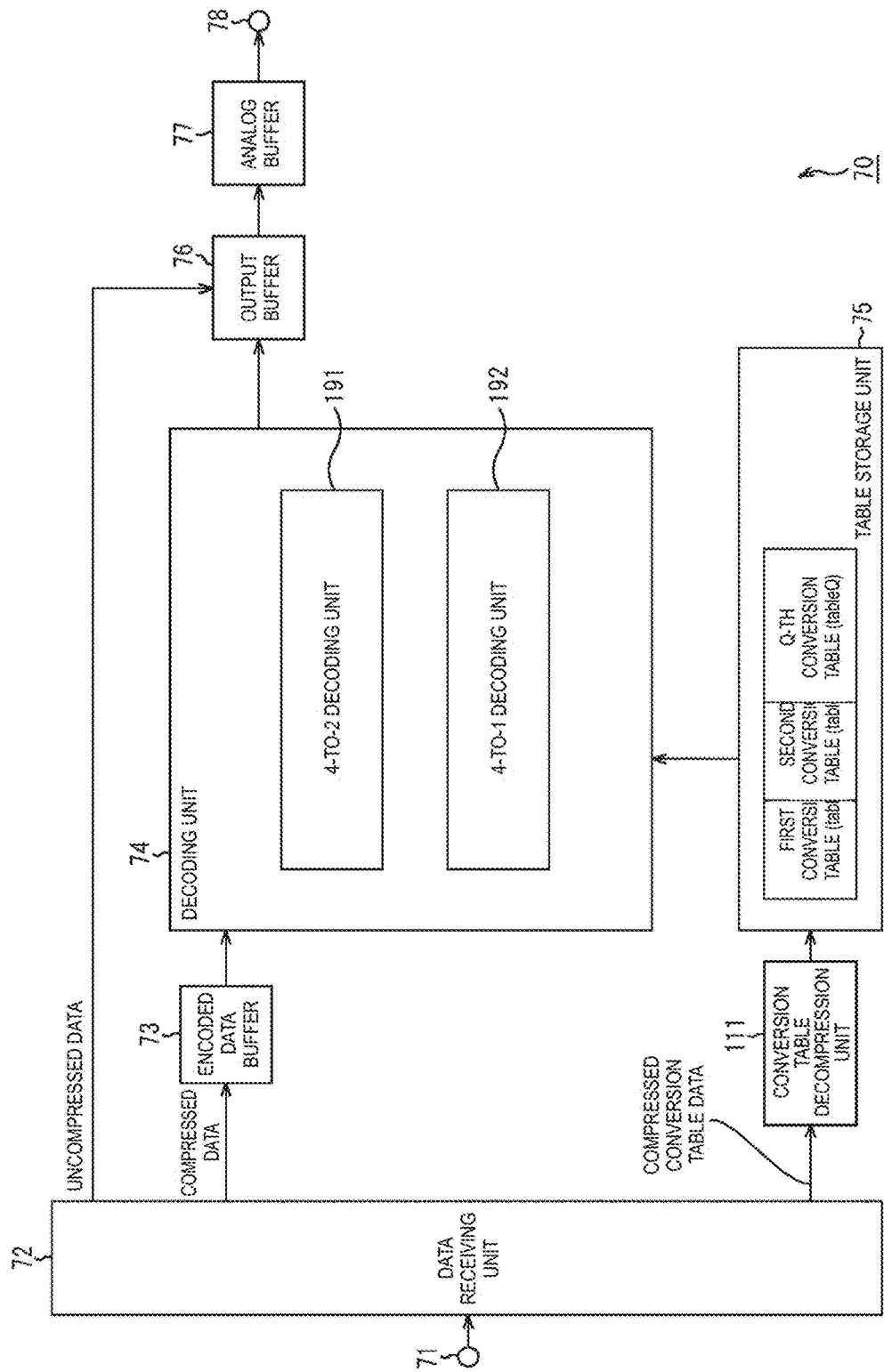
FIG. 27 is a block diagram illustrating an example of a configuration of a tenth embodiment of a decoding apparatus.

FIG. 27 illustrates an example of a configuration of a tenth embodiment of a decoding apparatus according to the present disclosure.

The decoding apparatus 70 of FIG. 27 is an apparatus for receiving an audio signal compressively encoded and transmitted by the compressive encoding apparatus 1 of FIG. 26 and decompressing (reversible decoding) the audio signal.

The table storage unit 75 supplies, to the decoding unit 74, the first conversion table table1 to the Q-th conversion tableQ that have been received by the data receiving unit 72 and decompressed by the conversion table decompression unit 111.

The decoding unit 74 includes a 4-to-2 decoding unit 191 and a 4-to-1 decoding unit 192 corresponding to the 4-to-2 encoding unit 181 and a 4-to-1 encoding unit 182 of the compressive encoding apparatus 1 of FIG. 26.

The decoding unit 74 executes a decoding process using one of the 4-to-2 decoding unit 191 and the 4-to-1 decoding unit 192 on the basis of a Q-stage conversion table table supplied from the table storage unit 75.

<Method of Creating Conversion Table>

Next, a method of creating the conversion table table1 by the controller 14 when compressive encoding is performed using the 4-to-1 encoding unit 182 will be described.

Meanwhile, a method of creating the data generation count table pretable is the same as the method described with reference to FIG. 2 and thus description thereof is omitted.

The controller 14 creates the first conversion table table1 [4096][1]=table1[4096] having 4,096 columns and 1 column on the basis of the previously created data generation count table pretable. Here, elements [0] to [4095] of the first conversion table table1[4096] correspond to values that may be past three pieces of D4 data, and a value having a highest generation frequency (first value) from among 16 values of the following D4 data is contained in the values of the past three pieces of D4 data.

FIG. 28 illustrates an example of the first conversion table table1[4096] when compressive encoding is performed using the 4-to-1 encoding unit 182.

As described with reference to FIG. 2, a value having a highest generation frequency (first value) is "5" which has been generated 31 times in pretable[117][0] to [117][15] which is the $118^{th}$ column of the data generation count table pretable, and thus {05} is contained in the $118^{th}$ element of the first conversion table table1[4096].

FIG. 29 illustrates an example of the second conversion table table2[4096] when compressive encoding is performed using the 4-to-1 encoding unit 182.

As described with reference to FIG. 2, a value having a second highest generation frequency is "4" which has been generated 20 times in pretable[117][0] to [117][15] which is the $118^{th}$ column of the data generation count table pretable, and thus {04} is contained in the $118^{th}$ element of the second conversion table table2[4096].

In the same manner, up to the sixteenth conversion table table16[4096] may be created by sequentially selecting values from a value having a higher generation frequency.

<Compressive Encoding Method Using 4-to-1 Encoding Unit 182>

Next, a compressive encoding method using the 4-to-1 encoding unit 182 and a decoding method using the 4-to-1 decoding unit 192 will be described.

<Compressive Encoding Using Only First Conversion Table Table1>

First, a compressive encoding method using only the first conversion table table1 will be described.

In a way similar to the above description, a case in which the encoding unit 15 encodes D4[n] from among DSD data . . . D4[n−3], D4[n−2], D4[n−1], D4[n], D4[n+1], D4[n+2], D4[n+3], . . . supplied from the input buffer 13 will be described.

When D4[n] is encoded, the encoding unit 15 regards D4[n−3], D4[n−2], D4[n−1], which is past 12-bit data immediately before D4[n], as a mass of 12-bit data and determines whether a value contained in address values indicated by D4[n−3], D4[n−2], D4[n−1] of the first conversion table table1[4096], that is, table1[D4[n−3], D4[n−2], D4[n−1]] is identical to D4[n].

When it is determined that a value contained in table1[D4[n−3], D4[n−2], D4[n−1]] is identical to D4[n], the encoding unit 15 converts D4[n] into 1 bit of "1b."

On the other hand, when it is determined that no value contained in table1[D4[n−3], D4[n−2], D4[n−1]] is identical to D4[n], the encoding unit 15 converts D4[b] into 5 bits by adding "0b" before D4[n] such as "0b+D4[n]." Here, b in "0b+D4[n]" represents binary notation.

<Decoding Using Only First Conversion Table Table1>

Next, a decoding method using only the first conversion table table1 will be described.

A description will be given of a case in which compressed data which has been compressively encoded by the 4-to-1 encoding unit 182 and transmitted therefrom is represented in units of 1 bit as follows and E1[n] is decoded.

. . . E1[n−3], E1[n−2], E1[n−1], E1[n], E1[n+1], E1[n+2], E1[n+3], . . . .

The decoding unit 74 first determines the value of E1[n].

When E1[n] is "0b," this is not data loaded in the received first conversion table table1[4096], and thus 4-bit data "E1[n+1]+E1[n+2]+E1[n+3]+E1[n+4]" following E1[n] is data to be decoded.

On the other hand, when E1[n] is "1b," this is data loaded in the first conversion table table1[4096], and thus data to be decoded is searched with reference to the first conversion table table1[4096] using 12-bit D4 data D4[n−3], D4[n−2], D4[n−1] which has been decoded immediately before E1[n].

<Compressive Encoding Using First Conversion Table Table1 and Second Conversion Table Table2>

Next, a compressive encoding method using the first conversion table table1 and the second conversion table table2 will be described.

When D4[n] is encoded, the encoding unit 15 regards D4[n−3], D4[n−2], D4[n−1], which is past 12-bit data immediately before D4[n], as a mass of 12-bit data and determines whether a value contained in address values indicated by D4[n−3], D4[n−2], D4[n−1] of the first conversion table table1[4096], that is, table1[D4[n−3], D4[n−2], D4[n−1]] is identical to D4[n].

When it is determined that a value contained in table1[D4[n−3], D4[n−2], D4[n−1]] is identical to D4[n], the encoding unit 15 converts D4[n] into 1 bit of "1b."

On the other hand, when it is determined that no value contained in table1[D4[n−3], D4[n−2], D4[n−1]] is identical to D4[n], the encoding unit 15 determines whether a value contained in address values indicated by D4[n−3], D4[n−2], D4[n−1] of the second conversion table table2[4096], that is, table2[D4[n−3], D4[n−2], D4[n−1]], is identical to D4[n].

When it is determined that a value contained in table2[D4[n−3], D4[n−2], D4[n−1]] is identical to D4[n], the encoding unit 15 converts D4[n] into 2 bits of "01b."

On the other hand, when it is determined that no value contained in table2[D4[n−3], D4[n−2], D4[n−1]] is identical to D4[n], the encoding unit 15 converts D4[b] into 6 bits by adding "0b" before D4[n] such as "00b+D4[n]." Here, b in "00b+D4[n]" represents binary notation.

<Decoding Using First Conversion Table Table1 and Second Conversion Table Table2>

Next, a decoding method using the first conversion table table1 and the second conversion table table2 will be described.

First of all, the decoding unit 74 determines the value of E1[n].

When E1 [n] is "0b," this is not data loaded in the received first conversion table table1[4096][3], and thus the decoding unit 74 determines the value of E1[n+1].

When E1[n+1] is also "0b," this is not data loaded in the received second conversion table table2[4096][3], and thus 4-bit data "E1[n+2]+E1[n+3]+E1[n+4]+E1[n+5]" following E1[n+1] is data to be decoded.

On the other hand, when E1[n] is "1b," this is data loaded in the received first conversion table table1[4096] and thus data to be decoded is searched for with reference to the first conversion table table1[4096] using 12-bit D4 data D4[n−3], D4[n−2], D4[n−1] which has been decoded immediately before E2[n]. The data to be decoded is data contained in "table1[D4[n−3], D4[n−2], D4[n−1]]."

On the other hand, when E1[n+1] is "1b," this is data loaded in the received second conversion table table2[4096] and thus data to be decoded is searched for with reference to the second conversion table table2[4096] using 12-bit D4 data D4[n−3], D4[n−2], D4[n−1] which has been decoded immediately before E2[n]. The data to be decoded is data contained in "table2[D4[n−3], D4[n−2], D4[n−1]]."

This similarly applies to a compressive encoding method and a decoding method using the first to third conversion tables table1 to table3 to a compressive encoding method and a decoding method using the first to fifteenth conversion tables table1 to table15, and thus description thereof is omitted.

<Compressive Encoding Using 16-stage Conversion Table Table>

Finally, a compressive encoding method using the first to sixteenth conversion tables table1 to table16 will be described.

The part of searching the first to fifteenth conversion tables table1 to table15 for a value identical to D4[n] is the same as the above description and thus description thereof is omitted.

When it is determined that no value contained in table15[D4[n−3], D4[n−2], D4[n−1]] is identical to D4[n], D4[n] is identical to a value contained in address values indicated by D4[n−3], D4[n−2], D4[n−1] of the sixteenth conversion table table16[4096], that is, table16[D4[n−3], D4[n−2], D4[n−1]], and thus the encoding unit 15 converts D4[n] into 16 bits of "0000000000000001b."

<Decoding Using 16-stage Conversion Table>

Next, a decoding method using the first to sixteenth conversion tables table1 to table16 will be described.

The part of determining whether E1[n] to E1[n+15] in the first to fifteenth conversion tables table1 to table 15 are "0b" or "1b" is the same as the above description and thus description thereof is omitted.

When all of E1[n] to E1[n+15] are "0b," E1[n] to E1[n+15] are data that are not loaded in any of the received first to fifteenth conversion tables table1[4096] to table15[4096] and thus they are data loaded in the sixteenth conversion table table16[4096]. Accordingly, data to be decoded is searched with reference to the sixteenth conversion table table16[4096] using 12-bit D4 data D4[n−3], D4[n−2], D4[n−1] decoded immediately before E1[n] to E1[n+15]. The data to be decoded is data contained in "table16[D4[n−3], D4[n−2], D4[n−1]]."

According to the aforementioned tenth embodiment, the compressive encoding apparatus 1 compressively encodes and transmits DSD data and the decoding apparatus 70 receives the transmission data compressively encoded and transmitted, reversibly decodes the received data and outputs the decoded data. In the tenth embodiment, it is possible to select compressive encoding of converting 4-bit DSD data into 2 bits or compressive encoding of converting the 4-bit DSD data into 1 bit. Data of the Q-stage conversion table table used for compressive encoding is compressed and transmitted as transmission data.

<11. 11th Embodiment>
<Example of Configuration of Compressive Encoding Apparatus>

Figure 30:
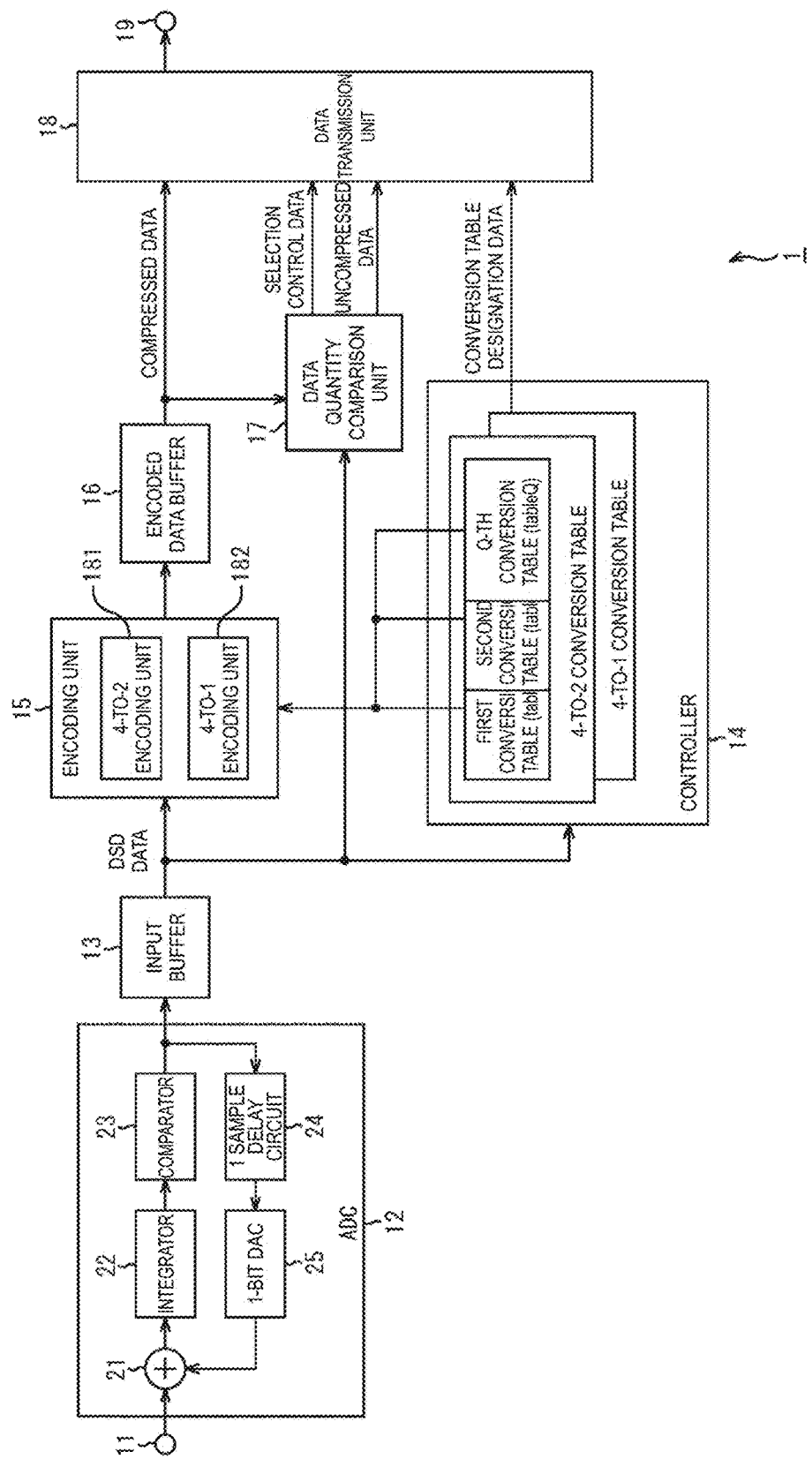
FIG. 30 is a block diagram illustrating an example of a configuration of an 11th embodiment of a compressive encoding apparatus.

FIG. 30 illustrates an example of a configuration of an 11th embodiment of the compressive encoding apparatus according to the present disclosure.

In the eleventh embodiment illustrated in FIG. 30, the encoding unit 15 includes the 4-to-2 encoding unit 181 and the 4-to-1 encoding unit 182 as in the tenth embodiment illustrated in FIG. 26.

The controller 14 previously stores a 4-to-2 conversion table table used for encoding performed by the 4-to-2 encoding unit 181 and a 4-to-1 conversion table table used for encoding performed by the 4-to-1 encoding unit 182.

That is, while the compressive encoding apparatus 1 in the eleventh embodiment has a configuration in which any of compressive encoding of converting 4-bit DSD data into 2 bits and compressive encoding of converting the 4-bit DSD data into 1 bit may be selected with reference to the Q-stage conversion table as in the tenth embodiment, the Q-stage conversion table table is not created using the transmitted DSD data but is previously stored as in the sixth embodiment illustrated in FIG. 17.

The controller 14 decides which one of the 4-to-2 encoding unit 181 and the 4-to-1 encoding unit 182 will be used for compressive encoding and supplies the 4-to-2 conversion table table or the 4-to-1 conversion table table corresponding to the decision result to the encoding unit 15.

In addition, the controller 14 supplies conversion table designation data which indicates the selected conversion table table to the data transmission unit 18.

Meanwhile, only one type of conversion table is stored as the 4-to-2 conversion table table and the 4-to-1 conversion table table in the example of FIG. 30, a plurality of types of conversion tables may be stored for the 4-to-2 conversion table table and the 4-to-1 conversion table table as in the eighth embodiment described with reference to FIG. 21.

<Example of Configuration of Decoding Apparatus>

Figure 31:
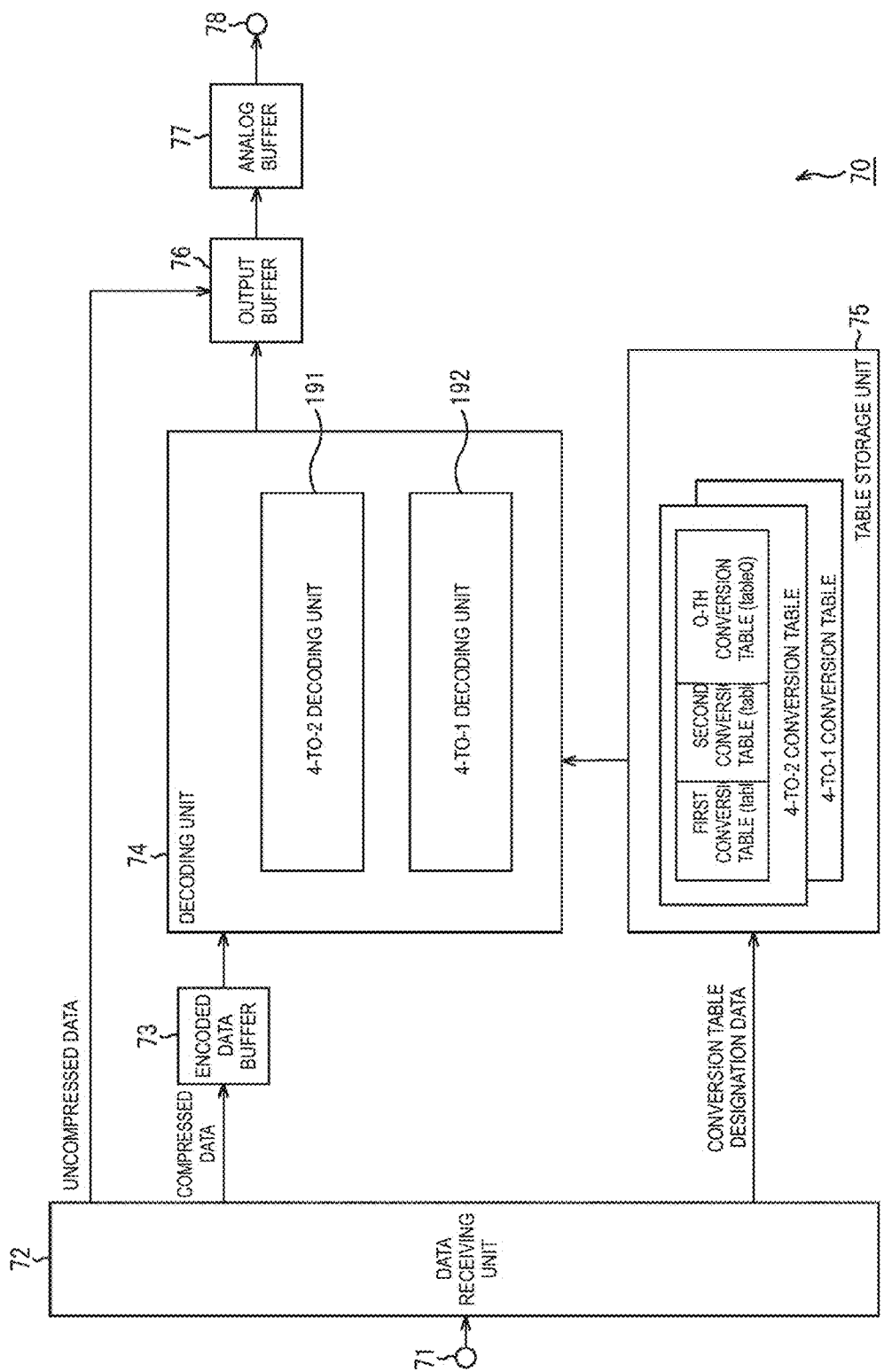
FIG. 31 is a block diagram illustrating an example of a configuration of an 11th embodiment of a decoding apparatus.

FIG. 31 illustrates an example of a configuration of an 11th embodiment of a decoding apparatus according to the present disclosure.

The decoding apparatus 70 of FIG. 31 is an apparatus for receiving an audio signal compressively encoded and transmitted by the compressive encoding apparatus 1 of FIG. 30 and decompressing (reversible decoding) the audio signal.

The decoding unit 74 includes the 4-to-2 decoding unit 191 and the 4-to-1 decoding unit 192 corresponding to the 4-to-2 encoding unit 181 and the 4-to-1 encoding unit 182 of the compressive encoding apparatus 1 of FIG. 30.

The table storage unit 75 previously stores a 4-to-2 conversion table table and a 4-to-1 conversion table table identical to those included in the controller 14 of the compressive encoding apparatus 0 of FIG. 30.

The data receiving unit 72 supplies conversion table designation data included in received data to the table storage unit 75. The table storage unit 75 supplies one of the 4-to-2 conversion table table and the 4-to-1 conversion table table, which is indicated by the conversion table designation data supplied from the data receiving unit 72, to the decoding unit 74.

The decoding unit 74 executes a decoding process using the 4-to-2 decoding unit 191 or the 4-to-1 decoding unit 192 on the basis of the 4-to-2 conversion table table or the 4-to-1 conversion table table supplied from the table storage unit 75.

According to the aforementioned eleventh embodiment, the compressive encoding apparatus 1 compressively encodes and transmits DSD data and the decoding apparatus 70 receives the transmission data compressively encoded and transmitted, reversibly decodes the received data and outputs the decoded data. In the eleventh embodiment, it is possible to select compressive encoding of converting 4-bit DSD data into 2 bits or compressive encoding of converting the 4-bit DSD data into 1 bit. Data of the Q-stage conversion table table used for compressive encoding is previously stored.

<Example of Processing Results>

Figure 32:
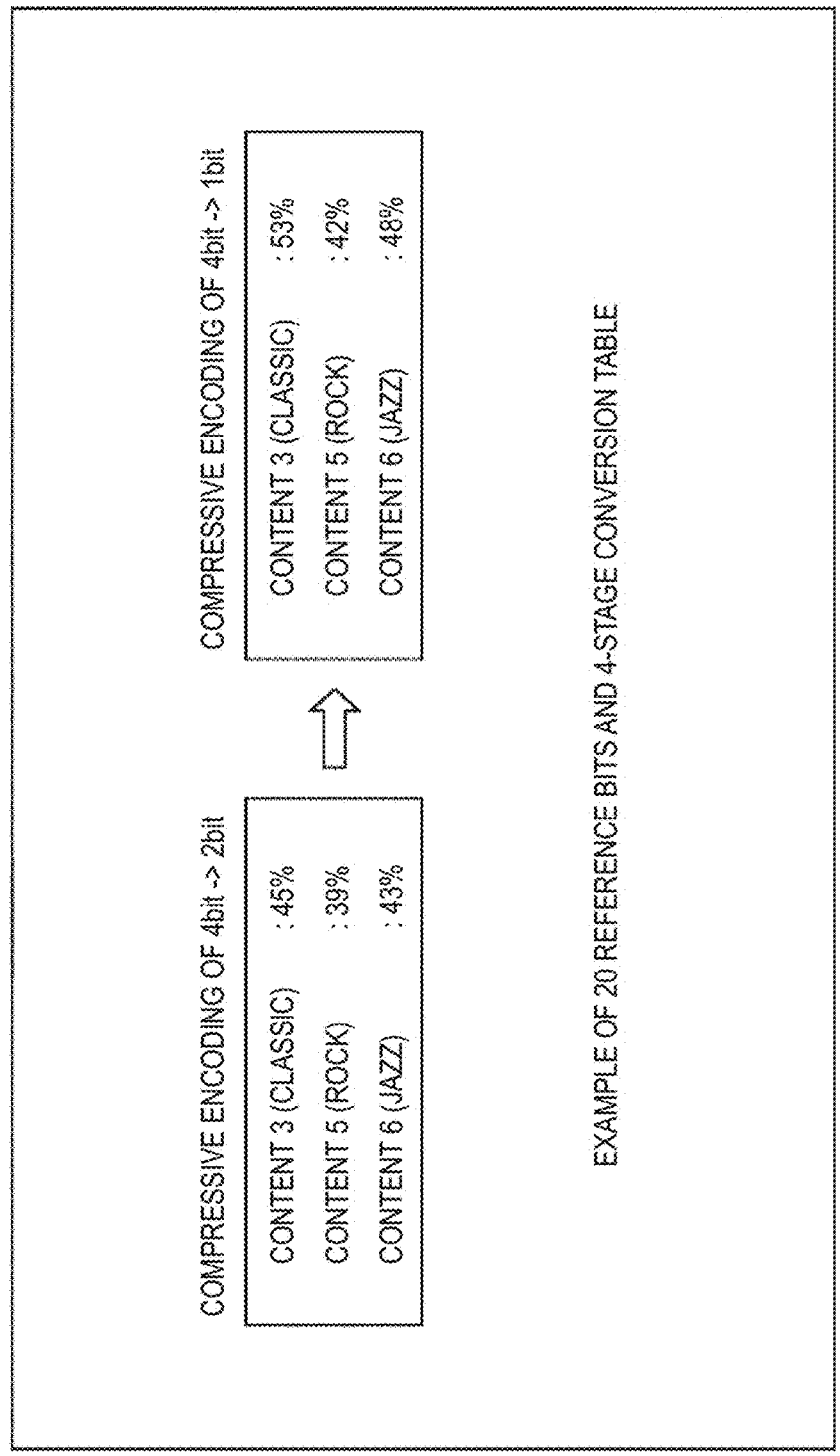
FIG. 32 is an explanatory diagram of an example of processing results.

FIG. 32 illustrates an example of processing results according to the 4-to-2 encoding unit 181 and the 4-to-1 encoding unit 182.

All the processing results of FIG. 32 are common when the number of reference bits of past data is 20 bits and the number of stages of conversion tables is 4.

Referring to the compressive encoding results illustrated in FIG. 32, it can be known that, for content which has compression rates approximate to a theoretical maximum value (50%) when 4 bits are compressively encoded into 2 bits, compression rates can be further increased by compressively encoding 4 bits into 1 bit through the 4-to-1 encoding unit 182.

In the above-described embodiments, the example of performing compressive encoding by converting 4 bits into 2-bit code using a data conversion table table based on data generation frequency for a digital signal (DSD data) ΔΣ-modulated by the ADC 12 has been described. Further, the example of performing compressive encoding by converting 4 bits into 1-bit code has also been described.

However, the compressive encoding apparatus 1 may compressively encode 8 bits by converting the 8 bits into a 4-bit code, for example, and the decoding apparatus 70 may decompress (reversibly decode) the code compressively encoded by the compressive encoding apparatus 1. When 8 bits are converted into 4-bit code, the register 51 of the encoding unit 15 in FIG. 4 is modified to store 8 bits and the register 54 is modified to store 4 bits, for example. In addition, the register 91 of the decoding unit 74 in FIG. 6 is modified to store 4 bits and the register 94 is modified to store 8 bits.

Accordingly, the compressive encoding apparatus 1 may include the encoding unit 15 which converts M bits of a ΔΣ-modulated digital signal into N bits (M>N) with reference to the first conversion table table1 and, when the M bits cannot be converted into the N bits using the first conversion table table1, converts the M bits into the N bits with reference to the second conversion table table2. Here, when the number of bit patterns of the N bits is P, the first conversion table table1 is a table storing (P−1) number of codes having higher generation frequencies for past bit patterns, and the second conversion table table2 is a table storing (P−1) number of codes having higher generation frequencies for past bit patterns, which follow those of the first conversion table table1.

Furthermore, the decoding apparatus 70 may include the decoding unit 74 which converts N bits of encoded data, which has been obtained by compressively encoding M bits of a ΔΣ-modulated digital signal into the N bit (M>N), into the M bits with reference to the first conversion table table1 and, when the N bits cannot be converted into the M bits using the first conversion table table1, decodes the N bits into the M bits with reference to the second conversion table table2. Here, when the number of bit patterns of the N bits is P, the first conversion table table1 is a table storing (P−1) number of codes having higher generation frequencies for past bit patterns, and the second conversion table table2 is a table storing (P−1) number of codes having higher generation frequencies for past bit patterns, which follow those of the first conversion table table1.

In the compressive encoding apparatus 1 and the decoding apparatus 70, the functions of embodiments described in the first to tenth embodiments are not limited to the described combinations and an arbitrary combination of part or all of the functions of the embodiments may be employed. In addition, the arbitrary combined functions may be appropriately selected and executed depending on various conditions such as user setting, traffic or capacity of a network (communication line), processing capability (CPU power and memory capacity) of an apparatus, and designation from an apparatus at a receiving side.

For example, compressive encoding using a multi-stage conversion table with 2 or more stages having a higher compression rate may be performed when network traffic is large or line capacity is small, whereas compressive encoding using only a one-stage conversion table may be selected when a network is light.

Further, compressive encoding using a previously stored conversion table table without transmitting conversion table data may be performed when network traffic is large or line capacity is small, whereas data of a conversion table table created from actual DSD data may be transmitted as it is or compressed and transmitted such that a decoding side uses the data when a network is light, for example.

Further, compressive encoding may be selected such that compressive encoding using only a one-stage conversion table is performed when processing capability of a decoding apparatus of a receiving side is low, whereas compressive encoding using a multi-stage conversion table table having 2 or more stages may used when the processing capability of the decoding apparatus of the receiving side is high, for example.

In addition, the compressive encoding apparatus 1 may transmit data of a conversion table table created from actual DSD data as it is or after compressing the same when performing compressive encoding using only a one-stage conversion table and uses a previously stored conversion table table when performing compressive encoding using a multi-stage conversion table table having 2 or more stages, for example.

<Example of Application to Computer>

The above-described series of processes may be executed by hardware or software. The compression and decompression methods of the present disclosure do not depend on device processing capability because throughput according to software processing of a central processing unit (CPU) is low. Accordingly, the compression and decompression methods have low device type dependence for mobile terminals, stationary devices and the like.

When the series of processes described above is executed by software, a program that constructs such software is installed into a computer. Here, the expression "computer" includes a computer in which dedicated hardware is incorporated and a general-purpose personal computer or the like that is capable of executing various functions when various programs are installed.

FIG. 33 is a block diagram showing an example configuration of the hardware of a computer that executes the series of processes described earlier according to a program.

In the computer, a CPU 201, a read only memory (ROM) 202 and a random access memory (RAM) 203 are mutually connected by a bus 204.

An input/output interface 205 is also connected to the bus 204. An input unit 206, an output unit 207, a storage unit 208, a communication unit 209, and a drive 210 are connected to the input/output interface 205.

The input unit 206 is configured from a keyboard, a mouse, a microphone or the like. The output unit 207 configured from a display, a speaker or the like. The storage unit 208 is configured from a hard disk, a non-volatile memory or the like. The communication unit 209 is configured from a network interface or the like. The drive 210 drives a removable recording medium 211 such as a magnetic disk, an optical disk, a magneto-optical disk, a semiconductor memory or the like.

In the computer configured as described above, the CPU 201 loads a program that is stored, for example, in the storage unit 208 onto the RAM 203 via the input/output interface 205 and the bus 204, and executes the program. Thus, the above-described series of processing is performed.

In the computer, by loading the removable recording medium 211 into the drive 210, the program can be installed into the storage unit 208 via the input/output interface 205. It is also possible to receive the program from a wired or wireless transfer medium such as a local area network, the Internet, digital satellite broadcasting, etc., using the communication unit 209 and install the program into the storage unit 208. As another alternative, the program can be installed in advance into the ROM 202 or the storage unit 208.

It should be noted that the program executed by a computer may be a program that is processed in time series according to the sequence described in this specification or a program that is processed in parallel or at necessary timing such as upon calling.

An embodiment of the disclosure is not limited to the embodiments described above, and various changes and modifications may be made without departing from the scope of the disclosure.

For example, it is possible to employ a combination of all or part of the above-described multiple embodiments.

For example, the present disclosure can adopt a configuration of cloud computing which processes by allocating and connecting one function by a plurality of apparatuses through a network.

Further, each step described by the above-mentioned flow charts can be executed by one apparatus or by allocating a plurality of apparatuses.

In addition, in the case where a plurality of processes are included in one step, the plurality of processes included in this one step can be executed by one apparatus or by sharing a plurality of apparatuses.

Note that the effects described in the present specification are not limiting but are merely examples, and there may be additional effects.

Additionally, the present technology may also be configured as below.

(1)

A compressive encoding apparatus including an encoding unit that converts M bits of a ΔΣ-modulated digital signal into N bits (M>N) with reference to a first conversion table, and when the M bits are not able to be converted into the N bits with the first conversion table, converts the M bits into the N bits with reference to a second conversion table, in which, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

(2)

The compressive encoding apparatus according to (2), further including a data transmission unit that transmits converted data converted by the encoding unit, in which the data transmission unit transmits data of the first conversion table and the second conversion table along with the converted data.

(3)

The compressive encoding apparatus according to (2), further including a conversion table compression unit that creates compressed conversion table data in which the data of the first conversion table and the second conversion table is compressed, in which the data transmission unit transmits the compressed conversion table data as the data of the first conversion table and the second conversion table.

(4)

The compressive encoding apparatus according to any of (1) to (3), in which the first conversion table and the second conversion table are tables created using the digital signal.

(5)

The compressive encoding apparatus according to any of (1) to (4), including a storage unit that stores a plurality of sets of the first conversion table and the second conversion table, in which the encoding unit converts the M bits into the N bits using a set of the first conversion table and the second conversion table selected from the plurality of sets.

(6)

The compressive encoding apparatus according to (5), in which a set having a highest compression rate is selected from the plurality of sets of the first conversion table and the second conversion table stored in the storage unit.

(7)

The compressive encoding apparatus according to any of (1) to (6), in which the number of bits of the past bit patterns are provided as a plurality of types, and the encoding unit converts the M bits into the N bits using a set of the first conversion table and the second conversion table having a predetermined number of bits selected from the plurality of types.

(8)

The compressive encoding apparatus according to any of (1) to (7), in which the encoding unit converts the M bits into the N bits with reference to a third conversion table when the M bits are not able to be converted into the N bits with the second conversion table, and the third conversion table is a table storing (P−1) number of codes having higher generation frequencies for past bit patterns, which follow those of the second conversion table.

(9)

The compressive encoding apparatus according to any of (1) to (8), in which the encoding unit includes a first encoding unit that converts the M bits of the digital signal into the N bits and a second encoding unit that converts the M bits of the digital signal into N2 bits different from the N bits.

(10)

The compressive encoding apparatus according to (9), further including a storage unit that stores a set of the first conversion table and the second conversion table for the first encoding unit and a set of the first conversion table and the second conversion table for the second encoding unit.

(11)

A compressive encoding method including converting M bits of a ΔΣ-modulated digital signal into N bits (M>N) with reference to a first conversion table, and when the M bits are not able to be converted into the N bits with the first conversion table, converting the M bits into the N bits with reference to a second conversion table, in which, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

(12)

A program that causes a computer to execute a process of converting M bits of a ΔΣ-modulated digital signal into N bits (M>N) with reference to a first conversion table, and when the M bits are not able to be converted into the N bits with the first conversion table, converting the M bits into the N bits with reference to a second conversion table, in which, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

(13)

A decoding apparatus including a decoding unit that converts N bits of encoded data that is obtained by compressively encoding M bits (M>N) of a ΔΣ-modulated digital signal into the N bits, into the M bits with reference to a first conversion table, and when the N bits are not able to be converted into the M bits with the first conversion table, decodes the N bits into the M bits with reference to a second conversion table, in which, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

(14)

The decoding apparatus according to (13), further including a data receiving unit that receives the encoded data, in which the data receiving unit receives data of the first conversion table and the second conversion table along with the encoded data.

(15)

The decoding apparatus according to (13), including a storage unit that stores a plurality of sets of the first conversion table and the second conversion table, in which the decoding unit converts the N bits into the M bits using a set of the first conversion table and the second conversion table selected from the plurality of sets.

(16)

The decoding apparatus according to (15), further including a data receiving unit that receives conversion table designation data designating the set of the first conversion table and the second conversion table that is selected from the plurality of sets, along with the encoded data.

(17)

The decoding apparatus according to any of (13) to (16), in which the decoding unit converts the N bits into the M bits with reference to a third conversion table when the M bits are not able to be converted with the second conversion table, and the third conversion table is a table storing (P−1) number of codes having higher generation frequencies for past bit patterns, which follow those of the second conversion table.

(18)

The decoding apparatus according to any of (13) to (16), in which the decoding unit includes a first decoding unit that converts the N bits of the encoded data into the M bits and a second decoding unit that converts N2 bits of the encoded data different from the N bits, into the M bits.

(19)

A decoding method including converting N bits of encoded data that is obtained by compressively encoding M bits (M>N) of a ΔΣ-modulated digital signal into the N bits, into the M bits with reference to a first conversion table, and when the N bits are not able to be converted into the M bits with the first conversion table, decoding the N bits into the M bits with reference to a second conversion table, in which, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

(20)

A program that causes a computer to execute a process of converting N bits of encoded data that is obtained by compressively encoding M bits (M>N) of a ΔΣ-modulated digital signal into the N bits, into the M bits with reference to a first conversion table, and when the N bits are not able to be converted into the M bits with the first conversion table, decoding the N bits into the M bits with reference to a second conversion table, in which, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table.

REFERENCE SIGNS LIST 1 compressive encoding apparatus
14 controller
15 encoding unit
18 data transmission unit
53 conversion table processing unit
70 decoding apparatus
72 data receiving unit
74 decoding unit
75 table storage unit
93 conversion table processing unit
111 conversion table decompression unit
141 12-bit reference encoding unit
142 16-bit reference encoding unit
143 20-bit reference encoding unit
161 12-bit reference decoding unit
162 16-bit reference decoding unit
163 20-bit reference decoding unit
181 4-to-2 encoding unit
182 4-to-1 encoding unit
191 4-to-2 decoding unit
192 4-to-1 decoding unit
201 CPU
202 ROM
203 RAM
206 input unit
207 output unit
208 storage unit
209 communication unit
210 drive

The invention claimed is:

1. A compressive encoding apparatus comprising:

an encoding unit that converts M bits of a ΔΣ-modulated digital signal into N bits (M>N) with reference to a first conversion table, and when the M bits are not able to be converted into the N bits with the first conversion table, converts the M bits into the N bits with reference to a second conversion table, wherein, when the number of bit patterns of the N bits is P, the first conversion table is a table storing (P−1) number of codes having higher generation frequencies for past bit patterns, and the second conversion table is a table storing (P−1) number of codes having higher generation frequencies for past bit patterns, which follow those of the first conversion table; and a data transmission unit that transmits converted data converted by the encoding unit, wherein the data transmission unit transmits data of the first conversion table and the second conversion table along with the converted data.

2. The compressive encoding apparatus according to claim 1, further comprising:

a conversion table compression unit that creates compressed conversion table data in which the data of the first conversion table and the second conversion table is compressed, wherein the data transmission unit transmits the compressed conversion table data as the data of the first conversion table and the second conversion table.

3. The compressive encoding apparatus according to claim 1, wherein the first conversion table and the second conversion table are tables created using the digital signal.

4. The compressive encoding apparatus according to claim 1, comprising:

a storage unit that stores a plurality of sets of the first conversion table and the second conversion table, wherein the encoding unit converts the M bits into the N bits using a set of the first conversion table and the second conversion table selected from the plurality of sets.

5. The compressive encoding apparatus according to claim 4, wherein a set having a highest compression rate is selected from the plurality of sets of the first conversion table and the second conversion table stored in the storage unit.

6. The compressive encoding apparatus according to claim 1,
wherein the number of bits of the past bit patterns are provided as a plurality of types, and
the encoding unit converts the M bits into the N bits using a set of the first conversion table and the second conversion table having a predetermined number of bits selected from the plurality of types.

7. The compressive encoding apparatus according to claim 1,
wherein the encoding unit converts the M bits into the N bits with reference to a third conversion table when the M bits are not able to be converted into the N bits with the second conversion table, and
the third conversion table is a table storing (P−1) number of codes having higher generation frequencies for past bit patterns, which follow those of the second conversion table.

8. The compressive encoding apparatus according to claim 1, wherein the encoding unit includes a first encoding unit that converts the M bits of the digital signal into the N bits and a second encoding unit that converts the M bits of the digital signal into N2 bits different from the N bits.

9. The compressive encoding apparatus according to claim 8, further comprising:
a storage unit that stores a set of the first conversion table and the second conversion table for the first encoding unit and a set of the first conversion table and the second conversion table for the second encoding unit.

10. A compressive encoding method comprising:
converting M bits of a ΔΣ-modulated digital signal into N bits (M>N) with reference to a first conversion table, and when the M bits are not able to be converted into the N bits with the first conversion table, converting the M bits into the N bits with reference to a second conversion table,
wherein, when the number of bit patterns of the N bits is P,
the first conversion table is a table storing (P−1) number of codes having higher generation frequencies for past bit patterns, and
the second conversion table is a table storing (P−1) number of codes having higher generation frequencies for past bit patterns, which follow those of the first conversion table; and
transmitting converted data and transmitting data of the first conversion table and the second conversion table along with the converted data.

11. A non-transitory computer-readable medium storing instructions that, when executed by a processing device, cause the processing device to perform a process of converting M bits of a ΔΣ-modulated digital signal into N bits (M>N) with reference to a first conversion table, and when the M bits are not able to be converted into the N bits with the first conversion table, converting the M bits into the N bits with reference to a second conversion table,
wherein, when the number of bit patterns of the N bits is P,
the first conversion table is a table storing (P−1) number of codes having higher generation frequencies for past bit patterns, and
the second conversion table is a table storing (P−1) number of codes having higher generation frequencies for past bit patterns, which follow those of the first conversion table.

12. A decoding apparatus comprising:
a decoding unit that converts N bits of encoded data that is obtained by compressively encoding M bits (M>N) of a ΔΣ-modulated digital signal into the N bits, into the M bits with reference to a first conversion table, and when the N bits are not able to be converted into the M bits with the first conversion table, decodes the N bits into the M bits with reference to a second conversion table,
wherein, when the number of bit patterns of the N bits is P,
the first conversion table is a table storing (P−1) number of codes having higher generation frequencies for past bit patterns, and
the second conversion table is a table storing (P−1) number of codes having higher generation frequencies for past bit patterns, which follow those of the first conversion table.

13. The decoding apparatus according to claim 12, further comprising:
a data receiving unit that receives the encoded data,
wherein the data receiving unit receives data of the first conversion table and the second conversion table along with the encoded data.

14. The decoding apparatus according to claim 12, comprising:
a storage unit that stores a plurality of sets of the first conversion table and the second conversion table,
wherein the decoding unit converts the N bits into the M bits using a set of the first conversion table and the second conversion table selected from the plurality of sets.

15. The decoding apparatus according to claim 14, further comprising:
a data receiving unit that receives conversion table designation data designating the set of the first conversion table and the second conversion table that is selected from the plurality of sets, along with the encoded data.

16. The decoding apparatus according to claim 12,
wherein the decoding unit converts the N bits into the M bits with reference to a third conversion table when the M bits are not able to be converted with the second conversion table, and
the third conversion table is a table storing (P−1) number of codes having higher generation frequencies for past bit patterns, which follow those of the second conversion table.

17. The decoding apparatus according to claim 12, wherein the decoding unit includes a first decoding unit that converts the N bits of the encoded data into the M bits and a second decoding unit that converts N2 bits of the encoded data different from the N bits, into the M bits.

18. A decoding method comprising:
converting N bits of encoded data that is obtained by compressively encoding M bits (M>N) of a ΔΣ-modulated digital signal into the N bits, into the M bits with reference to a first conversion table, and when the N bits are not able to be converted into the M bits with the first conversion table, decoding the N bits into the M bits with reference to a second conversion table, wherein, when the number of bit patterns of the N bits is P,
   the first conversion table is a table storing (P−1) number of codes having higher generation frequencies for past bit patterns, and
   the second conversion table is a table storing (P−1) number of codes having higher generation frequencies for past bit patterns, which follow those of the first conversion table.

19. A non-transitory computer-readable medium storing instructions that, when executed by a processing device, cause the processing device to perform a process of converting N bits of encoded data that is obtained by compressively encoding M bits (M>N) of a $\Delta\Sigma$-modulated digital signal into the N bits, into the M bits with reference to a first conversion table, and when the N bits are not able to be converted into the M bits with the first conversion table, decoding the N bits into the M bits with reference to a second conversion table,
  wherein, when the number of bit patterns of the N bits is P,
   the first conversion table is a table storing (P−1) number of codes having higher generation frequencies for past bit patterns, and
   the second conversion table is a table storing (P−1) number of codes having higher generation frequencies for past bit patterns, which follow those of the first conversion table.

\* \* \* \* \*